United States Patent
Hosono

(10) Patent No.: US 9,230,665 B2
(45) Date of Patent: Jan. 5, 2016

(54) NONVOLATILE SEMICONDUCTOR MEMORY DEVICE

(75) Inventor: Koji Hosono, Fujisawa (JP)

(73) Assignee: KABUSHIKI KAISHA TOSHIBA, Tokyo (JP)

(*) Notice: Subject to any disclaimer, the term of this patent is extended or adjusted under 35 U.S.C. 154(b) by 138 days.

(21) Appl. No.: 13/816,799

(22) PCT Filed: Sep. 22, 2011

(86) PCT No.: PCT/JP2011/072487
§ 371 (c)(1),
(2), (4) Date: Feb. 13, 2013

(87) PCT Pub. No.: WO2012/039511
PCT Pub. Date: Mar. 29, 2012

(65) Prior Publication Data
US 2013/0141971 A1    Jun. 6, 2013

(30) Foreign Application Priority Data

Sep. 24, 2010 (JP) ................................. 2010-214243
Feb. 1, 2011 (JP) ................................. 2011-020117

(51) Int. Cl.
*H01L 27/115* (2006.01)
*H01L 21/8234* (2006.01)
(Continued)

(52) U.S. Cl.
CPC ............ *G11C 16/12* (2013.01); *G11C 11/5628* (2013.01); *G11C 16/0483* (2013.01);
(Continued)

(58) Field of Classification Search
CPC .................................................. G11C 16/0483
USPC .......................... 365/185.02, 185.03, 189.011
See application file for complete search history.

(56) References Cited

U.S. PATENT DOCUMENTS 5,798,966 A    8/1998    Keeney
6,937,510 B2*  8/2005    Hosono et al. ........... 365/185.03
(Continued)

FOREIGN PATENT DOCUMENTS

CN          1494085 A     5/2004
CN        101095197 A    12/2007
(Continued)

OTHER PUBLICATIONS

International Search Report Issued Jan. 10, 2012 in PCT/ JP11/72487 Filed Sep. 22, 2011.
(Continued)

*Primary Examiner* — Hoai V Ho
*Assistant Examiner* — Roberto Mancera
(74) *Attorney, Agent, or Firm* — Oblon, McClelland, Maier & Neustadt, L.L.P.

(57) ABSTRACT

A control circuit provides an at least partially negative threshold voltage distribution to a memory cell, thereby erasing retained data of the memory cell, and provides multiple levels of positive threshold voltage distributions thereto, thereby programming multiple levels of data to the memory cell. The control circuit, when executing a program operation to the memory cell, executes a first program operation that provides the multiple levels of positive threshold voltage distributions to a first memory cell which is a memory cell subject to program, and executes a second program operation that provides a positive threshold voltage distribution, to a second memory cell adjacent to the first memory cell, irrespective of (regardless of) whether data to be programmed to the second memory cell is (already) present in the second memory cell or not.

13 Claims, 39 Drawing Sheets

(51) Int. Cl.
- *H01L 27/06* (2006.01)
- *G11C 16/12* (2006.01)
- *G11C 11/56* (2006.01)
- *G11C 16/04* (2006.01)
- *G11C 16/10* (2006.01)
- *G11C 16/34* (2006.01)

(52) U.S. Cl.
CPC ............ *G11C16/10* (2013.01); *G11C 16/3436* (2013.01); *H01L 27/11573* (2013.01); *H01L 27/11578* (2013.01); *H01L 27/11582* (2013.01); *H01L 21/823487* (2013.01); *H01L 27/0688* (2013.01)

(56) References Cited

U.S. PATENT DOCUMENTS

| | | | |
|---|---|---|---|
| 7,230,851 B2 | 6/2007 | Fong et al. | |
| 7,257,032 B2 | 8/2007 | Fujiu et al. | |
| 7,315,915 B2 | 1/2008 | Fukuda et al. | |
| 7,489,548 B2 * | 2/2009 | Moogat et al. | 365/185.17 |
| 7,518,923 B2 | 4/2009 | Mokhlesi | |
| 7,969,789 B2 | 6/2011 | Katsumata et al. | |
| 8,154,068 B2 | 4/2012 | Katsumata et al. | |
| 8,189,391 B2 | 5/2012 | Itagaki et al. | |
| 8,228,728 B1 * | 7/2012 | Yang et al. | 365/185.03 |
| 8,258,571 B2 | 9/2012 | Endoh et al. | |
| 8,559,224 B2 * | 10/2013 | Han et al. | 365/185.11 |
| 8,570,805 B2 * | 10/2013 | Lee et al. | 365/185.17 |
| 8,593,872 B2 * | 11/2013 | Shirakawa | 365/185.18 |
| 2006/0120162 A1 * | 6/2006 | Fujiu et al. | 365/185.24 |
| 2006/0140011 A1 * | 6/2006 | Fong et al. | 365/185.29 |
| 2008/0043528 A1 * | 2/2008 | Isobe et al. | 365/185.03 |
| 2009/0268524 A1 | 10/2009 | Maejima | |
| 2010/0172189 A1 * | 7/2010 | Itagaki et al. | 365/185.29 |
| 2012/0195125 A1 * | 8/2012 | Choe et al. | 365/185.15 |

FOREIGN PATENT DOCUMENTS

| | | |
|---|---|---|
| JP | 2001 517350 | 10/2001 |
| JP | 2006 228394 | 8/2006 |
| JP | 2008 525933 | 7/2008 |
| JP | 2009 27134 | 2/2009 |
| JP | 2010 27165 | 2/2010 |
| JP | 2010 40122 | 2/2010 |
| JP | 2010 515203 | 5/2010 |
| JP | 2010 161132 | 7/2010 |
| JP | 2010 161199 | 7/2010 |

OTHER PUBLICATIONS

Taiwanese Office Action dated Oct. 29, 2014, issued in Taiwanese Patent Application No. 100134485 (with English translation).
Office Action issued Feb. 4, 2015 in Chinese Patent Application No. 201180045706.4 (with English transition).
Office Action issued Sep. 2, 2015 in Chinese Patent Application No. 201180045706.4 (with English translation).

* cited by examiner

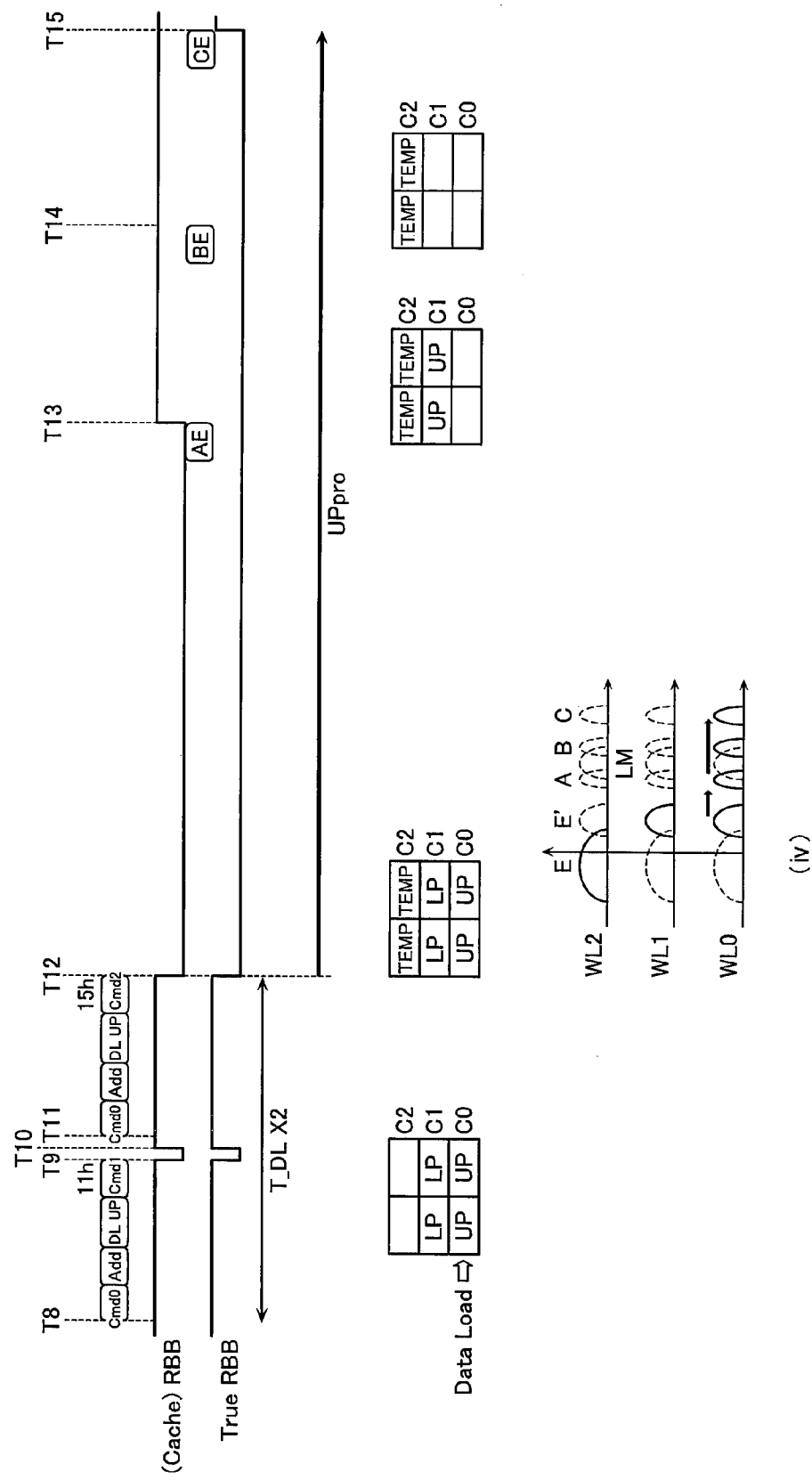

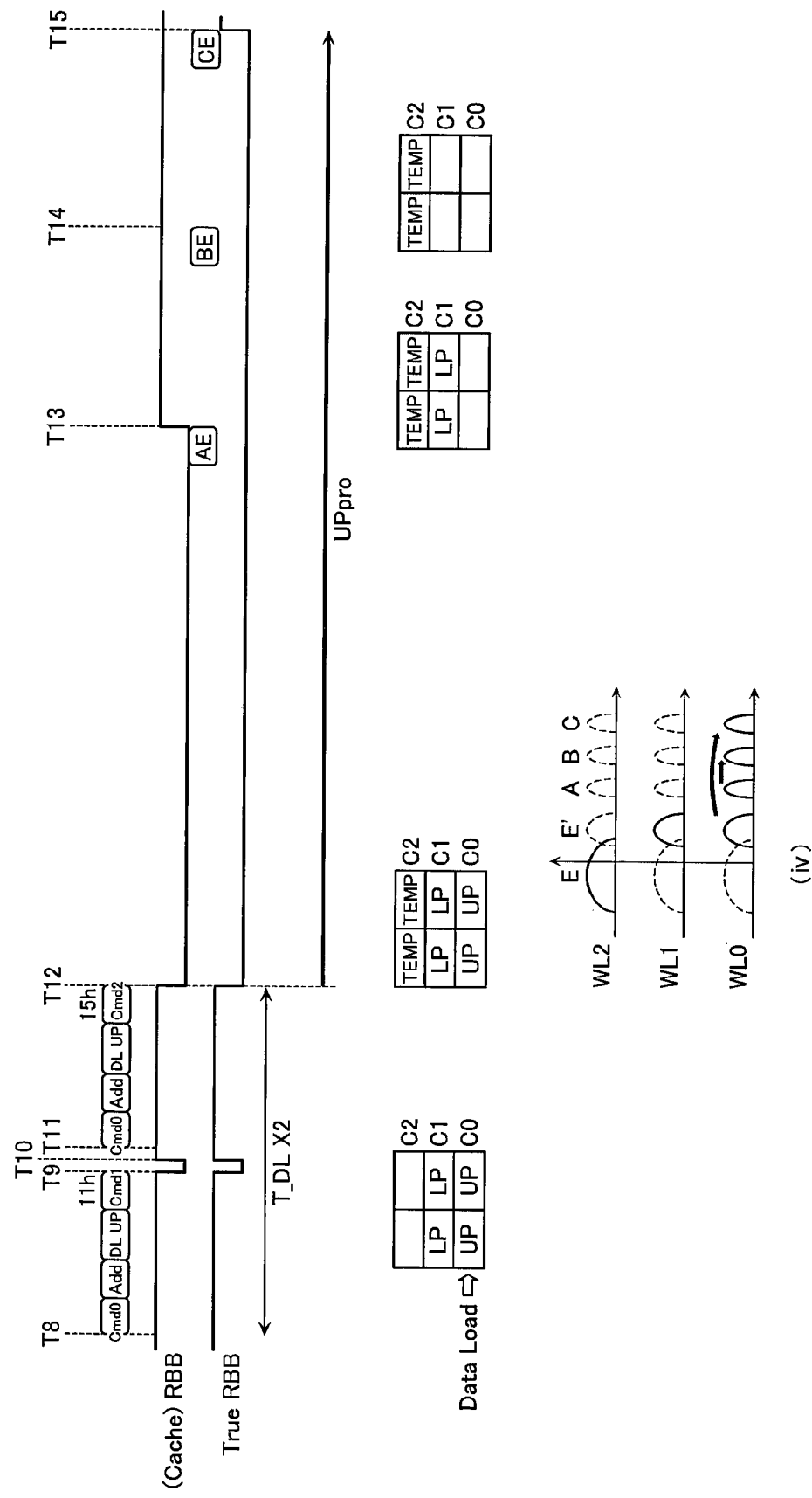

Program in Ordinary
Program Region

Program in High-Speed
Program Region (WL0, WL1)

Program in Ordinary
Program Region

Program in High-Speed
Program Region (WL0, WL1)

NONVOLATILE SEMICONDUCTOR MEMORY DEVICE

CROSS-REFERENCE TO RELATED APPLICATIONS

This application is based upon and claims the benefit of priority from the prior Japanese Patent Applications No. 2010-214243, filed on Sep. 24, 2010, and No. 2011-020117, filed on Feb. 1, 2011, the entire contents of which are incorporated herein by reference.

FIELD

The present embodiment relates to a nonvolatile semiconductor memory device.

BACKGROUND

In recent years, several nonvolatile semiconductor memory devices having memory cells disposed three-dimensionally (stacked type nonvolatile semiconductor memory devices) have been proposed.

CITATION LIST

Patent Literature

[PTL1] JP 2010-161132 A
[PTL2] JP 2008-525933 W

BRIEF DESCRIPTION OF THE DRAWINGS

FIG. 10B is a timing chart showing the procedure of the program operation in the first embodiment.

FIG. 11B is a timing chart showing the procedure of the program operation in the modified example of the first embodiment.

DETAILED DESCRIPTION

A nonvolatile semiconductor memory device in an embodiment described be low comprises: a memory cell array including a plurality of memory cells; and a control circuit for controlling a voltage applied to the plurality of memory cells.

Each of the memory cells herein comprises a charge storage film for storing a charge, and is configured capable of retaining multiple levels of threshold voltage distributions according to an amount of charge stored.

Moreover, the control circuit is configured to provide an at least partially negative threshold voltage distribution to the memory cells, thereby erasing retained data of the memory cells, and to provide multiple levels of positive threshold voltage distributions to the memory cells, thereby writing multiple levels of data to the memory cells.

Furthermore, this control circuit is configured to, when executing a program operation on the memory cells, execute a first program operation that provides the multiple levels of positive threshold voltage distributions to a first memory cell which is a memory cell subject to program, and execute a second program operation that provides a positive threshold voltage distribution, on a second memory cell adjacent to the first memory cell.

Embodiments of the nonvolatile semiconductor memory device according to the present invention are described below with reference to the drawings.

First Embodiment

[Configuration]

Figure 1:
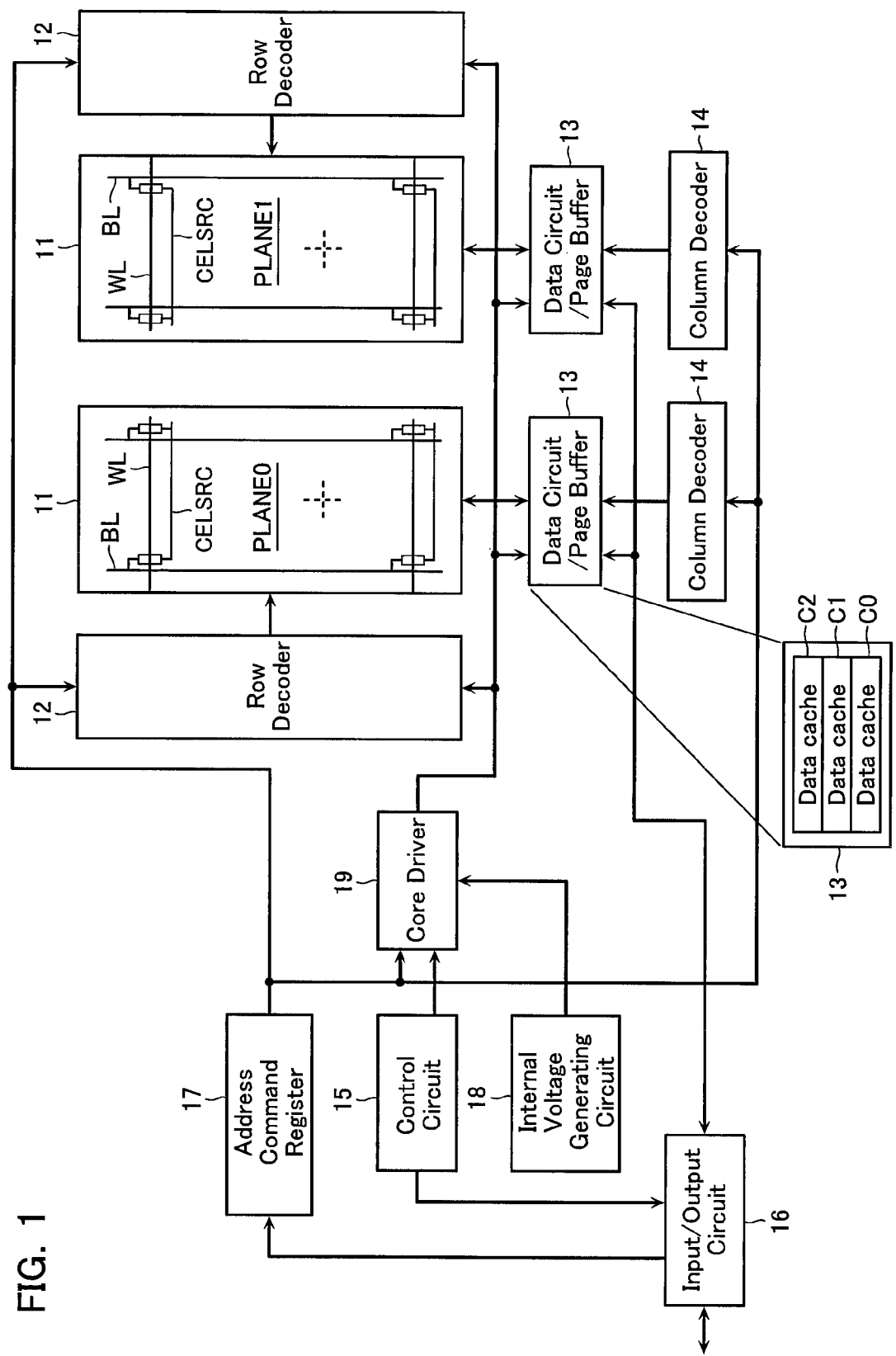
FIG. 1 explains an overall configuration of a nonvolatile semiconductor memory device according to a first embodiment.

First, an overall configuration of the nonvolatile semiconductor memory device according to the first embodiment is described with reference to FIG. 1. FIG. 1 is a block diagram of the nonvolatile semiconductor memory device according to the first embodiment of the present invention.

As shown in FIG. 1, the nonvolatile semiconductor memory device according to the first embodiment comprises a memory cell array 11, a row decoder 12, a data circuit/page buffer 13, a column decoder 14, a control circuit 15, an input/output circuit 16, an address/command register 17, an internal voltage generating circuit 18, and a core driver 19.

Figure 2:
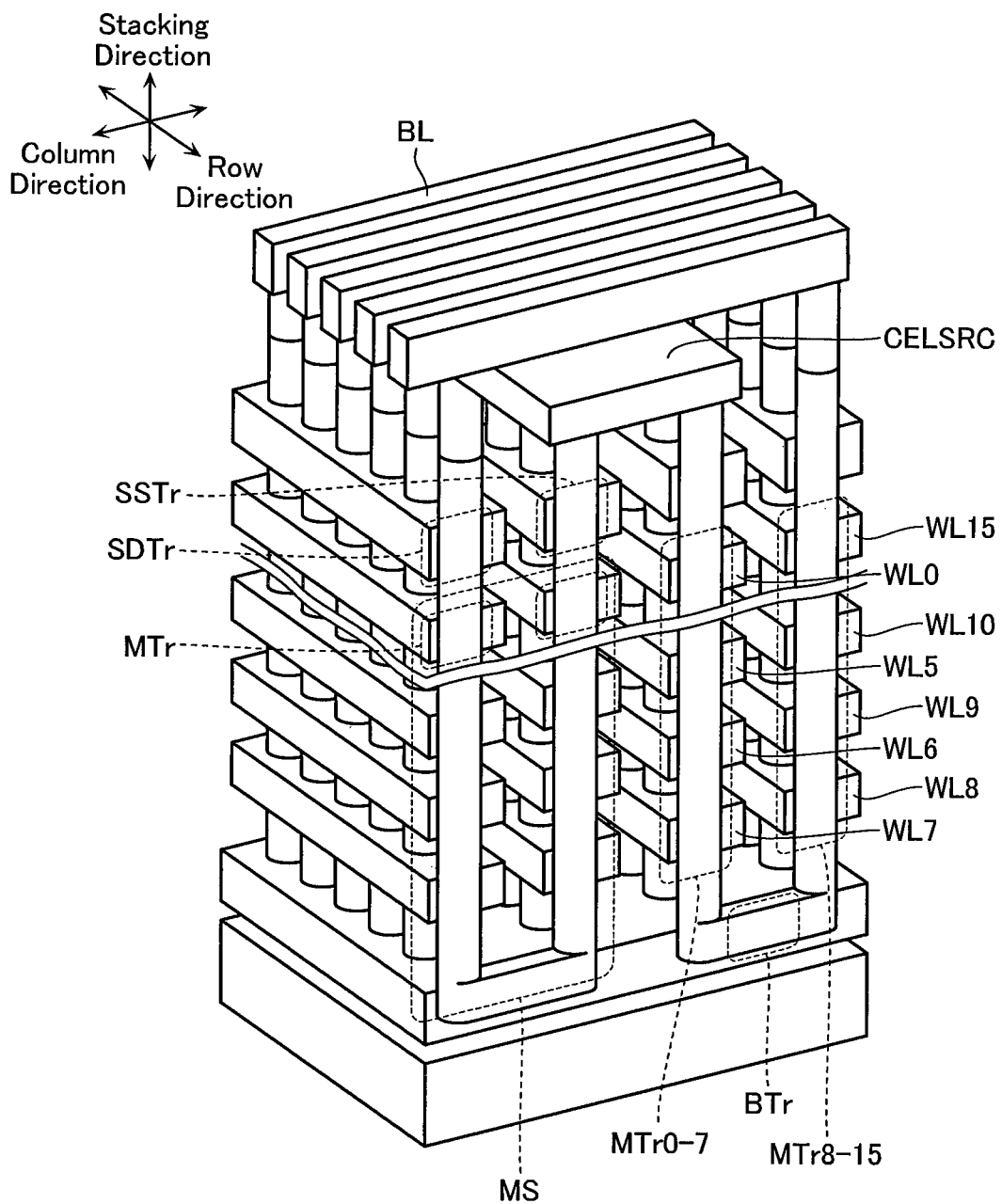
FIG. 2 is a schematic perspective view of a memory cell array 11 shown in FIG. 1.

As shown in FIG. 2, the memory cell array 11 includes a plurality of bit lines BL extending in a column direction, a plurality of source lines CELSRC extending in a row direction and intersecting the bit lines BL, and a memory string MS in which a plurality of electrically rewritable memory cells MTr are connected in series. In the present embodiment, description proceeds assuming there are two memory cell arrays 11 in a memory chip. However, the technology described in the present embodiment is not limited to the case of two memory cell arrays, and may also be applied to a device in which there is only one memory cell array 11 present in the memory chip, or to a device in which there are three or more memory cell arrays 11 present in one memory chip. Note that in the description of the embodiments below, an individual memory cell array 11 is sometimes termed a "PLANE", and two planes are sometimes referred to as "plane PLANE0" and "plane PLANE1".

As shown in FIG. 2, the memory cell array 11 is configured having memory cells MTr arranged in a three-dimensional matrix, each of the memory cells MTr storing data electrically. That is, the memory cells MTr, as well as being disposed in a matrix in a stacking direction, are also disposed in a matrix in a horizontal direction orthogonal to the stacking direction. A plurality of the memory cells MTr aligned in the stacking direction are connected in series to configure a memory string MS.

Connected to the two ends of the memory string MS are a drain side select transistor SDTr and a source side select transistor SSTr which are rendered in a conductive state when selected. This memory string MS is arranged having the stacking direction as a longer direction. One end of the drain side select transistor SDTr is connected to the bit line BL. One end of the source side select transistor SSTr is connected to the source line CELSRC.

As shown in FIG. 1, the row decoder 12 decodes a block address signal and so on inputted from the address/command register 17, and receives a word line control signal or select gate control signal outputted from the core driver 19, to control the memory cell array 11.

During a read operation, the data circuit/page buffer 13 reads data from the memory cell array 11 and temporarily retains the data in a page buffer. Moreover, during a program operation, the data circuit/page buffer 13 has program data from chip-external loaded into the page buffer, then programs the data to a selected memory cell.

In the present embodiment, the data circuit/page buffer 13 is compatible with a two-bits-per-cell storage scheme that retains two bits of data in one memory cell, and therefore comprises three cache memories C0-C2. The cache memories C0, C1 each retain one of lower page data LOWER or upper page data UPPER of the two bits of data. Moreover, the cache memory C2 is provided to, for example, in the program operation, retain temporary data TEMP for program control on a bit-by-bit basis based on a result of a verify read operation.

The column decoder 14 decodes a column address signal inputted from the address/command register 17 to perform input/output control of data. The control circuit 15 receives a signal for executing read, program, and erase operations and so on from the address/command register 17. In accordance with a certain sequence, the control circuit 15 controls the internal voltage generating circuit 18 that generates various kinds of voltages required in core operations, and, moreover, controls the core driver 19 that performs control of word lines and bit lines. The input/output circuit 16 performs input/output control of commands, addresses, and data.

Figure 3:
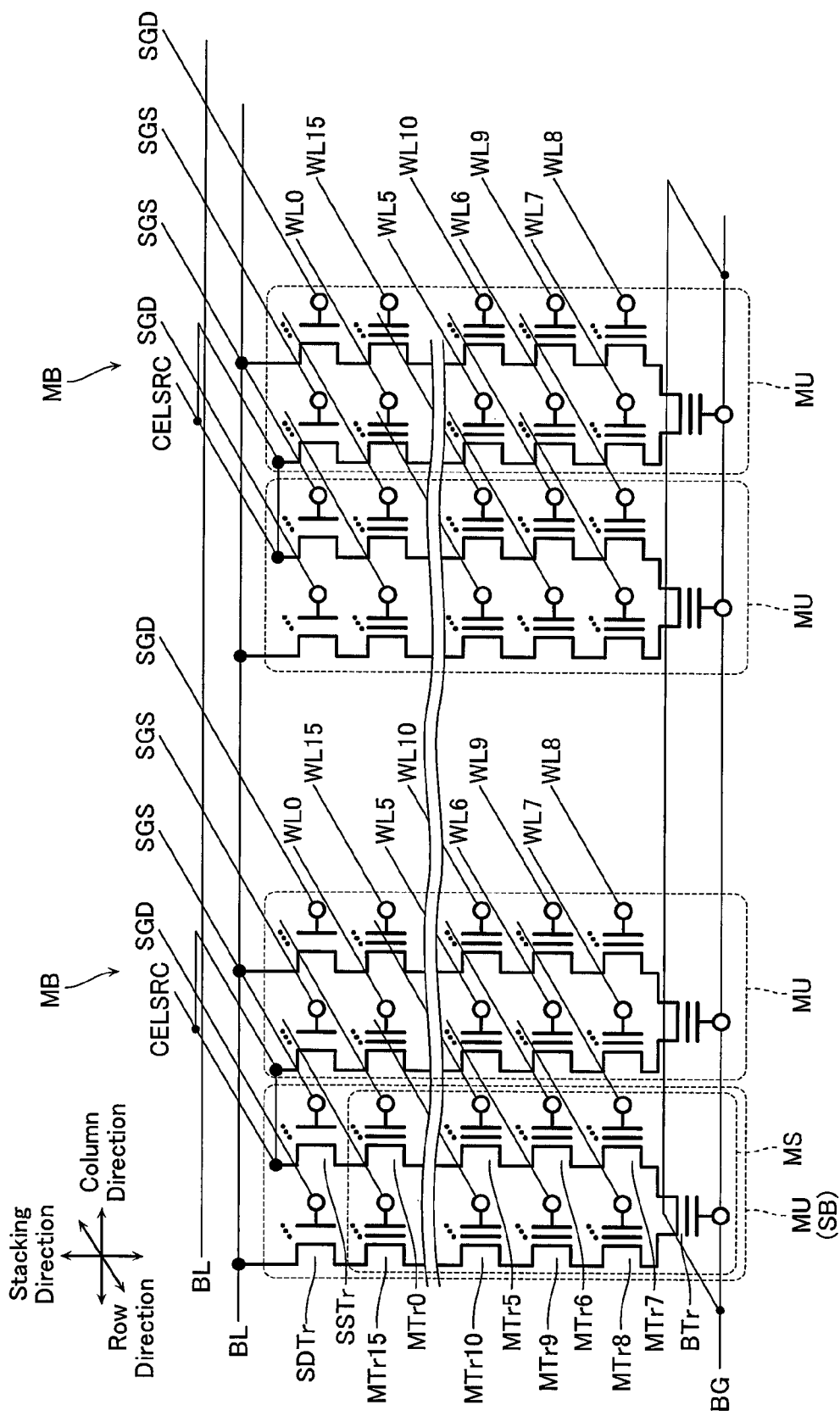
FIG. 3 is an equivalent circuit diagram of the memory cell array 11.

Next, a circuit configuration of the memory cell array 11 is described with reference to FIG. 3. FIG. 3 is an equivalent circuit diagram of the memory cells MTr, drain side select transistor SDTr, source side select transistor SSTr, and a peripheral circuit thereof, formed along a cross-section in the column direction of the memory cell array 11.

As shown in FIG. 3, the memory cell array 11 includes a plurality of bit lines BL and a plurality of memory blocks MB. The bit lines BL extend in stripes straddling the plurality of memory blocks MB in the column direction and having a certain pitch in the row direction. The memory blocks MB are provided repeatedly in the column direction with a certain pitch.

As shown in FIG. 3, the memory block MB includes a plurality of memory units MU arranged in a matrix in the row direction and the column direction orthogonal to the row direction. In the memory block MB, one bit line BL is provided with a plurality of memory units MU that are commonly connected.

Each of the memory units MU includes the memory string MS, the source side select transistor SSTr, and the drain side select transistor SDTr. The memory units MU are arranged in a matrix in the row direction and the column direction. A plurality of memory units MU arranged in a line in the row direction configure one sub-block SB.

The memory string MS is configured by memory cells MTr0-MTr15 and a back gate transistor BTr connected in series. The memory cells MTr0-MTr7 are connected in series in the stacking direction. The memory cells MTr8-MTr15 are also similarly connected in series in the stacking direction. The memory cells MTr0-MTr15 store information by storing charges in a charge storage layer.

The back gate transistor BTr is connected between the memory cell MTr7 and memory cell MTr8 in a lowest layer. The memory cells MTr0-MTr15 and the back gate transistor BTr are thus connected in a U shape in a cross-section along the column direction. A drain of the source side select transistor SSTr is connected to one end of the memory string MS (source of the memory cell MTr0). A source of the drain side select transistor SDTr is connected to the other end of the memory string MS (drain of the memory cell MTr15).

Gates of the memory cells MTr0 in memory units MU in one memory block MB are commonly connected to a word line WL0. Similarly, gates of the memory cells MTr1-MTr15 in one memory block MB are commonly connected to corresponding word lines WL1-WL15, respectively. In addition, gates of back gate transistors BTr arranged in a matrix in the row direction and the column direction are commonly connected to a back gate line BG.

Gates of each of the drain side select transistors SDTr in memory units MU arranged in a line in the row direction are commonly connected to a drain side select gate line SGD extending in the row direction. In addition, drains of the drain side select transistors SDTr arranged in a line in the column direction are commonly connected to the bit line BL.

Gates of each of the source side select transistors SSTr in memory units MU arranged in a line in the row direction are commonly connected to a source side select gate line SGS extending in the row direction. In addition, sources of the source side select transistors SSTr arranged in a line in the row direction in pairs of memory units MU adjacent in the column direction are commonly connected to the source line CELSRC extending in the row direction.

Figure 4:
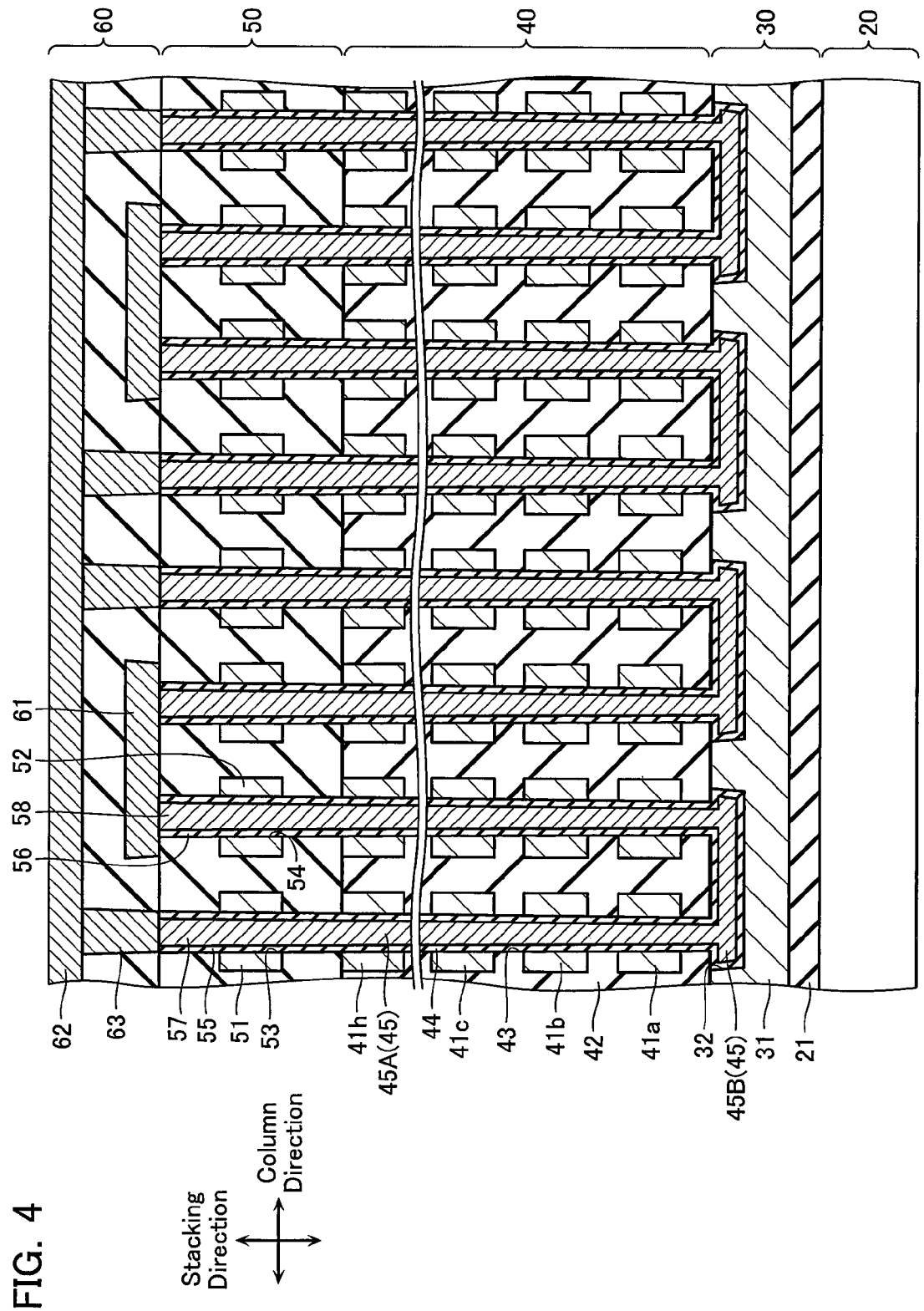
FIG. 4 explains a stacking structure of the memory cell array 11 realizing the circuit configuration shown in FIG. 3.
Figure 5:
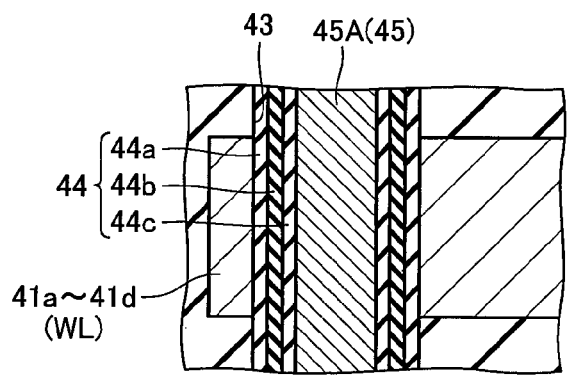
FIG. 5 is an enlarged view of part of FIG. 4.

Next, a stacking structure of the memory cell array 11 realizing the circuit configuration shown in FIG. 3 is described with reference to FIG. 4. FIG. 4 is a cross-sectional view of the memory cell array 11 according to the first embodiment, and FIG. 5 is an enlarged view of part of FIG. 4.

As shown in FIG. 4, the memory cell array 11 includes a substrate 20, and, sequentially from a lower layer, a back gate layer 30, a memory cell layer 40, a select transistor layer 50, and a wiring layer 60. The back gate layer 30 functions as the back gate transistor BTr. The memory cell layer 40 functions as the memory transistors MTr0-MTr15. The select transistor layer 50 functions as the drain side select transistor SDTr and the source side select transistor SSTr. The wiring layer 60 functions as the source line CELSRC and the bit line BL.

As shown in FIG. 4, the back gate layer 30 includes a back gate conductive layer 31 formed on the substrate 20 via an insulating layer 21. The back gate conductive layer 31 functions as the back gate line BG and as the gate of the back gate transistor BTr. The back gate conductive layer 31 is formed in a plate shape extending in the row direction and the column direction. The back gate conductive layer 31 is formed surrounding a joining portion 45B of a U-shaped semiconductor layer 45 mentioned later. The back gate conductive layer 31 is configured by polysilicon (poly-Si).

In addition, as shown in FIG. 4, the back gate layer 30 includes a back gate trench 32 formed so as to dig out the back gate conductive layer 31. The back gate trench 32 is configured by an opening having a shorter direction in the row direction and a longer direction in the column direction. The back gate trenches 32 are formed in a matrix at certain intervals in the row direction and the column direction.

As shown in FIG. 4, the memory cell layer 40 includes word line conductive layers 41$a$-41$h$ formed in the stacking direction via insulating layers 42. The word line conductive layers 41$a$-41$h$ function as the word lines WL0-WL15 and as control gates of the memory cells MTr0-MTr15. The word line conductive layers 41$a$-41$h$ are divided on a memory block MB basis, and formed in comb-tooth shaped pairs facing each other in the row direction. An independent contact is connected to each of the word line conductive layers formed in the comb-tooth shape.

Note that, in order for the word lines WL to be independently driven on a memory unit MU basis, the word line conductive layers 41$a$-41$h$ may also be connected to an independent contact on a single memory unit basis.

The word line conductive layers 41$a$-41$h$ include a portion formed in stripes extending in the row direction and having a certain pitch in the column direction. The word line conductive layers 41$a$-41$h$ are configured by polysilicon (poly-Si) or polycide.

In addition, as shown in FIG. 4, the memory cell layer 40 includes a memory hole 43 formed so as to penetrate the word line conductive layers 41$a$-41$h$ and the insulating layers 42. The memory hole 43 is formed so as to be aligned with a position of a vicinity of both ends in the column direction of each back gate trench 32. The memory holes 43 are formed in a matrix in the row direction and the column direction.

In addition, as shown in FIG. 4, the above-described back gate layer 30 and memory cell layer 40 include a memory gate insulating layer 44 and the U-shaped semiconductor layer 45. The U-shaped semiconductor layer 45 functions as a body of the memory cells MTr0-MTr15 and of the back gate transistor BTr.

As shown in FIG. 4, the memory gate insulating layer 44 is formed continuously on a side surface of the memory hole 43 and on an inner surface (side surface and lower surface) of the back gate trench 32. As shown in FIG. 5, the memory gate insulating layer 44 includes a block insulating layer 44$a$, a charge storage layer 44$b$, and a tunnel insulating layer 44$c$. The block insulating layer 44$a$ is formed along the side surface of the memory hole 43 and the inner surface of the back gate trench 32. The block insulating layer 44$a$ is formed so as to be in contact with the word line conductive layers 41$a$-41$h$ and the back gate conductive layer 31. The block insulating layer 44$a$ is configured by silicon oxide ($SiO_2$). The charge storage layer 44$b$ is formed on the block insulating layer 44$a$. The charge storage layer 44$b$ is employed for storing charges to retain data of the memory cells MTr0-MTr15. The charge storage layer 44$b$ is configured by silicon nitride (SiN). The tunnel insulating layer 44c is formed on the charge storage layer 44b. The tunnel insulating layer 44c is configured by silicon oxide ($SiO_2$).

As shown in FIG. 4, the U-shaped semiconductor layer 45 is formed in a U shape as viewed from the row direction. As shown in FIG. 5, the U-shaped semiconductor layer 45 is formed in contact with the tunnel insulating layer 44c so as to fill the back gate trench 32 and the memory hole 43. The U-shaped semiconductor layer 45 includes: a pair of columnar portions 45A extending in a perpendicular direction with respect to the substrate 20 as viewed from the row direction; and the joining portion 45B formed so as to join lower ends of the pair of columnar portions 45A. The U-shaped semiconductor layer 45 is configured by polysilicon (poly-Si).

Expressing the above-described configuration of the memory cell layer 40 in other words, the tunnel insulating layer 44c is formed surrounding a side surface of the columnar portion 45A. The charge storage layer 44b is formed surrounding a side surface of the tunnel insulating layer 44c. The block insulating layer 44a is formed surrounding the charge storage layer 44b. The word line conductive layers 41a-41h are formed surrounding a side surface of the block insulating layer 44a. Note that the charge storage layer 44b is formed not only on a side surface of the word line conductive layers 41a-41h, but also on a side surface of interlayer insulating films between the word line conductive layers 41a-41h, and is formed continuously in an up/down direction on a side surface of the columnar portion 45A. The same applies to the block insulating layer 44a and the tunnel insulating layer 44c.

As shown in FIG. 4, the select transistor layer 50 includes a drain side conductive layer 51 and a source side conductive layer 52 formed in the same layer as the drain side conductive layer 51. The drain side conductive layer 51 functions as the drain side select gate line SGD and as a gate electrode of the drain side select transistor SDTr. The source side conductive layer 52 functions as the source side select gate line SGS and as a gate electrode of the source side select transistor SSTr.

The drain side conductive layer 51 and the source side conductive layer 52 extend in stripes in the row direction and having a certain pitch in the column direction. The drain side conductive layer 51 and the source side conductive layer 52 are provided alternately two at a time in the column direction. The drain side conductive layer 51 and the source side conductive layer 52 are configured by polysilicon (poly-Si).

In addition, as shown in FIG. 4, the select transistor layer 50 includes a drain side hole 53 and a source side hole 54. The drain side hole 53 is formed so as to penetrate the drain side conductive layer 51. The source side hole 54 is formed so as to penetrate the source side conductive layer 52. The drain side hole 53 and the source side hole 54 are formed at a position aligning with the memory hole 43.

In addition, as shown in FIG. 4, the select transistor layer 50 includes a drain side gate insulating layer 55, a source side gate insulating layer 56, a drain side columnar semiconductor layer 57, and a source side columnar semiconductor layer 58. The drain side columnar semiconductor layer 57 functions as a body of the drain side select transistor SDTr. The source side columnar semiconductor layer 58 functions as a body of the source side select transistor SSTr.

The drain side gate insulating layer 55 is formed on a side surface of the drain side hole 53. The source side gate insulating layer 56 is formed on a side surface of the source side hole 54. The drain side gate insulating layer 55 and the source side gate insulating layer 56 are configured by silicon oxide ($SiO_2$).

The drain side columnar semiconductor layer 57 is formed in a column shape extending in the stacking direction in contact with the drain side gate insulating layer 55 and so as to fill the drain side hole 53. The source side columnar semiconductor layer 58 is formed in a column shape extending in the stacking direction in contact with the source side gate insulating layer 56 and so as to fill the source side hole 54. The drain side columnar semiconductor layer 57 and the source side columnar semiconductor layer 58 are configured by polysilicon (poly-Si).

Expressing the above-described configuration of the select transistor layer 50 in other words, the drain side gate insulating layer 55 is formed surrounding a side surface of the drain side columnar semiconductor layer 57. The drain side conductive layer 51 is formed surrounding a side surface of the drain side gate insulating layer 55. The source side gate insulating layer 56 is formed surrounding a side surface of the source side columnar semiconductor layer 58. The source side conductive layer 52 is formed surrounding a side surface of the source side gate insulating layer 56.

As shown in FIG. 4, the wiring layer 60 includes a first wiring layer 61, a second wiring layer 62, and a plug layer 63. The first wiring layer 61 functions as the source line CELSRC. The second wiring layer 62 functions as the bit line BL.

As shown in FIG. 4, the first wiring layer 61 is formed to be commonly in contact with upper surfaces of two adjacent source side columnar semiconductor layers 58. The first wiring layer 61 extends in stripes in the row direction and having a certain pitch in the column direction. The first wiring layer 61 is configured by a metal such as tungsten (W).

As shown in FIG. 4, the second wiring layer 62 is connected to an upper surface of the drain side columnar semiconductor layer 57 via the plug layer 63. The second wiring layer 62 extends in stripes in the column direction and having a certain pitch in the row direction. The second wiring layer 62 is configured by a metal such as copper (Cu) and the plug layer 63 is configured by a metal such as tungsten (W).

Next, a method of data program in this nonvolatile semiconductor memory device is described with reference to FIG. 6. For convenience of description, an example is employed where, prior to data program being performed, an erase operation is performed to a memory cell capable of retaining two bits of data (two-bits-per-cell system).

Note that the embodiments described below are applicable also in the case where multiple bits of three bits or more are retained in one memory cell. Moreover, the embodiments described below are applicable also in the case where one bit of data is retained in one memory cell.

Figure 6:
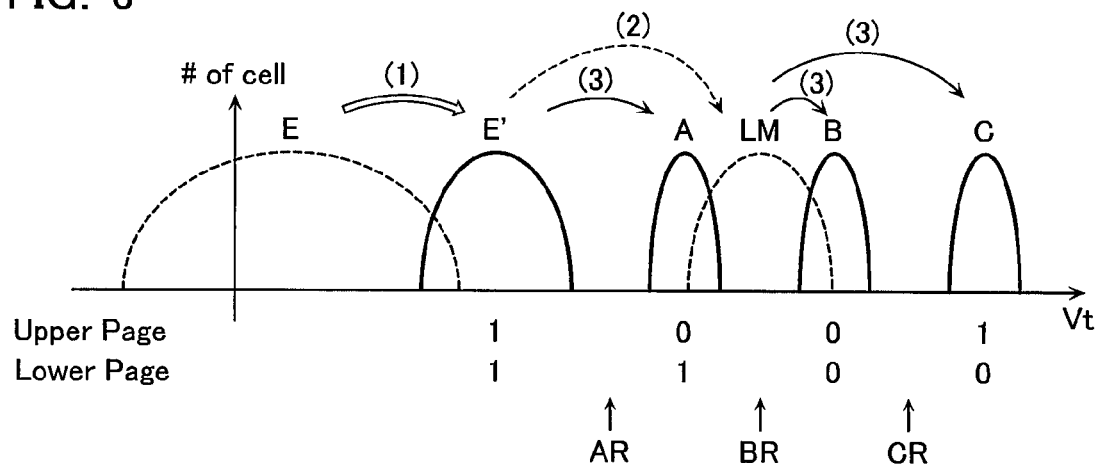
FIG. 6 is a schematic view explaining one example of a procedure of a program system for storing two bits of data in one memory cell MC (two bits per cell system).

When an erase operation is performed to the memory cell MC prior to data program being performed, the threshold voltage distribution of the memory cell becomes the threshold voltage distribution E shown in FIG. 6. The threshold voltage distribution E herein is set such that at least part of a lower limit side is a negative voltage value (a positive voltage is used as an erase verify voltage). Note that a configuration may also be adopted where a negative voltage is employed as the erase verify voltage such that an upper limit of the threshold voltage distribution attains a negative value.

A program operation of two bits of data to the memory cell MC having the threshold voltage distribution E is performed by providing to the memory cell MC any one of four threshold voltage distributions E', A, B, and C (E'<A<B<C) shown in FIG. 6, according to the two bits of data to be programmed to the memory cell. The threshold voltage distribution E' is the lowest distribution of the four threshold voltage distributions, The threshold voltage distributions have an increasingly high voltage level in the order of A, B, and C. The two bits of data are supplied divided into lower page data (LP) and upper page data (UP).

In the example of FIG. 6, when lower page data (LP) and upper page data (UP) are both "1", the threshold voltage distribution E' is provided to the memory cell MC. In addition, when lower page data (LP) and upper page data (UP) are "1" and "0", respectively, the threshold voltage distribution A is provided to the memory cell MC. When lower page data (LP) and upper page data (UP) are both "0", the threshold voltage distribution B is provided to the memory cell MC. When lower page data (LP) and upper page data (UP) are "0" and "1", respectively, the threshold voltage distribution C is provided to the memory cell MC. Note that this is purely one example, and it goes without saying that data allocation to the threshold voltage distributions is not limited to that shown in FIG. 6.

The program method shown in FIG. 6 executes program based on lower page data (LP) (lower page data program) and program based on upper page data (UP) (upper page data program). That is, lower page data program and upper page data program are executed separately.

In the program method of FIG. 6, prior to execution of lower page data program (2) and upper page data program (3) to one memory cell MC, a program operation (E' distribution program (second program operation)) is executed. The E' distribution program raises the threshold voltage distribution E of the memory cell MC to the threshold voltage distribution E'. The threshold voltage distribution E' is a distribution to which data "11" is allocated, which is the same as that allocated to the threshold voltage distribution E subsequent to erase.

This E' distribution program is executed to memory cells (for example, MCn+1) adjacent to memory cells (for example, MCn) on which an ordinary program operation (lower page data program, or upper page data program, or both) is performed.

Note that the E' distribution program may be performed at a separate time from the ordinary data program operation or may be executed as a series of steps.

In addition, data (E' flag data) indicating whether execution of E' distribution program along a certain word line WL has been completed or not (E' flag data) is preferably stored in the memory cell array. The control circuit 15 can store the E' flag data in a part of the memory cell array (for example, in one of the memory cells MC formed along one word line WL).

Subsequent to completion of this E' distribution program ((1) in FIG. 6), lower page data program (2) and upper page data program (3) are executed in order.

As shown in FIG. 6, lower page data program (2) is executed to the memory cell MC having the threshold voltage distribution E' subsequent to E' distribution program. If lower page data is "1", the threshold voltage distribution E' of the relevant memory cell is maintained as it is. If lower page data is "0", a program operation and program verify operation to provide an intermediate distribution LM are performed. In other words, the intermediate distribution LM is a threshold voltage distribution corresponding to lower page data "0".

Note that voltages applied to each memory cell in the program operation and program verify operation are the same as those conventionally applied, hence details thereof are omitted. This intermediate distribution LM is a threshold voltage distribution lying, for example, in a voltage range roughly between those of threshold voltage distributions A and B, and does not remain in the memory cell MC subsequent to upper page data program being carried out.

Upper page data program is performed based on upper page data and lower page data provided to the cash memory C0 or C1 of the page buffer 13 from external. In the case of the system in FIG. 6, if lower page data and upper page data are both "1", the relevant memory cell MC is maintained as it is at threshold voltage distribution E'. On the other hand, if lower page data and upper page data are "1" and "0", respectively, the relevant memory cell MC is subjected to a program operation to change the threshold voltage distribution E' to the threshold voltage distribution A.

Moreover, if lower page data and upper page data are both "0", the relevant memory cell MC has already been provided with the intermediate distribution LM by the lower page data program. Hence, the relevant memory cell MC undergoes a further program operation to be changed from the intermediate distribution LM to the threshold voltage distribution B. At the same time, if lower page data and upper page data are "0" and "1", respectively, the relevant memory cell MC has already been provided with the intermediate distribution LM by the lower page data program. Hence, the relevant memory cell MC undergoes a further program operation to be changed from the intermediate distribution LM to the threshold voltage distribution C.

Note that in a read operation of the memory cell MCn subsequent to this kind of program operation being performed, read voltages AR, BR, and CR are applied to the control gate of the selected memory cell MC in one memory string, similarly to conventional technologies. The read voltage AR is between an upper limit of the threshold voltage distribution E' and a lower limit of the threshold voltage distribution A. The read voltage BR is between an upper limit of the threshold voltage distribution A and a lower limit of the threshold voltage distribution B. The read voltage CR is between an upper limit of the threshold voltage distribution B and a lower limit of the threshold voltage distribution C. On the other hand, a read pulse voltage larger than an upper limit of the threshold voltage distribution CR is applied to the control gate of an unselected memory cell MC.

In a state where program of lower page data and program of upper page data are both completed and the threshold voltage distributions E' to C have been obtained, read of lower page data can be performed by a single time read operation using the voltage BR. On the other hand, in a state where only lower page data program is completed, program of upper page data has not yet been completed, and the memory cell MC has either of threshold voltage distributions LM or E', two times of read operations using two voltages, namely voltage AR and voltage BR, become necessary to perform lower page data read.

Note that to indicate whether execution of this kind of program operation of lower page data (program operation of the intermediate distribution LM) has been completed or not, LM flag data may be stored in a part of the memory cell array, for example. This LM flag data may be appropriately referred to in the program operation and read operation of data.

In the data program method shown in FIG. 6, the program operation of the intermediate distribution LM is executed in lower page data program. The intermediate distribution LM ultimately does not remain as a distribution indicating data, hence distribution width of the intermediate distribution LM can be broadened compared to those of the threshold voltage distributions E' to C. As a result, the time required for program of lower page data can be reduced compared to the case of directly writing the threshold voltage distributions E' to C, and the time required overall for the program operation can be shortened.

[Another Data Program Method]

Figure 7:
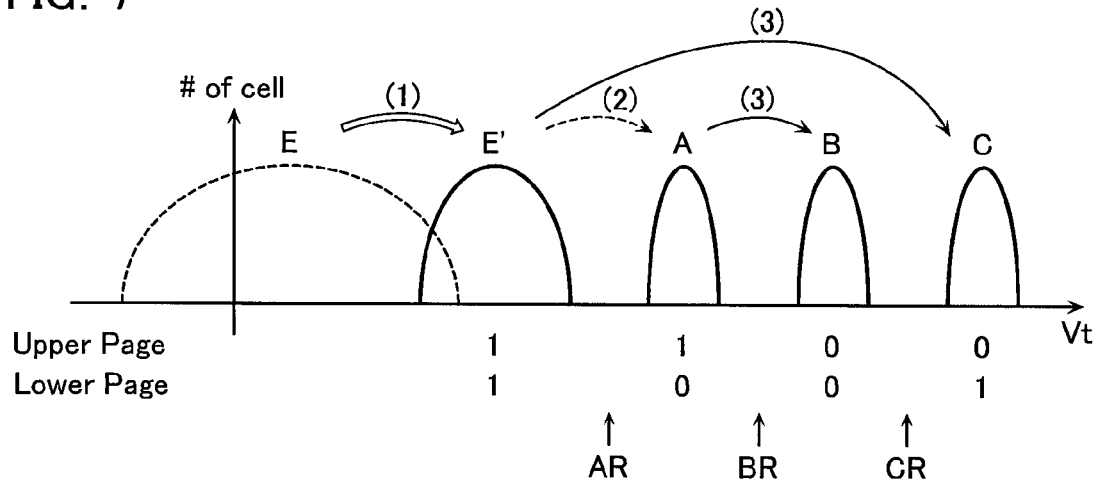
FIG. 7 is a schematic view explaining a separate example of a procedure of a two bits per cell program system.

Next, another data program method in this nonvolatile semiconductor memory device is described with reference to FIG. 7. FIG. 7 is also described using an example where, prior to data program being performed, an erase operation is performed to a memory cell capable of retaining two bits of data (two-bits-per-cell system), similarly to FIG. 6. When the erase operation is performed, the threshold voltage distribution of the memory cell becomes the threshold voltage distribution E having at least a portion that is negative as shown in FIG. 7.

However, in this program method, a program operation is executed to provide the final threshold voltage distributions E' to C directly, without performing a program operation to provide the intermediate distribution LM as in FIG. 6.

Likewise in the program operation in FIG. 7, one memory cell MCn is subject to execution of E' distribution program (1), prior to execution of lower page program (2) and upper page program (3). In the subsequently executed lower page program (2), the memory cell MC having the threshold voltage distribution E' is provided with the threshold voltage distribution A depending on lower page data (LP). Specifically, if lower page data is "1", the threshold voltage distribution E' of the relevant memory cell MC is maintained as it is. If lower page data is "0", a program operation and program verify operation are performed to provide the threshold voltage distribution A.

Upper page program (3) is performed based on upper page data and lower page data provided to the cash memory C0 or C1 of the page buffer 13 from external. In the case of the system in FIG. 7, if lower page data and upper page data are both "1", the relevant memory cell MC is maintained as is at threshold voltage distribution E'. On the other hand, if lower page data and upper page data are "1" and "0", respectively, the relevant memory cell MC is subjected to a program operation to change the threshold voltage distribution E' to the threshold voltage distribution C.

Moreover, if lower page data and upper page data are both "0", the relevant memory cell MC has already been provided with the threshold voltage distribution A by the lower page data program. Hence, the relevant memory cell MC undergoes a further program operation to be changed from the threshold voltage distribution A to the threshold voltage distribution B. On the other hand, if lower page data and upper page data are "0" and "1", respectively, the relevant memory cell MC has already been provided with the threshold voltage distribution A by the lower page data program. Hence, the relevant memory cell MC is maintained as is at threshold voltage distribution A.

As described above, in all cases in the present embodiment, whether the program system of FIG. 6, the program system of FIG. 7, or some other program system is adopted, an E' distribution program operation is executed prior to an ordinary data program operation. The E' distribution program operation changes from the threshold voltage distribution E subsequent to the erase operation to the threshold voltage distribution E'. This E' distribution program operation is executed to at least a memory cell MCn+1 adjacent to the memory cell MCn subject to an ordinary program operation (an operation to provide a threshold voltage distribution other than that of erase state, such as threshold voltage distributions E' to C or the intermediate distribution LM). The reason for this is explained with reference to FIG. 8.

Figure 8:
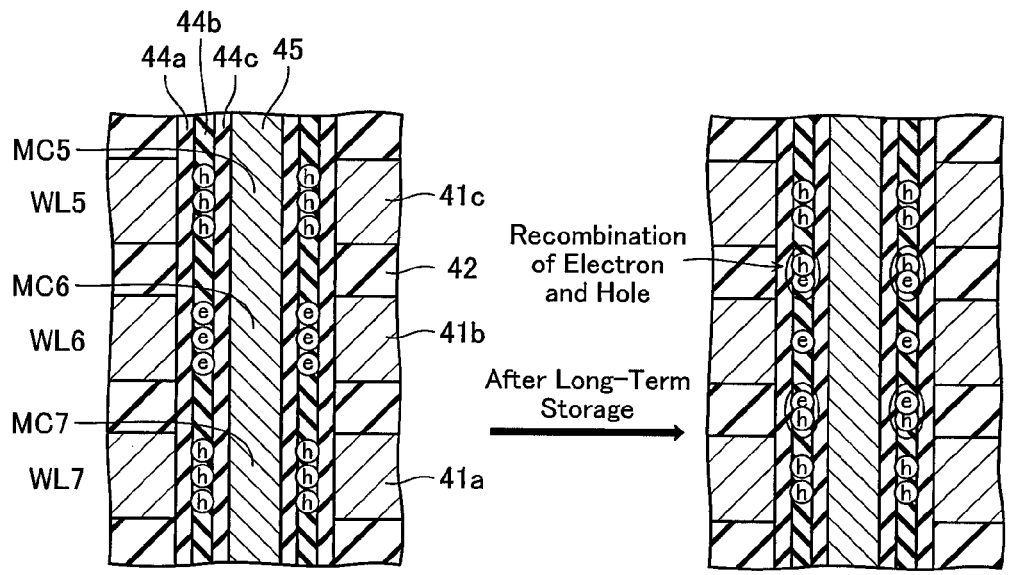
FIG. 8 explains problems of leaving a threshold voltage distribution E stored as is in memory cells MCn+1, MCn−1 adjacent to a memory cell MCn subject to program.

As shown in FIG. 8, it is here assumed that, for example, the memory cell MC6 formed along the word line WL6 is subjected to execution of a program operation to provide the memory cell MC6 with any of threshold voltage distributions E', A, B, or C. On the other hand, adjacent memory cells MC5 and MC7 are maintained at the threshold voltage distribution E without being subjected to execution of a program operation.

At this time, electrons (e) are trapped in the charge storage film 44*b* of the memory cell MC6. On the other hand, holes (h) are trapped in the charge storage film 44*b* of the memory cells MC5 and MC7. Now, in FIG. 8, a nonvolatile semiconductor memory device has a structure where the charge storage film 44*b* in one memory string MS is continuous without even being divided by a portion between memory cells (at the side of the interlayer insulating film 42). In this case, there is a risk that when a long period of time passes after the data program operation, the holes and electrons migrate resulting in a recombination of the holes and electrons, this causing a change in data retained in the memory cells MC (data corruption). Therefore, regarding at least the memory cell MCn+1 adjacent to the memory cell MCn for which program of some kind of data has been completed, it is not desirable for such a memory cell MCn+1 to be left retaining the threshold voltage distribution E.

Figure 9:
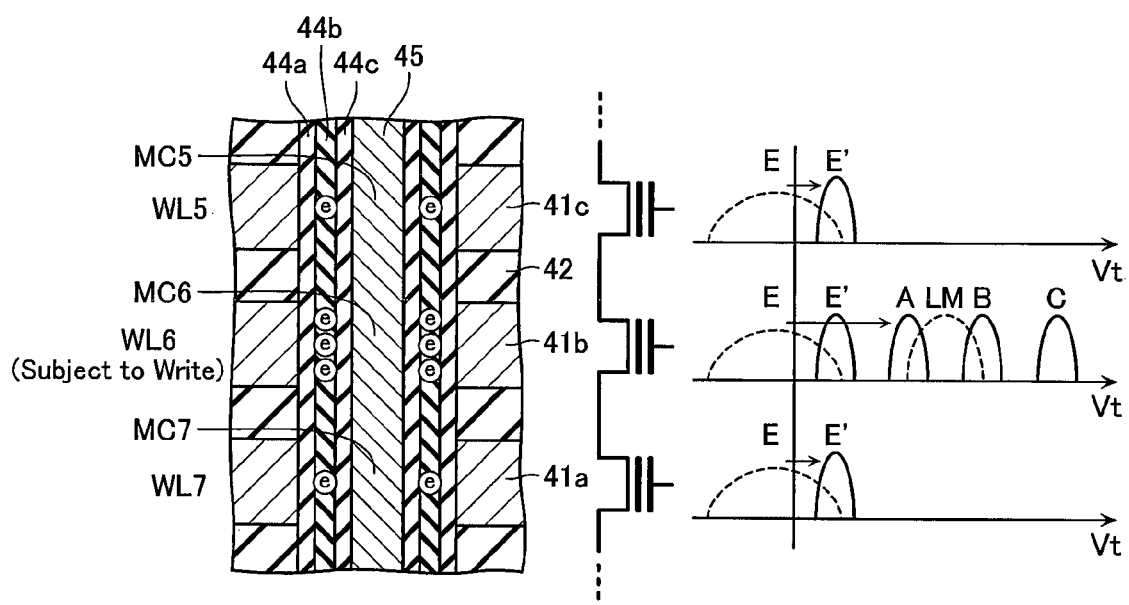
FIG. 9 is a schematic view explaining operation of the present embodiment.

Hence, in the present embodiment, as shown in FIG. 9, when a program operation is executed to provide the threshold voltage distributions E', A, B, C or the intermediate distribution LM in the memory cell MC6 subject to program, the threshold voltage distribution of the memory cells MC5 and MC7 adjacent to the memory cell MC6 must be set to a positive distribution. That is, an E' distribution program operation to change the threshold voltage distribution E to E' is executed to the memory cells MC5 and MC7. Performing this operation causes a small amount of electrons (e) to be retained in the charge storage film 44*b* of the memory cells MC5 and MC7 in place of the holes (h). As a result, electrons (e) are trapped in the charge storage film 44*b* of the memory cells MC5 through MC7. Therefore, the risk that a change in data occurs due to recombination of holes and electrons can be suppressed.

Next, the program operation in the nonvolatile semiconductor memory device in the present embodiment is described with reference to FIGS. 10A and 10B. This program operation employs the principle of FIG. 9. An example is described of the case where a program operation that includes an operation to program the intermediate distribution LM is executed on the word line WL0. However, the description assumes that program of the threshold voltage distribution E' to the word line WL0 has already been completed (Already programmed) by the E' distribution program ((i) in FIG. 10A).

Figure 10A:
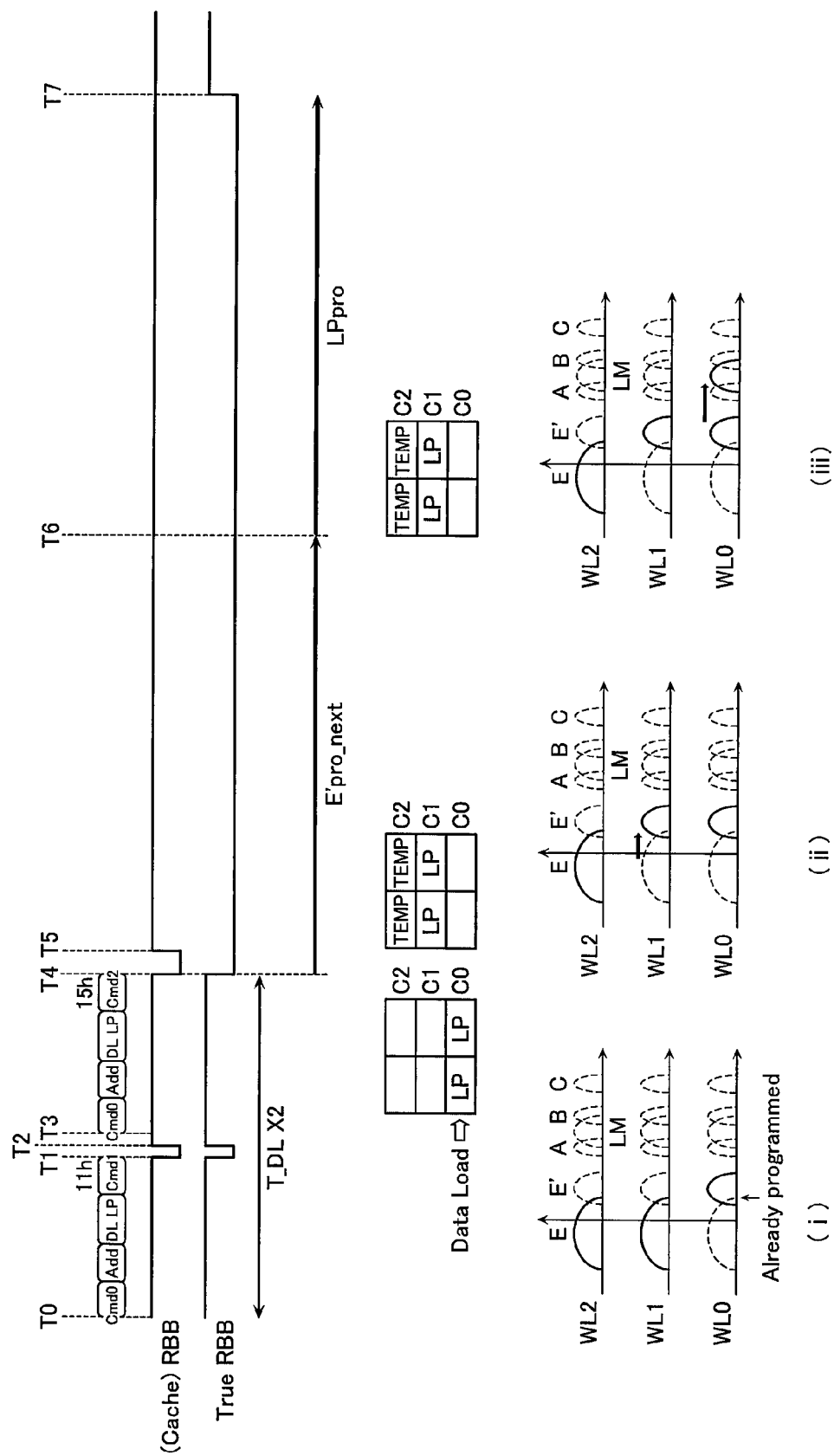
FIG. 10A is a timing chart showing a procedure of a program operation in the first embodiment.

Note that in this embodiment, a true ready/busy signal (hereinafter referred to as "true RBB") and a cache ready/busy signal (hereinafter referred to as "cache RBB") as shown in FIGS. 10A and 10B are sent out from the control circuit 15. Loading of program data is performed on the basis of these signals. The true RBB indicates whether various kinds of operations (read operation, program operation, erase operation, and so on) are in execution in the memory cell array 11 or not. The cache RBB indicates whether the cache memories C0-C2 are in a state where they are capable of having new data loaded to them from external or not. Note that FIGS. 10A and 10B show an example where program data is loaded continuously to two planes PLANE0 and PLANE1 and data program executed simultaneously on these two planes.

When program operation is performed on the word line WL0, first, at times T0-T1, address data (Add) indicating an address of the word line WL0 in the plane PLANE0 and lower page data (LP) to be programmed are inputted to the input/output circuit 16 from external, along with a command Cmd0.

The inputted lower page data (LP) undergoes control of the control circuit 15 to be appropriately data-loaded (DL) from the input/output circuit 16 to the cache memory C0. Note that a command Cmd1 "11h" is a pseudo-program execution command inputted when an operation for simultaneously programming multiple pages of data is assumed. This command cmd1 "11h" enables data load of subsequent pages. To enable data load of the subsequent page, the cache RBB must be "H". Accordingly, the true RBB and cache RBB become "L" at time T1, and keep "L" for a certain period. Thereafter, the true RBB and cache RBB become "H" again at time T2. If a four plane simultaneous program operation is performed in a semiconductor memory device having a four plane configuration, the command Cmd1 "11h" is issued three times resulting in four-pages data load being performed.

At times T3-T4, address data (Add) of the word line WL0 in the plane PLANE1 and lower page data (LP) to be programmed are inputted to the input/output circuit 16, along with a command Cmd0. The inputted program data is sequentially data-loaded (DL) to the cache memory C0. Note that in FIG. 10A, a command "15h" indicates that a series of loading of program data have once been completed and the program operation for those data is started if the internal state is ready.

At time T4 subsequent to the command 15h being inputted, the true RBB and cache RBB become "L" for a certain period. Then, at time T5, the cache RBB only returns again to "H". That is, the true RBB stays at "L". Accordingly, at times T4-T7, lower page data (LP) loaded to the cache memory C0 is transferred to the cache memory C1. From time T4, the E' distribution program operation on the adjacent word line WL1 is started (arrow in (ii) of FIG. 10A). If the E' distribution program operation to the word line WL1 finishes at for example time T6, then at time T6 or thereafter, lower page data program (LPpro) to the word line WL0 is started (arrow in (iii) of FIG. 10A). That is, subsequent to the E' distribution program operation to the word line WL1 being completed, lower page data program to the word line WL0 in plane PLANE0 and plane PLANE1 is started based on lower page data (LP).

The lower page program to the word line WL0 causes the memory cell MC0 to be provided with the intermediate distribution LM or the threshold voltage distribution E'. Data required at this stage of the program operation is temporarily stored in the cache memory C2 as temporary retained data TEMP. Note that prior to starting the E' distribution program operation to the word line WL1, an operation may be executed to read out the E' flag data stored concerning the word line WL1 and determine whether the E' distribution program operation is necessary or not.

At times T8-T12, following completion of the lower page program to the word line WL0 at time T7, upper page data (UP) to be programmed to the word line WL0 in plane PLANE0 and plane PLANE1 is inputted to the input/output circuit 16, and subsequently data-loaded to the cache memory C0. At times T8-T9, upper page data (UP) to be programmed to the plane PLANE0 is inputted to the input/output circuit 16, and then, at times T11-T12, upper page data (UP) to be programmed to the plane PLANE1 is inputted to the input/output circuit 16, to be appropriately transferred to the cache memory C0.

When data load of upper page data (UP) to the cache memory C0 is completed and the true RBB and cache RBB become "L" at time T12, upper page program to the word line WL0 is started. Note that at time T13, when program to the threshold voltage distribution A is completed, lower page data (LP) becomes unnecessary. Hence, lower page data (LP) stored in the cache memory C1 is abandoned, and in place of this abandoned lower page data (LP), upper page data (UP) that was stored in the cache memory C0 is transferred to the cache memory C1. Subsequently, when program operations to the threshold voltage distributions B and C are completed at, respectively, times T14 and T15, the upper page data that was stored in the cache memory C1 is also abandoned. Through the above operations, the program operation to the word line WL0 including the E' distribution program operation to the adjacent word line WL1 is completed.

Described above with reference to FIGS. 10A and 10B is the example in which, prior to a program operation on the word line WL0, an E' distribution program operation is executed on the adjacent word line WL1. Similarly, prior to a program to another word line WLn (n≥1), the E' distribution program operation can be executed on the memory cell MCn+1 formed along the adjacent word line WLn+1. In the case where program is executed in a word line WL order of WL0, 1, 2, . . . , the word line WLn−1 adjacent to the word line WLn has already undergone execution of the E' distribution program operation or the program operation. Therefore, if the E' distribution program operation is executed on the word line WLn+1 prior to starting the program operation on the word line WLn, data change in the memory cell MCn formed along the word line WLn can be suppressed.

Figure 11A:
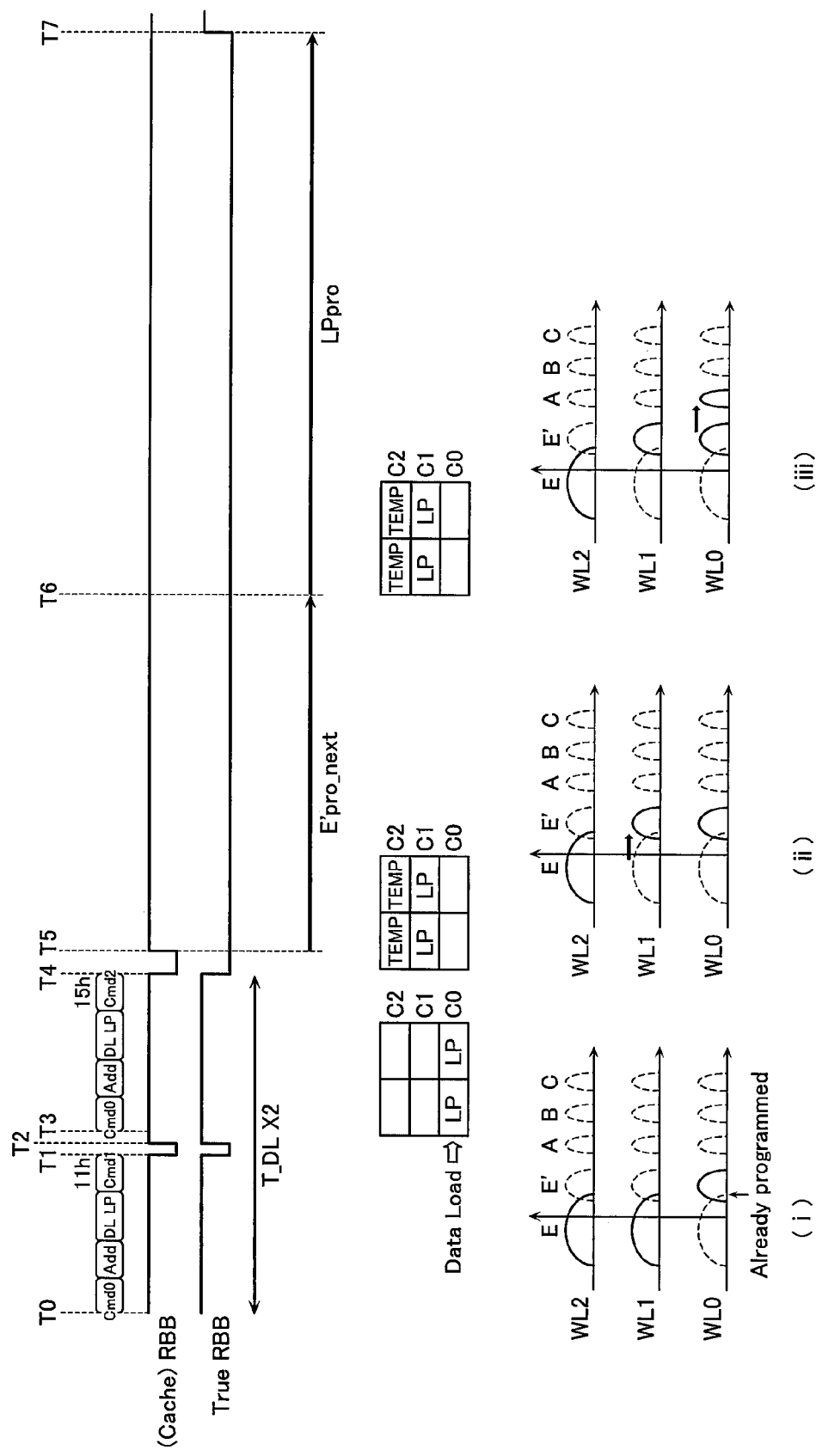
FIG. 11A is a timing chart showing a procedure of a program operation in a modified example of the first embodiment.

FIGS. 11A and 11B show an example of the case where the program method shown in FIG. 7 is executed. In other respects, FIGS. 11A and 11B are similar to FIGS. 10A and 10B.

Second Embodiment

Next, a nonvolatile semiconductor memory device according to a second embodiment is described with reference to FIGS. 12A, 12B, and 12C. The nonvolatile semiconductor memory device according to the second embodiment differs from the nonvolatile semiconductor memory device according to the first embodiment in being a program operation that executes a program operation continuously on the word lines WL0 and WL1. However, the nonvolatile semiconductor memory device according to the second embodiment is similar regarding other configurations and so on, hence a detailed description of such other configurations is omitted. Note that for convenience of description, it is assumed that program of the threshold voltage distribution E' to the word line WL0 has already been completed by the E' distribution program ((i) in FIG. 12A).

Figure 12A:
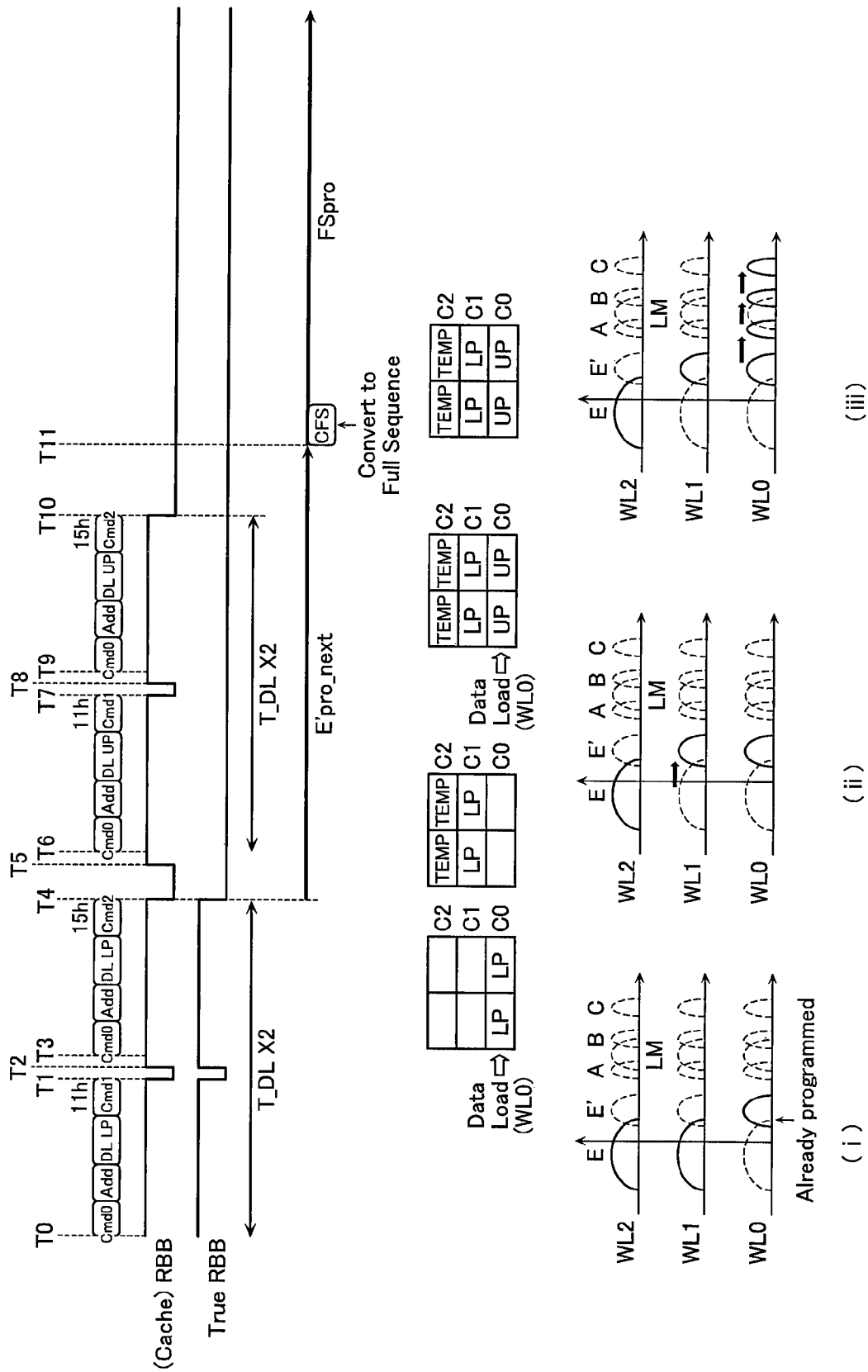
FIG. 12A is a timing chart showing a procedure of a program operation in a second embodiment.
Figure 12B:
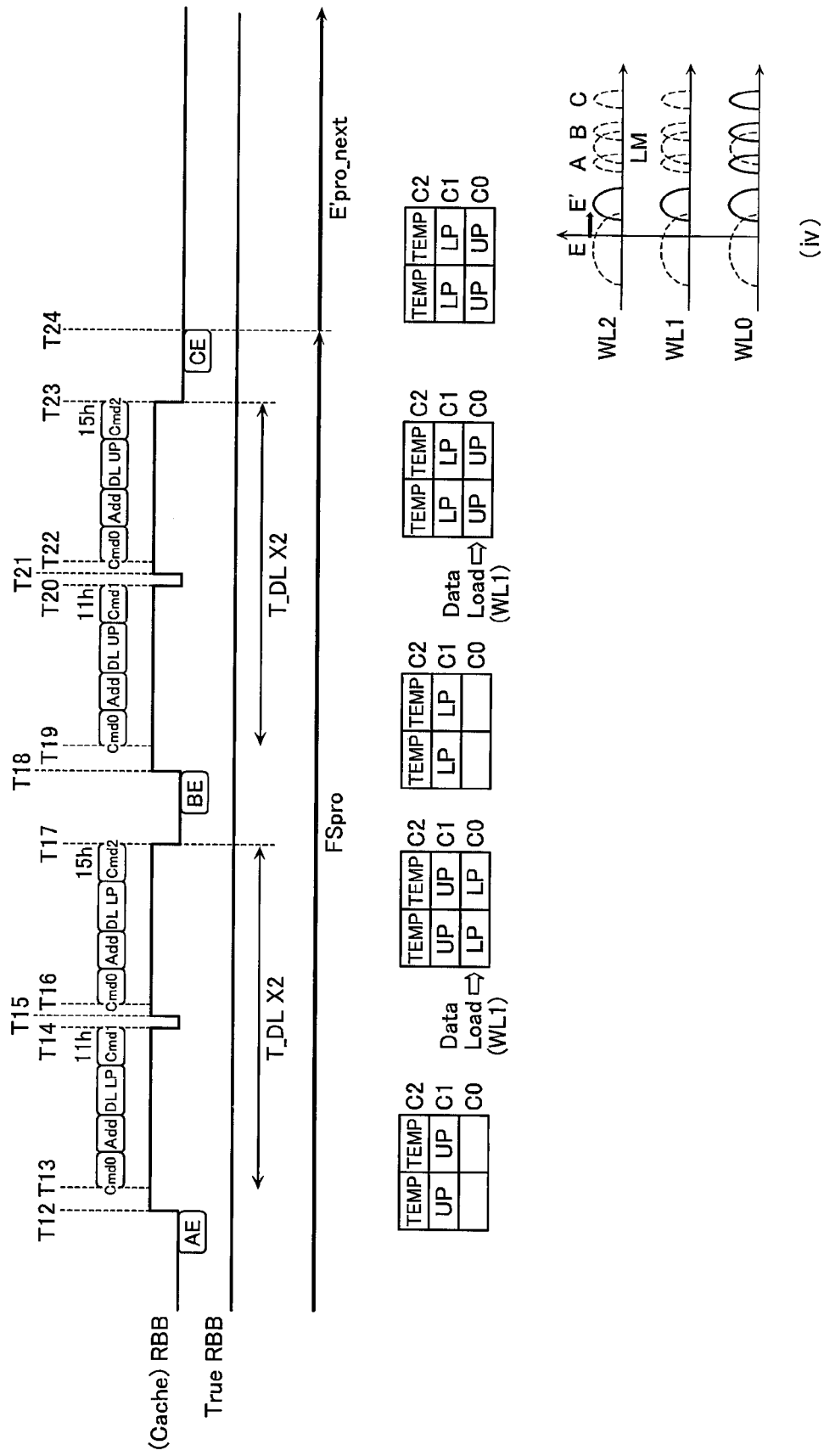
FIG. 12B is a timing chart showing the procedure of the program operation in the second embodiment.
Figure 12C:
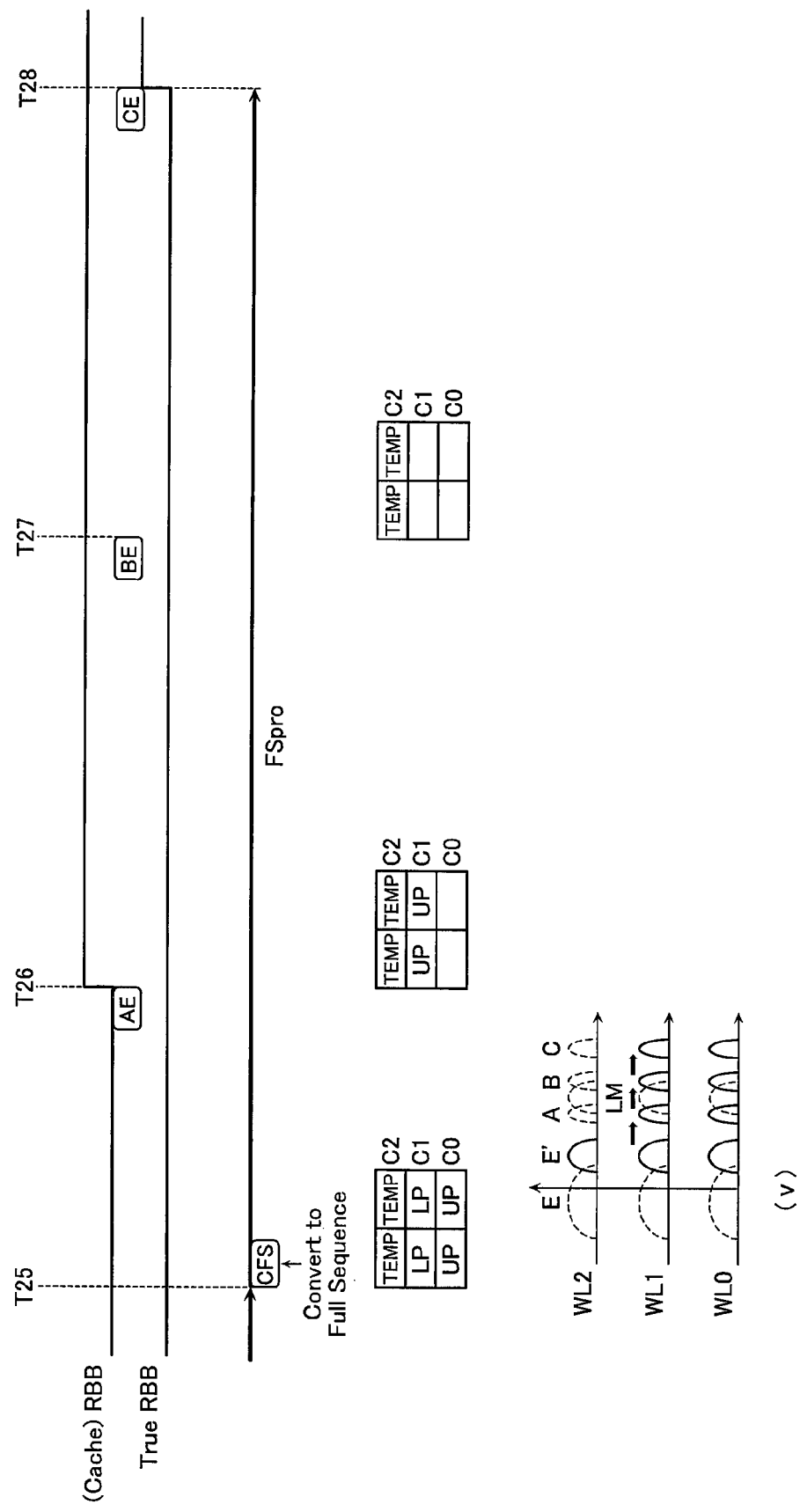
FIG. 12C is a timing chart showing the procedure of the program operation in the second embodiment.

In these FIGS. 12A, 12B, and 12C, in the program operation on the word line WL0, lower page data (LP) and upper page data (UP) to be programmed to the word line WL0 are continuously inputted to the input/output circuit 16, and further data-loaded into the cash memories C0 and C1.

At times T0-T1, lower page data to be programmed to the memory cell MC0 formed along the word line WL0 in the plane PLANE0 is data-loaded. In addition, after performing the dummy program command Cmd1 similarly to as previously mentioned, at times T3-T4, lower page data (LP) to be programmed to the memory cell MC0 formed along the word line WL0 in the plane PLANE1 is data-loaded. At time T4, when the cache program execution command Cmd2 is issued, data loaded in the cache memory C0 can be immediately transferred to the cache memory C1 since there is a vacant region in the page buffer 13. Therefore, the cache memory C0, subsequent to completion of that data transfer, is in a state of being able to receive the next data load, hence, at time T5, the cache RBB becomes "H". As a result, at times T6-T7, upper page data (UP) to be programmed to the memory cell MC0 formed along the word line WL0 in the plane PLANE0 is data-loaded. In addition, after performing the dummy program command Cmd1 similarly to as previously mentioned, at times T9-T10, upper page data (UP) to be programmed to the memory cell MC0 formed along the word line WL0 in the plane PLANE1 is data-loaded.

Meanwhile, the E' distribution program operation on the memory cell MC1 formed along the word line WL1 adjacent to the word line WL0 which is subject to program is started at time T4 or thereafter. At time T4, the cache program command Cmd2 is issued (time T4 and thereafter, E'pro_next, arrow in (ii) of FIG. 12A). Moreover, in the case where this E' distribution program is completed at time T11, the data load of upper page data (UP) and issue of the cache program command Cmd2 for that upper page data (UP) are already issued time T10. At the point of time when the E' distribution program has been completed, the control circuit 15 changes a program method to the selected word line WL0 from an original one to another one, according to whether the next program execution command has already been issued or not. In this case, the next cache program command Cmd2 is already issued, and since lower page data (LP) and upper page data (UP) are both already stored in the cache memories C0 and C1, a final program destination is completely specified. Therefore, it becomes unnecessary to temporally divide lower page data program and upper page data program when performing the program, thereby enabling a program operation that simultaneously programs the threshold voltage distributions E' to C (hereinafter, such a program operation is referred to as a "full sequence program") to be executed. In the program control method based on FIG. 6, the upper page program operation causes program from the threshold voltage distribution E' to all of the other threshold voltage distributions A, B, and C to be performed. Hence, in the case of executing the program control method of FIG. 6, time required for the full sequence program is substantially the same as time required for upper page program only. Therefore, if the procedure of executing the upper page program operation after executing the lower page program operation is followed through in an ordinary manner, the time for performing the lower page program operation appears to be a superfluous program time. In other words, ordinarily, the time of the lower page program operation and the time of the upper page program operation are both required as a total program time. However, performing the E' distribution program operation prior to the lower page program operation as in the present embodiment makes it possible to execute the full sequence program operation, thereby obtaining a time advantage that lower page program time can be omitted.

Compared to the first embodiment, the second embodiment can reduce a time over an ordinary cache program operation due to performing load of following program data during an internal operation (in this case, the E' distribution program on the memory cell MC1 formed along the adjacent word line WL1). In addition, the second embodiment can reduce internal operation time (E' distribution program time and program time to the original selected word line WL0).

When this full sequence program (FSpro) proceeds to complete program to the threshold voltage distribution A at time T12, lower page data (LP) is no longer necessary. Thus, the lower page data (LP) is abandoned from the cache memory C1. Therefore, Upper page data (UP) is transferred to the cache memory C1 in place of the abandoned lower page data, and the cache memory C0 attains a state of being able to receive the next data load.

As shown in FIG. 12B, when the cache memory C0 becomes utilizable at time T12, loading to the input/output circuit 16 of lower page data (LP) to be programmed to the adjacent word line WL1 is started from time T13. In the example in FIG. 12B, at times T13-T14, lower page data (LP) to be programmed to the memory cell MC1 formed along the word line WL1 in the plane PLANE0 is loaded. In addition, at times T16-T17, lower page data (LP) to be programmed to the memory cell MC1 formed along the word line WL1 in the plane PLANE1 is loaded.

Now, although the cache program command Cmd2 is issued at time T17, up to time T18, the page buffer 13 is filled with data. Hence, the cache RBB is in a busy state of "L". At time T18, when the upper page data program operation on the memory cell MC0 along the word line WL0 is completed to the threshold voltage distribution B (BE), information subsequently required is only information on whether to program to the threshold voltage distribution C or not. Hence, content of the cache memory C1 used to that point (upper page data for the word line WL0) may be programmed over by other data. Accordingly, lower page data (LP) for the word line WL1 stored in the cache memory C0 is transferred to the cache memory C1, whereby the cache memory C0 becomes utilizable again. Therefore, at time T18, the cache RBB becomes "H".

Consequently, at times T19-T20, upper page data (UP) to be programmed to the memory cell MC1 formed along the word line WL1 in the plane PLANE0 is loaded. In addition, at times T22-T23, upper page data (UP) to be programmed to the memory cell MC1 formed along the word line WL1 in the plane PLANE1 is loaded.

Thus, lower page data (LP) and upper page data (UP) for writing to the memory cell MC1 formed along the word line WL1 is stored in the cache memories C0 and C1, respectively. As shown in FIG. 12C, when the program operation on the memory cell MC0 formed along the word line WL0 has all been completed to the threshold voltage distribution C at for example time T24, and before the program operation on the word line WL1 is started, the control circuit 15 starts the E' distribution program operation on the memory cell MC2 formed along the word line WL2 adjacent to the word line WL1 (E'pro_next). Subsequently, the control circuit 15 starts the above-mentioned full sequence program operation from time T25, similarly to in the memory cell MC0 formed along the word line WL0 (refer to FIG. 12C).

As in this FIG. 12B, if data load of lower page data and data load of upper page data to be programmed to the memory cell MC formed along a certain word line WLn can be performed completely during the full sequence program operation on the word line WLn−1 one previous. Thereby, it becomes possible to raise program performance to a maximum. That is, the cache program operation functions with maximum effectiveness.

In this second embodiment, in the two bits per cell program operation on a certain word line WL, lower page data and upper page data are continuously loaded, and a full sequence program for simultaneously performing program of lower page data and program of upper page data without any temporal distinction is executed. In addition, the E' distribution program operation on the adjacent memory cell is performed in parallel with loading of program data. Thereby, in this point also, time required for the program operation can be reduced compared to in the first embodiment.

Figure 13A:
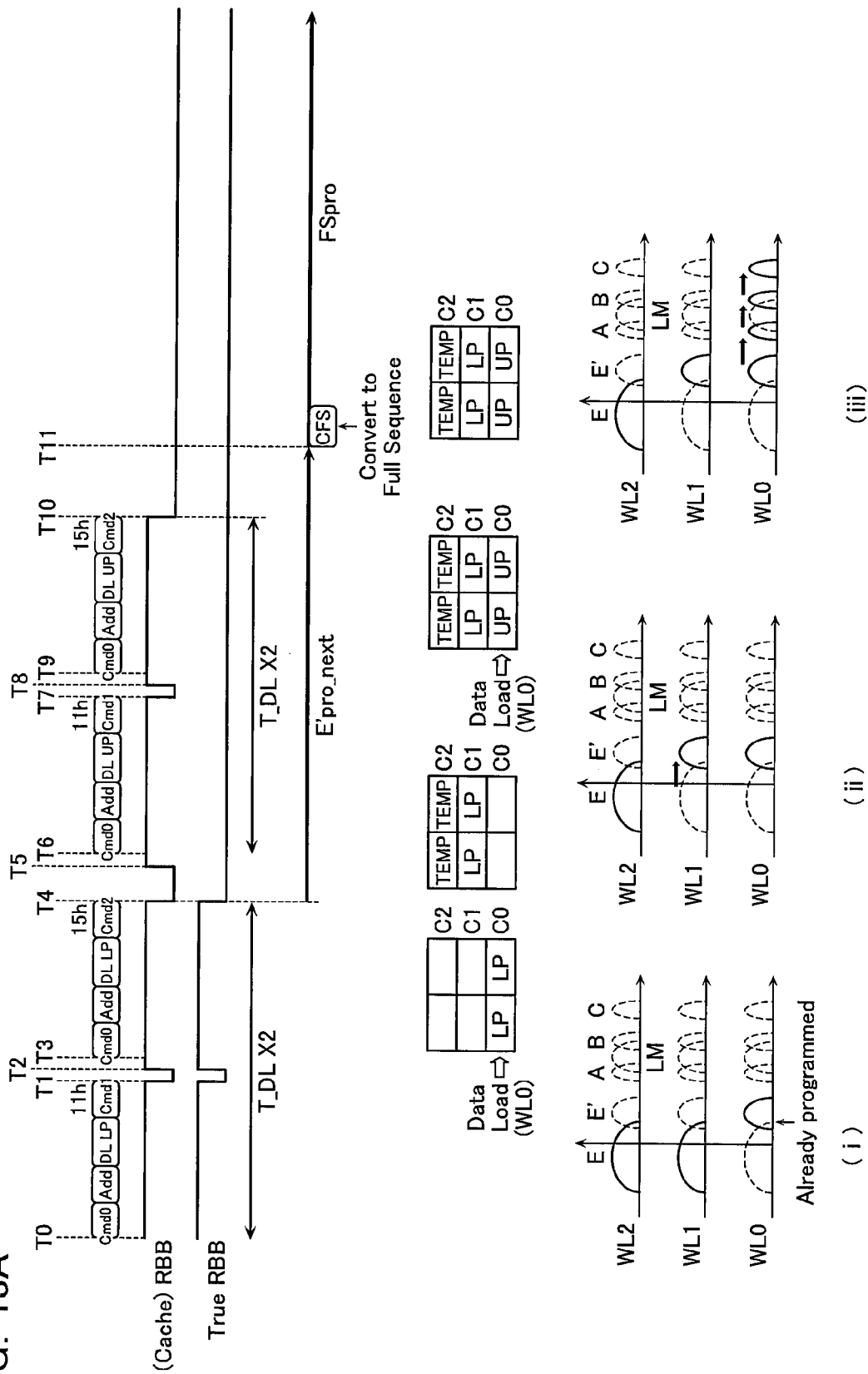
FIG. 13A is a timing chart showing a procedure of a program operation in a first modified example of the second embodiment.
Figure 13B:
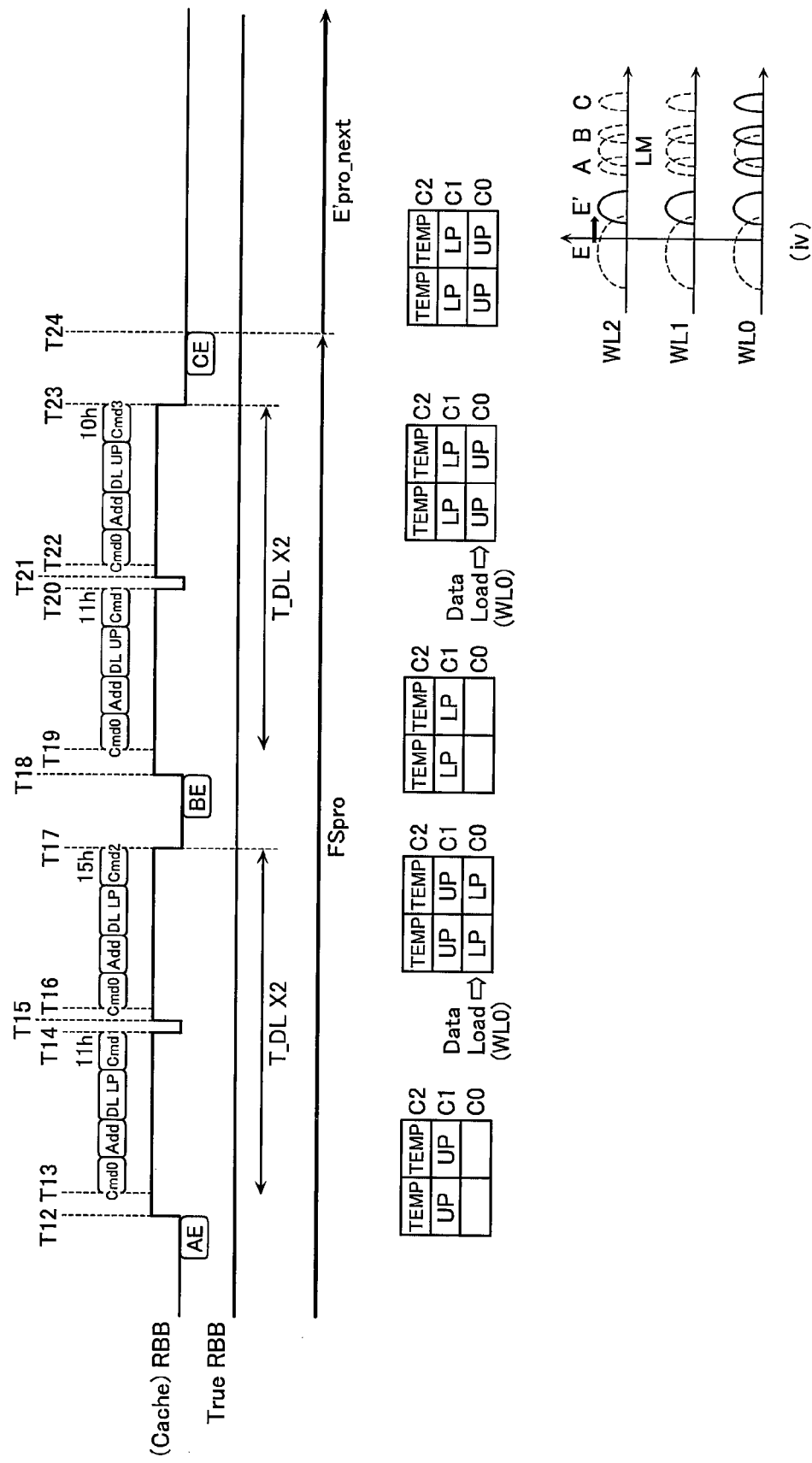
FIG. 13B is a timing chart showing the procedure of the program operation in the first modified example of the second embodiment.
Figure 13C:
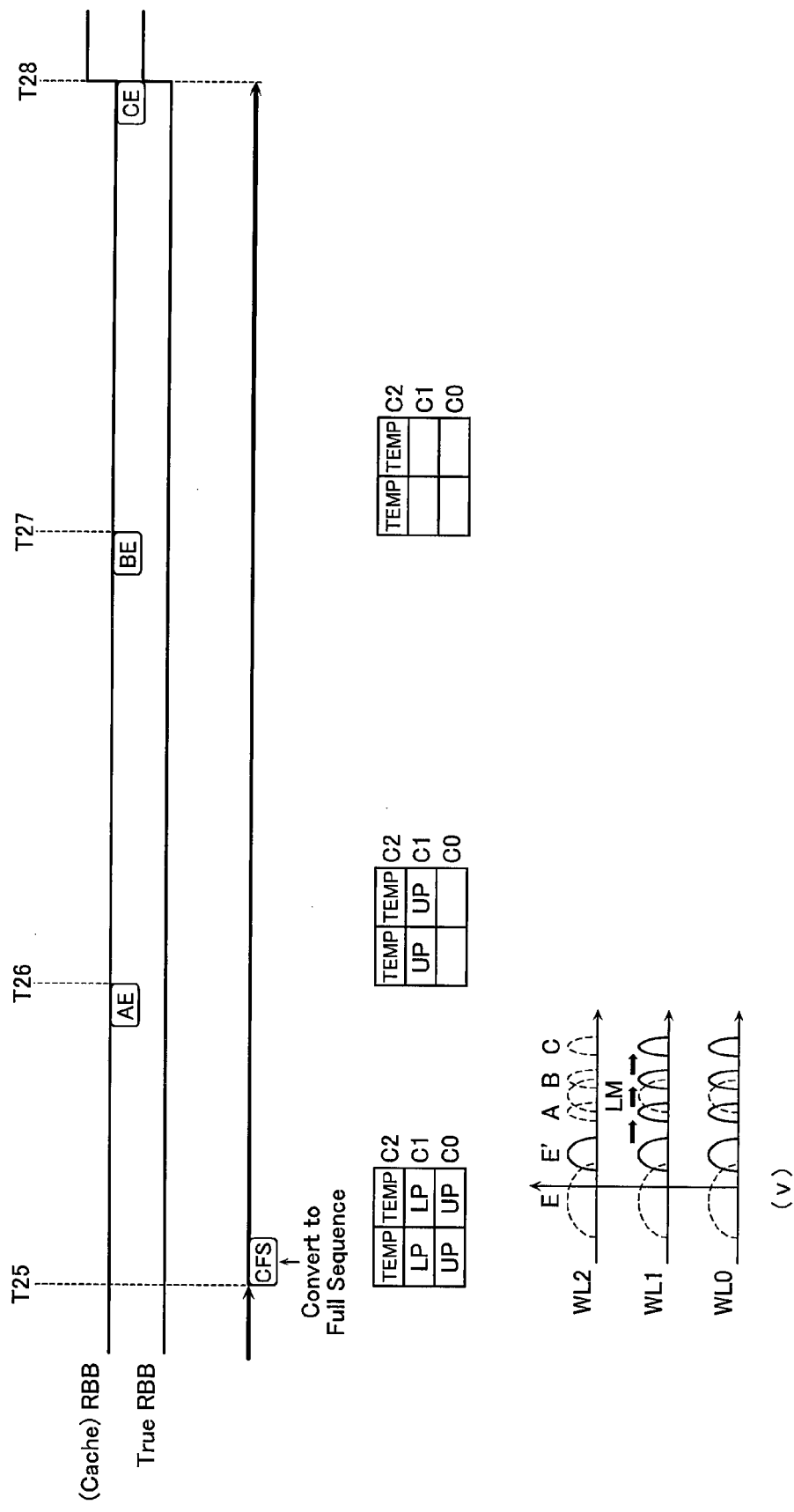
FIG. 13C is a timing chart showing the procedure of the program operation in the first modified example of the second embodiment.

FIGS. 13A-13C show a program operation according to a first modified example of the second embodiment. As shown in FIG. 13B, the program operation shown in these FIGS. 13A-13C differs from that in FIGS. 12A-12C in having the command at time T23 set to a "10h" command. Thereby the cache RBB is maintained at "L" (busy) until the program operation on the word line WL1 is completed to the threshold voltage distribution C.

Figure 14A:
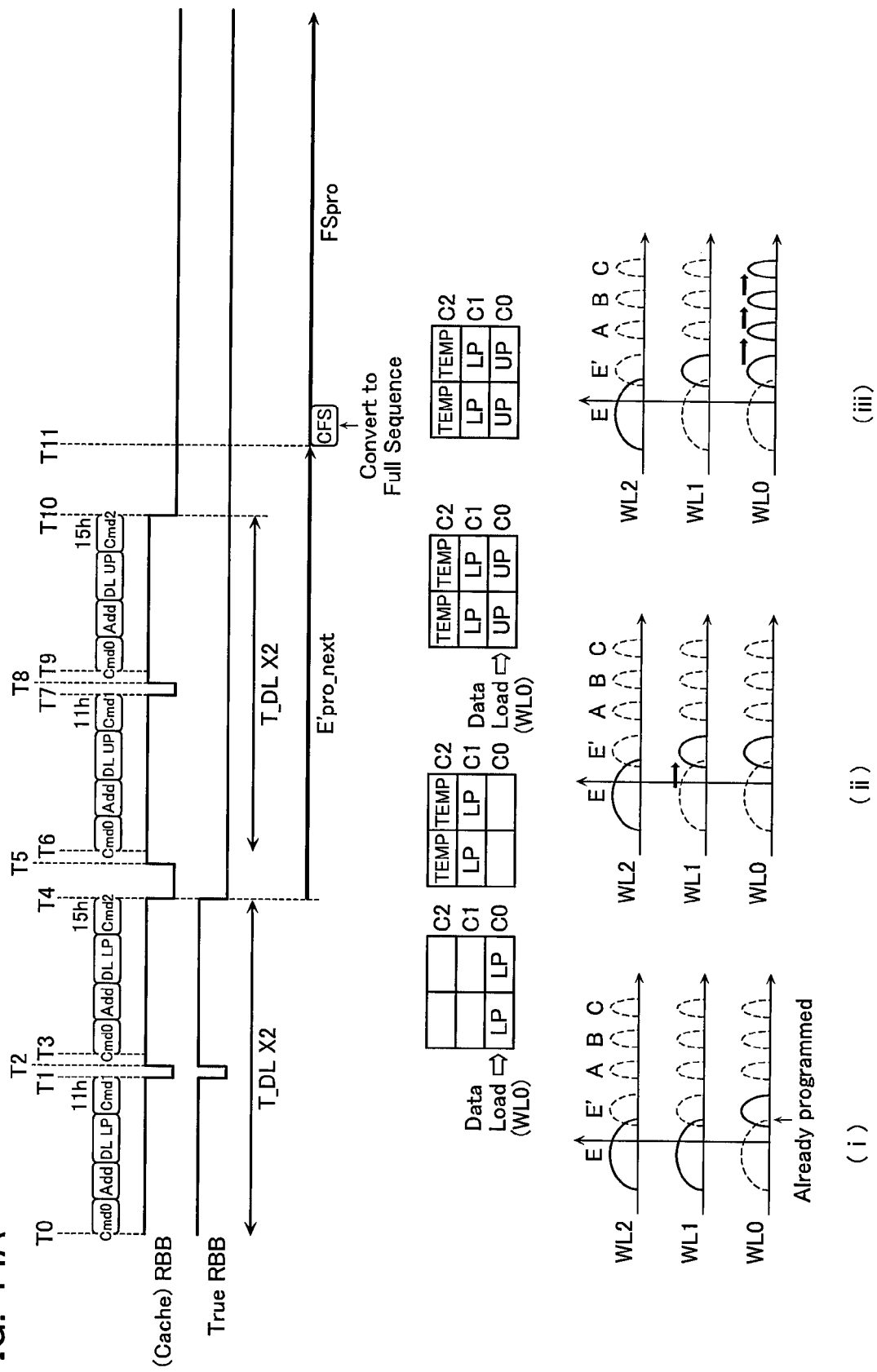
FIG. 14A is a timing chart showing a procedure of a program operation in a second modified example of the second embodiment.
Figure 14B:
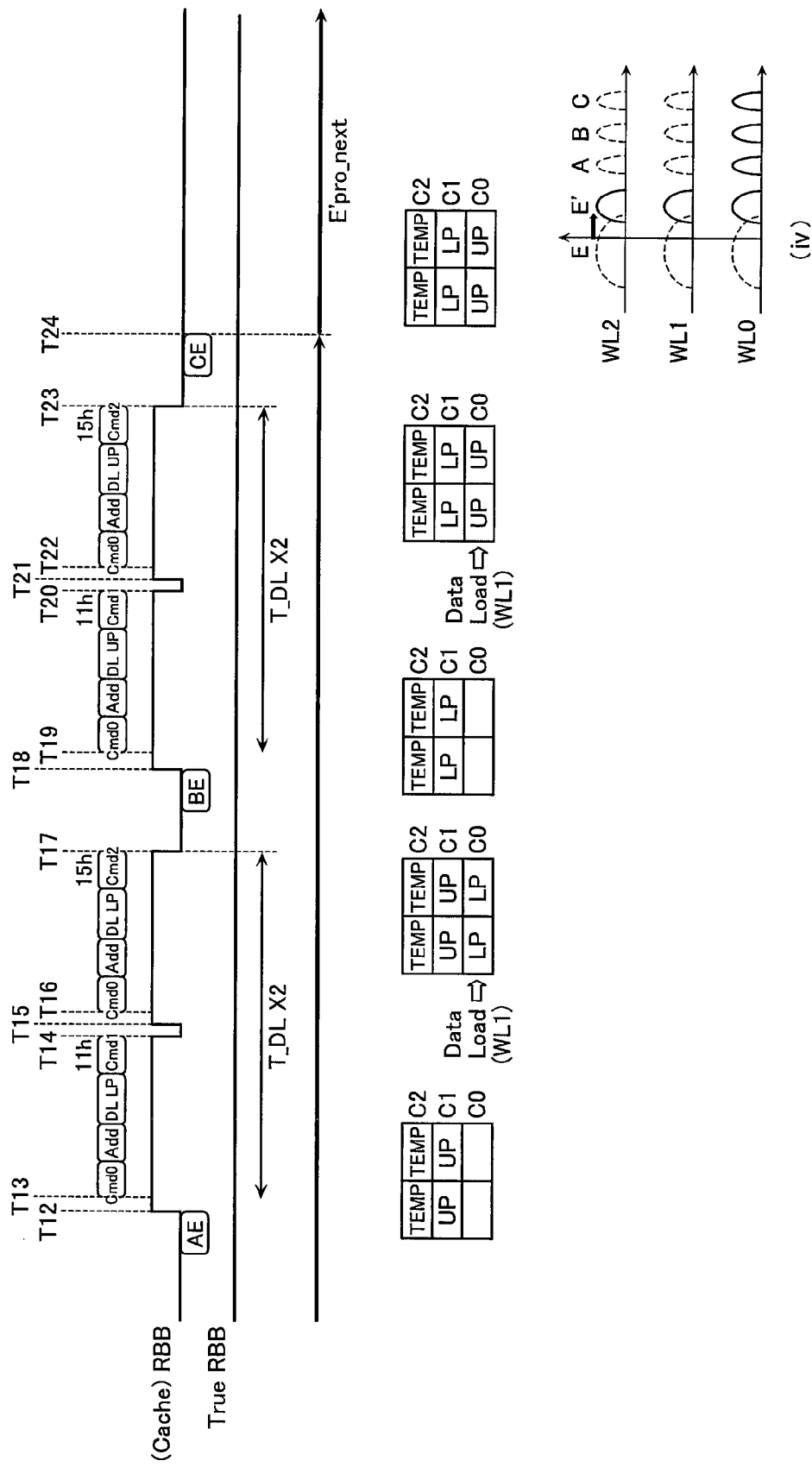
FIG. 14B is a timing chart showing the procedure of the program operation in the second modified example of the second embodiment.
Figure 14C:
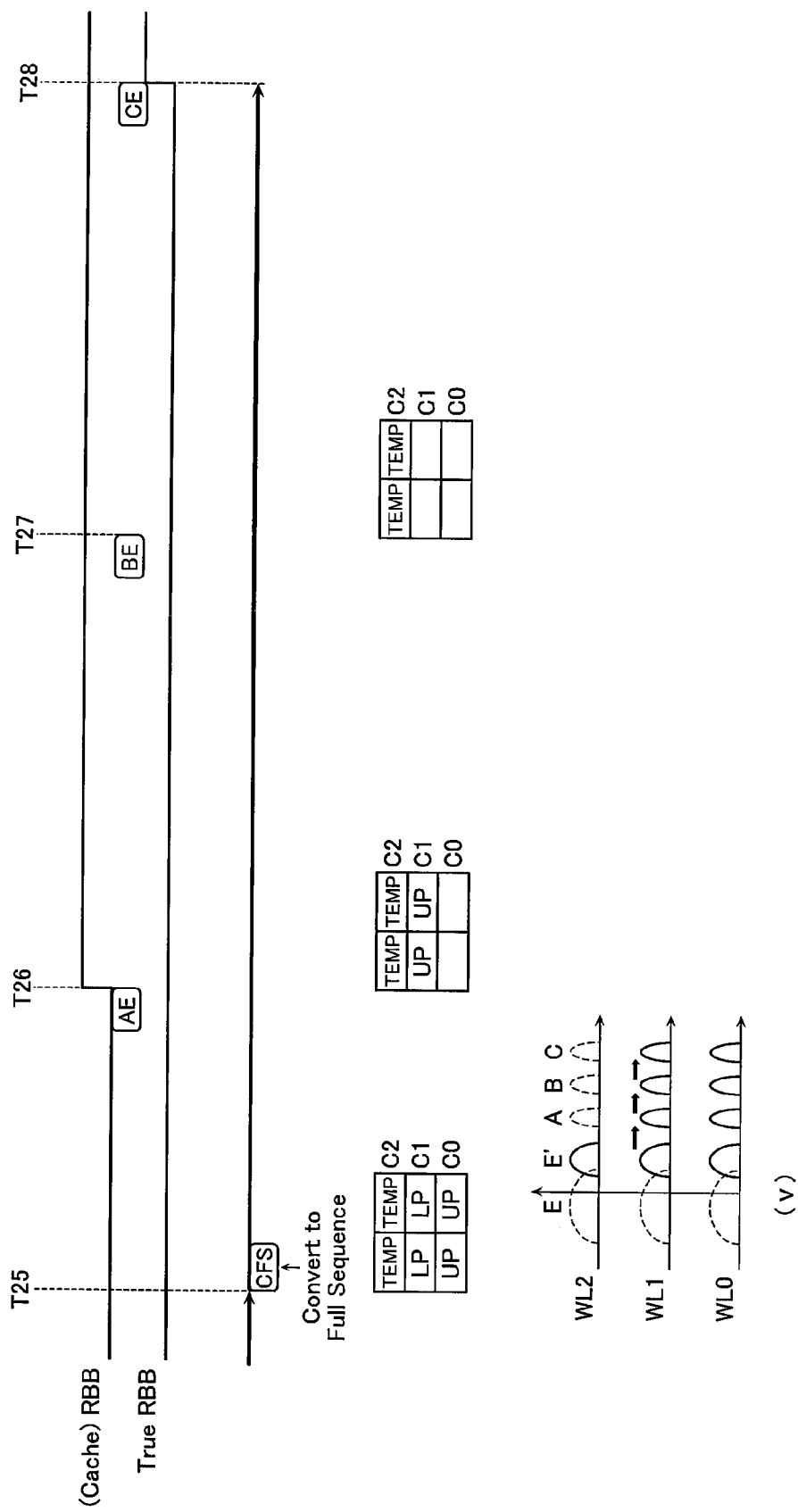
FIG. 14C is a timing chart showing the procedure of the program operation in the second modified example of the second embodiment.

FIGS. 14A-14C show a program operation according to a second modified example of the second embodiment. These FIGS. 14A-14C illustrate an example executing a continuous program operation when the program procedure as in FIG. 7 is applied.

At time T6 in FIG. 14A, when the cache RBB being "H" is detected, program processing of upper page data is started. Similarly, data load and issuing of program commands continue is continued one after another without any time wastage. Due to this, even when program control of the threshold voltage distributions as shown in FIG. 7 is employed, the operation actually executed in the semiconductor memory device includes only the E' distribution program and the aforementioned full sequence program operation. This is the same operation as in FIGS. 12A-12C.

Third Embodiment

Figure 15A:
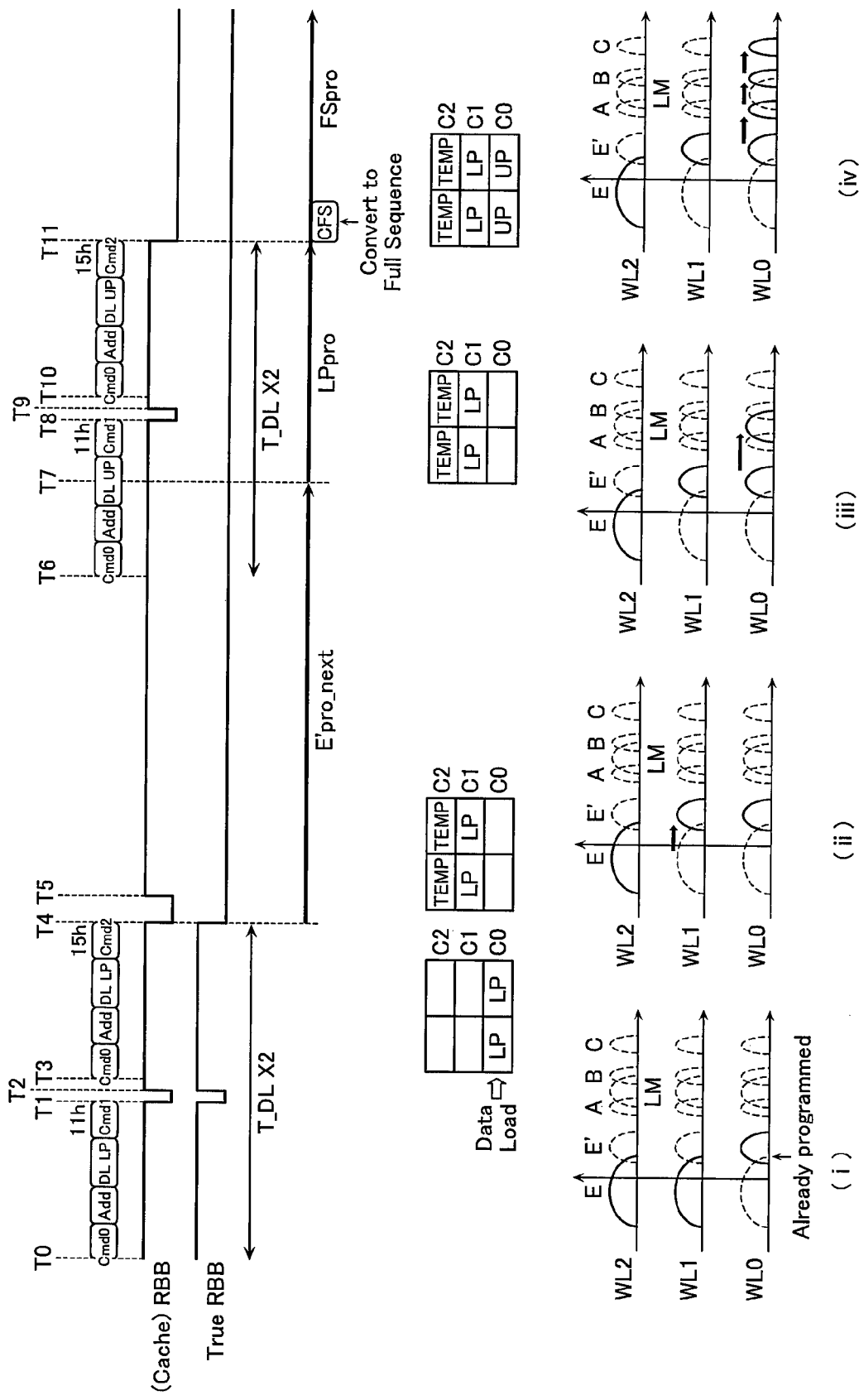
FIG. 15A is a timing chart showing a procedure of a program operation in a third embodiment.
Figure 15B:
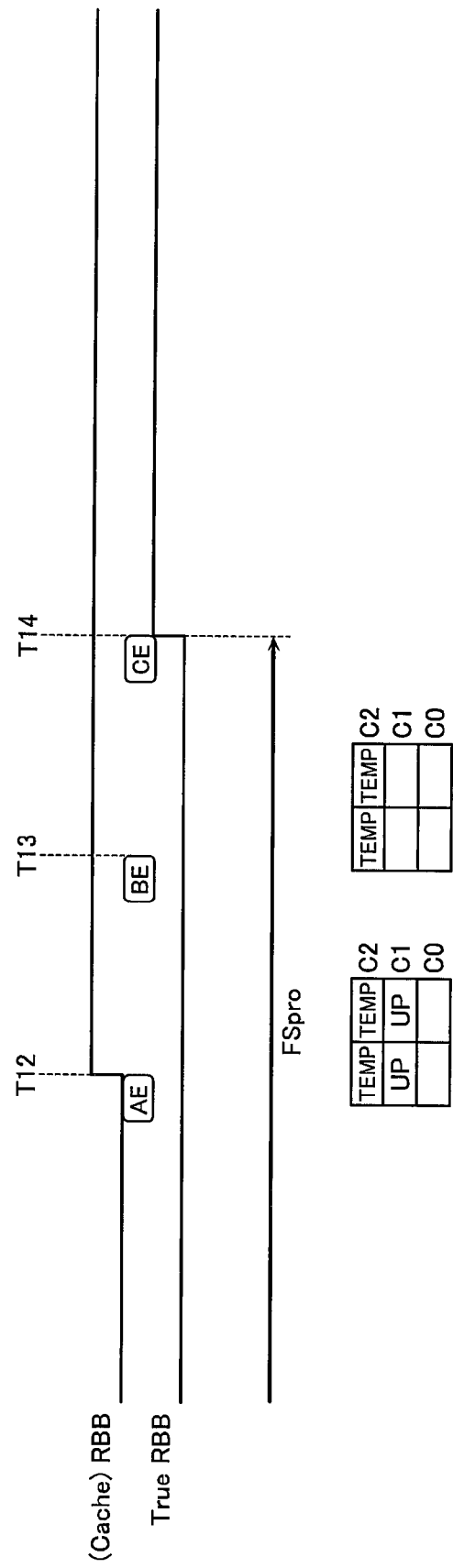
FIG. 15B is a timing chart showing the procedure of the program operation in the third embodiment.

Next, a nonvolatile semiconductor memory device according to a third embodiment is described with reference to FIGS. 15A and 15B. The overall configuration is similar to that shown in FIGS. 1-5. However, as shown in FIGS. 15A and 15B, in this embodiment, the control method of the program operation subsequent to completion of the E' distribution program operation differs from that in the first embodiment. Note that description of matters similar to in FIGS. 10A and 10B is omitted. FIGS. 15A and 15B also show the case of executing a program operation on the memory cell MC0 formed along the word line WL0. Description proceeds assuming that program of the threshold voltage distribution E' to the word line WL0 has already been completed by the E' distribution program ((i) in FIG. 15A).

The program procedure in the third embodiment is described referring to FIGS. 15A-15C. Up to time T4, the program procedure in the third embodiment is substantially similar to that in the first embodiment. However, in this third embodiment, after the cache RBB has become "H" thereby enabling data load of the next program data at time T5, data load of upper page data (UP) begins at time T6 after a sufficient time has passed. As a result, at time T11, data load of lower page data and upper page data for two planes (PLANE0 and PLANE1) is completed, and the cache program command is issued. The time T11 is later than time T7 when the E' distribution program operation is completed.

In this way, there is a case where loading of upper page data (UP) is not completed by the time the E' distribution program operation on the word line WL1 is completed (time T7). In this case, the following operation is performed. That is, as shown in FIG. 14A, from time T7, the lower page data program operation on the memory cell MC0 formed along the word line WL0 is first started, based on already-stored lower page data (LP) (LPpro at times T7-T11), without waiting for completion of loading of upper page data (UP) to the cache memory C0. When simply looking at illustration of FIG. 15A, it looks as if it is known beforehand that upper page data program will be carried out after the lower page program started at time T7. However, in reality, at the point of time T7 when the E' distribution program operation is completed, it is undetermined whether there is an upper page data program subsequent to time T7 or not. Also, even if it is confirmed that there is an upper page data program, the period when the execute command of the upper page data program operation is issued and so on is indeterminate. Therefore, it is desirable to start the lower page data program (LPpro) first, unless the program execute command of upper page data is inputted by the time the E' distribution program has been completed (time T7).

However, when loading of upper page data (UP) to the cache memory C0 is completed at time T11 and the cache program command Cmd2 (15h command) is issued, lower page data (LP) and upper page data (UP) are prepared in the cache memories C0 and C1, enabling the previously mentioned full sequence program to be executed. Moreover, the control circuit 15 can detect the condition in which both the lower page data and the upper page data are prepared, and the cache program execute command has been issued. Hence, at time T11, the control circuit 15 suspends the lower page data program operation (LPpro) on the memory cell MC0 under way, and shifts to the full sequence program (FSpro). Thereafter, as shown in FIG. 15B, operation is continued until the full sequence program is completed.

In this way, in the present embodiment, the control circuit 15 is configured to, when upper page data has not been stored in the cache memory at the stage when the E' distribution program operation on the memory cell formed along the adjacent word line WLn+1 is completed, first start a lower page data program, then subsequently, as soon as upper page data and lower page data have both been prepared, be able to shift to the full sequence program. This allows the nonvolatile semiconductor memory device of the present embodiment to function to reduce program operation time even in intermediate operation states of the first or second embodiments.

Fourth Embodiment

Next, a nonvolatile semiconductor memory device according to a fourth embodiment is described with reference to FIGS. 16-17. The overall configuration is similar to that shown in FIGS. 1-5.

In this embodiment, similarly to in the previously mentioned embodiments, prior to the program operation on the memory cell MCn formed along the word line WLn subject to program, an E' distribution program operation is performed on the adjacent word line WLn+1. The present embodiment includes an additional feature to the features of the previously mentioned embodiments. That is, the present embodiment has its feature in a control method in the case where an upper page program operation is started in any selected word line.

Figure 16:
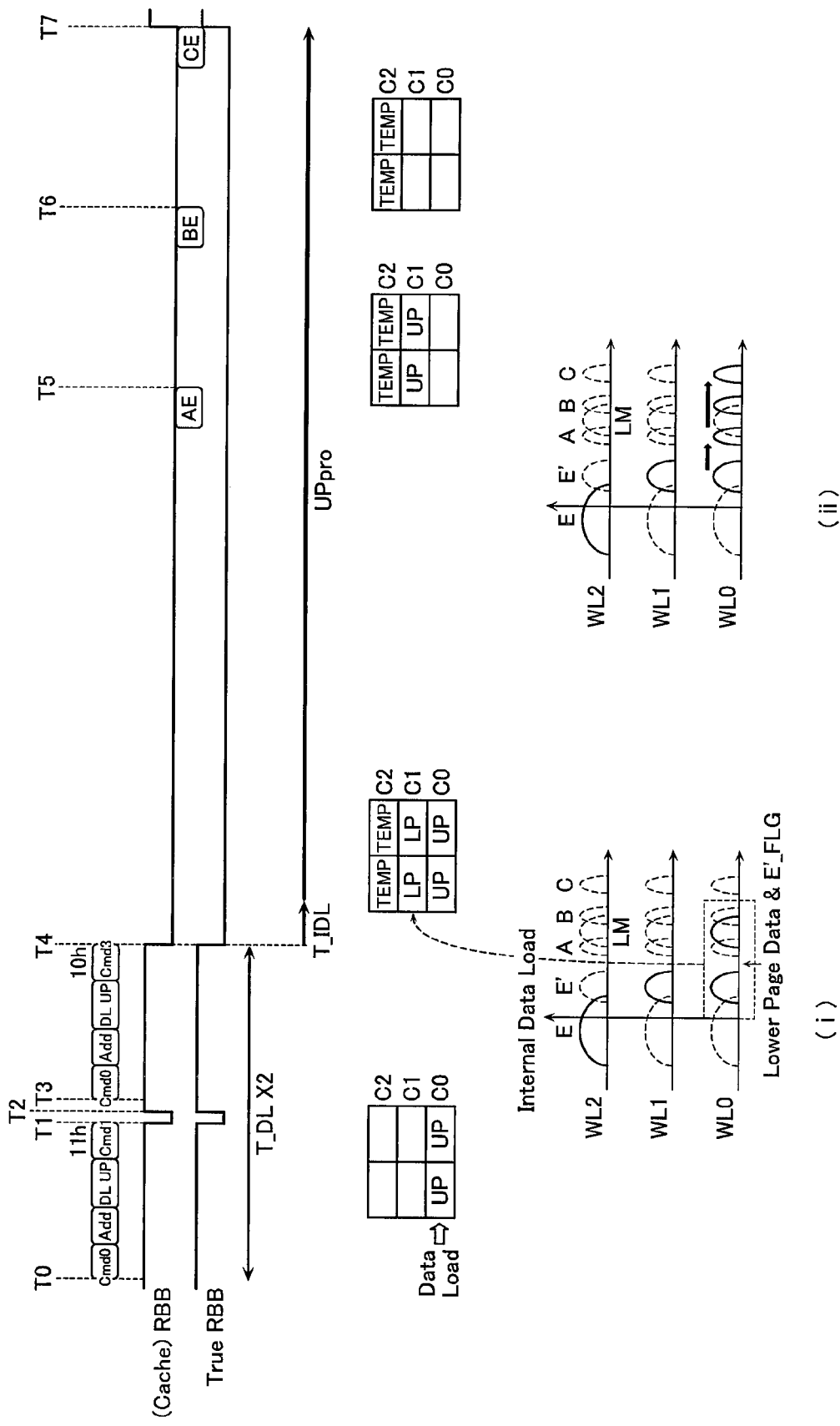
FIG. 16 is a timing chart showing a procedure of a program operation in a fourth embodiment.

FIG. 16 shows a case where only lower page data (LP) is programmed to the memory cell MC0 formed along the word line WL0 at a certain point of time in the past, and thereafter, program of upper page data (UP) thereto is started at any timing. FIG. 16 shows an operation in such a case. Hence, the memory cell MC0 formed along the word line WL0 is already provided with the threshold voltage distribution E' or the intermediate distribution LM ((i) in FIG. 16). As a result of the E' distribution program operation, the memory cell MC1 formed along the word line WL1 is also already provided with the threshold voltage distribution E' ((i) in FIG. 16).

In such a state, the control circuit 15 in the present embodiment starts a read operation on the memory cell MC0 formed along the word line WL0 from time T4 (T_IDL), and stores the read data in the cache memory C1 as lower page data (LP) of the memory cell MC0. Moreover, in parallel to this, a read operation of the E' flag data of the word line WL1 is also executed, and it is judged whether execution of the E' distribution program operation on the word line WL1 has been completed or not. Now, in this case, the E' flag data is data stored in a certain number of the memory cells formed along the word line WL0. Each of the word lines WL is allocated with a region for storing the E' flag data. Stored in the E' flag data region formed by a certain number of the memory cells formed along the word line WL0 is a program state of the threshold voltage distribution A in the memory cell MC1 formed along the word line WL1. Similarly, stored in the E' flag data region formed by a certain number of the memory cells formed along the word line WL1 is a program state of the threshold voltage distribution E' in the memory cell MC2 formed along the word line WL2. That is, stored in the E' flag data region of the selected word line WLn is a program state of the threshold voltage distribution E' in the memory cell MCn+1 along the adjacent word line WLn+1 that undergoes data program after the word line WLn.

If the result of judgment based on the E' flag data shows that the E' distribution program on the memory cell MC1 formed along the word line WL1 is not completed, an E' distribution program is performed to the memory cell MC1.

If execution of E' distribution program in the memory cell MC1 formed along the word line WL1 is completed, the upper page program operation (UPpro) on the memory cell MC0 based on lower page data (LP) and upper page data (UP) stored in the cache memories C0 and C1 is started (to time T7).

In FIG. 16, an example is shown in which upper page program is executed by command Cmd3 (10h), hence the cache RBB is set at "L" to time T7. But, as shown in FIG. 10B, when upper page program is executed by command Cmd2 (15h), the cache RBB is set to "H" at the point of time when program to the threshold voltage distribution B is completed.

Figure 17:
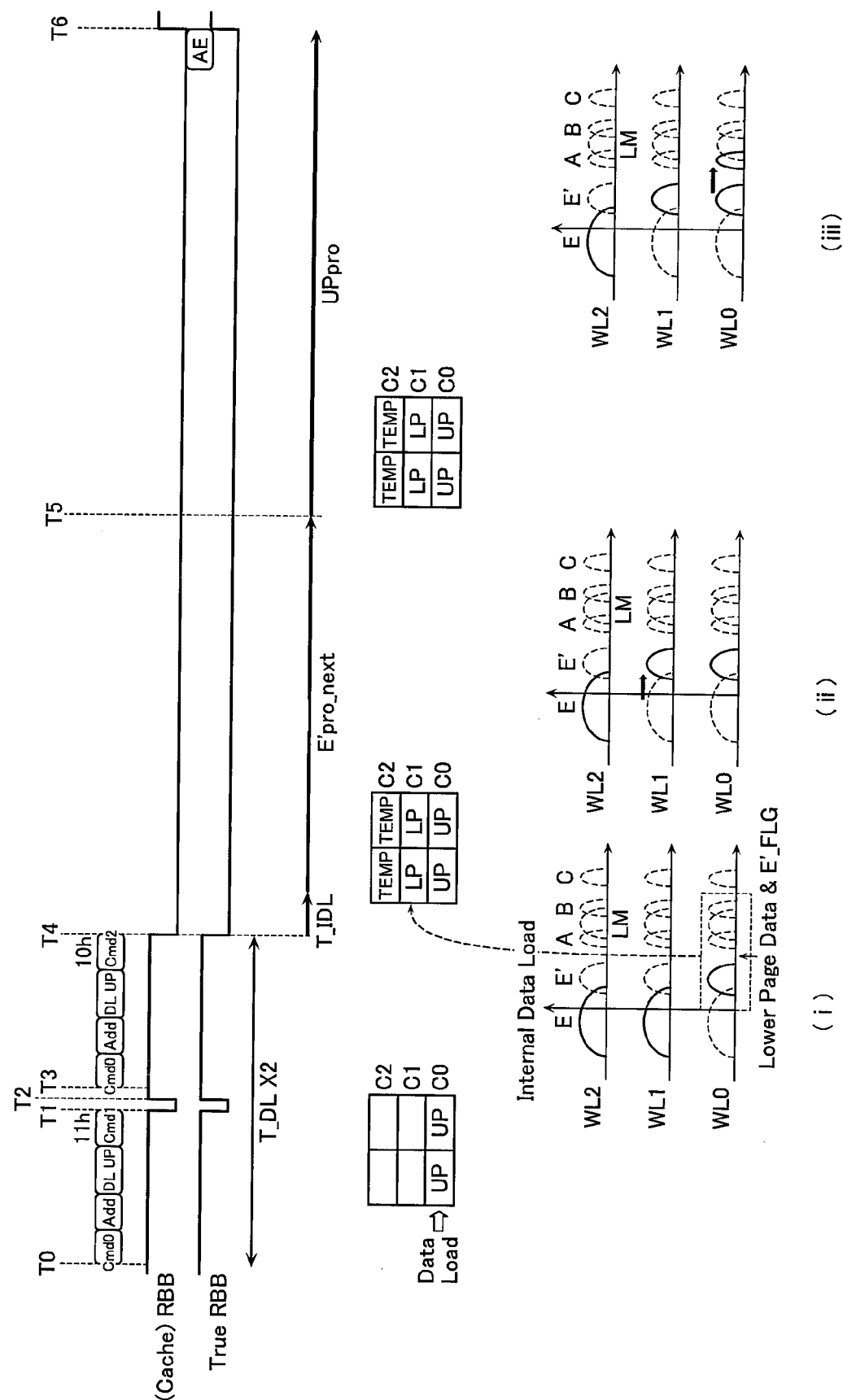
FIG. 17 is a timing chart showing a procedure of a program operation in the fourth embodiment.

FIG. 17 shows a case where, despite program of lower page data (LP) to the memory cell MC0 formed along the word line WL0 is not completed, upper page data (UP) is inputted first to the input/output circuit 16 for some reason. FIG. 17 illustrates an operation in this case. As a result, the memory cell MC0 formed along the word line WL0 has threshold voltage distribution A only. On the other hand, in the memory cell MC1 formed along the word line WL1, E' distribution program is incomplete, hence the memory cell MC1 formed along the word line WL1 is provided with the threshold voltage distribution E ((i) in FIG. 17).

In such a state, the control circuit 15 in the present embodiment starts a read operation on the memory cell MC0 formed along the word line WL0 from time T4 (T_IDL) and stores the read data in the cache memory C1 as lower page data (LP) of the memory cell MC0. Moreover, in parallel to this, a read operation of the E' flag data of the word line WL1 is also executed, and it is judged whether execution of the E' distribution program operation on the word line WL1 has been completed or not.

If E' distribution program to the word line WL1 is incomplete, E' distribution program is executed ((ii) in FIG. 17).

Subsequent to completion of E' distribution program, a program operation based only on upper page data is executed on the word line WL0. If upper page data is "1", program to the memory cell MC0 that is to have the threshold voltage distribution E' maintained is prohibited. On the other hand, if upper page data is "0", a program operation to change the threshold voltage distribution E' to A is executed.

As described above, according to the present embodiment, even when upper page program is performed in a state where E' distribution program to the adjacent word line has not been performed for some reason, a program operation may be completed while obtaining similar advantages to the above-described embodiments.

Fifth Embodiment

Next, a nonvolatile semiconductor memory device according to a fifth embodiment is described with reference to FIGS. 18A-18C. The overall configuration is similar to that shown in FIGS. 1-5. This embodiment differs from the aforementioned first through fourth embodiments in that, subsequent to at least a part of the data program operation on the memory cell MCn subject to program being executed, an E' distribution program operation is executed to the memory cell MCn+1 adjacent to this memory cell MCn (hereinafter, the first through fourth embodiments are referred to as "prior-program" scheme, and the fifth embodiment is referred to as "post-program" scheme).

Figure 18A:
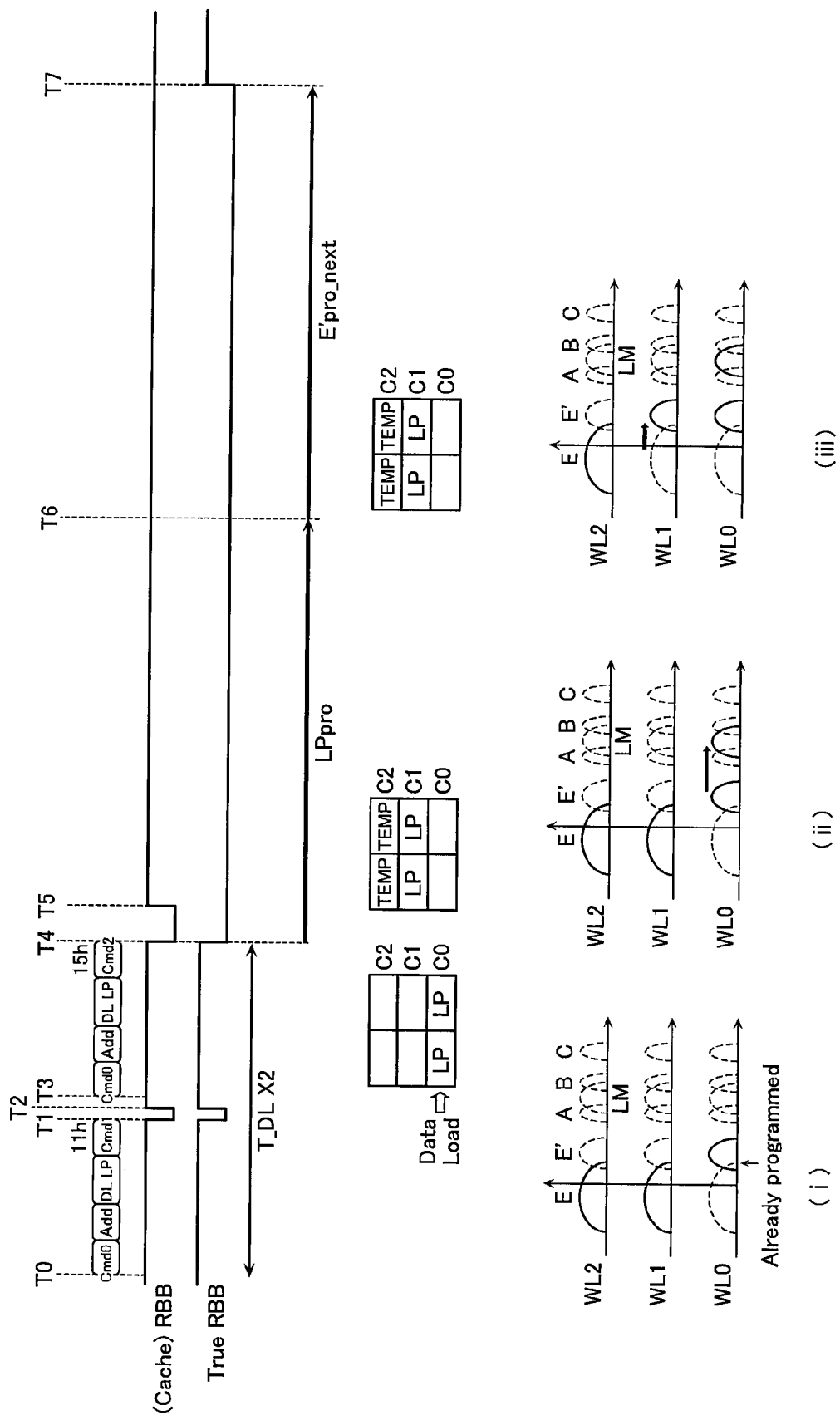
FIG. 18A is a timing chart showing a procedure of a program operation in a fifth embodiment.

As shown in FIG. 18A, similarly to the first embodiment up to time T5, lower page data (LP) to be provided to the memory cell MC0 formed along the word line WL0 in planes PLANE0 and PLANE1 is loaded. Subsequently, at time T4, lower page data program (LPpro) based on this lower page data is started ((ii) in FIG. 18A). After this is completed, at time T6, an E' distribution program operation (E'pro_next) for the memory cell MC1 formed along the adjacent word line WL1 is started ((iii) in FIG. 18A).

Subsequently, when the E' distribution program operation is completed at time T7, upper page data (UP) to be provided to the memory cell MC0 formed along the word line WL0 in the planes PLANE0 and PLANE1 is loaded at times T8-T12. Thereafter, upper page data program (UPpro) is executed in a substantially similar manner to in the first embodiment ((iv) in FIG. 18B).

Figure 18B:
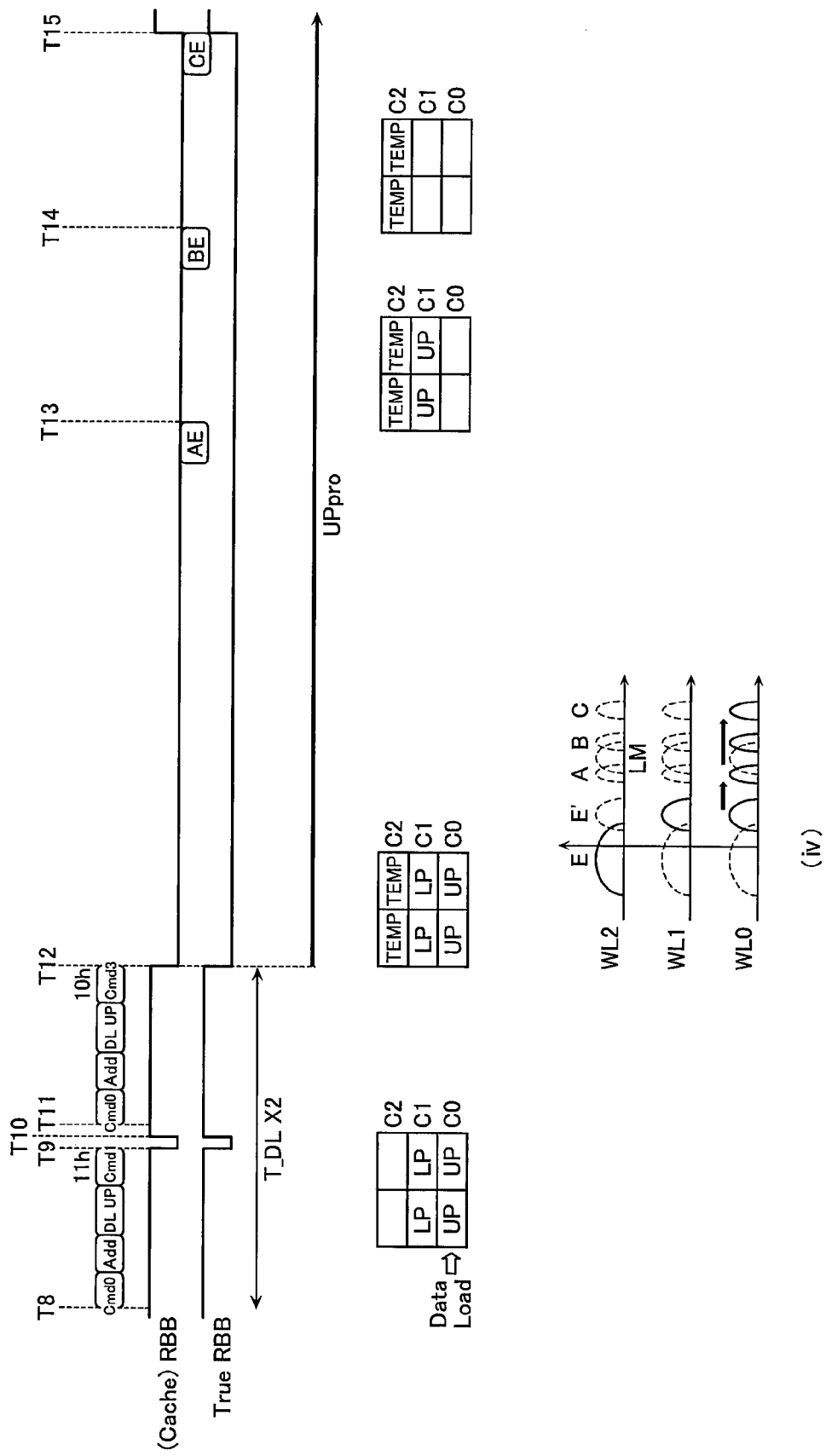
FIG. 18B is a timing chart showing the procedure of the program operation in the fifth embodiment.

Note that in FIG. 18B, the program operation is performed using the command Cmd3 (10h) at time T12. However, the program operation may be performed using the command Cmd2 (15h). In that case, the waveform of the cache RBB changes and the cache RBB becomes "H" at time T13 after the program has been completed to the threshold voltage distribution A.

As described above, this fifth embodiment differs from the aforementioned embodiments in adopting not the "prior-program" scheme of the aforementioned embodiments but the "post-program" scheme. In the "post-program" scheme, subsequent to at least a part of the program operation on the word line WLn subject to program being completed, an E' distribution program operation on the adjacent word line WLn+1 is started. Similar advantages to those of the first embodiment can be obtained even by the procedure of such a "post-program" scheme.

Sixth Embodiment

Next, a nonvolatile semiconductor memory device according to a sixth embodiment is described with reference to FIGS. 19A, 19B, and 19C. The overall configuration is similar to that shown in FIGS. 1-5. Similarly to the fifth embodiment, this embodiment also adopts the "post-program" scheme. In the "post-program" scheme, subsequent to at least a part of the data program operation on the memory cell MCn subject to program being executed, an E' distribution program operation is executed to the memory cell MCn+1 adjacent to this memory cell MCn.

The program operation in the sixth embodiment is described below with reference to FIGS. 19A-19C. FIGS. 19A-19C show the case where the program operation is executed on the word lines WL0 and WL1. Description proceeds assuming that program of the threshold voltage distribution E' to the word line WL0 has already been completed by the E' distribution program ((i) in FIG. 19A).

Figure 19A:
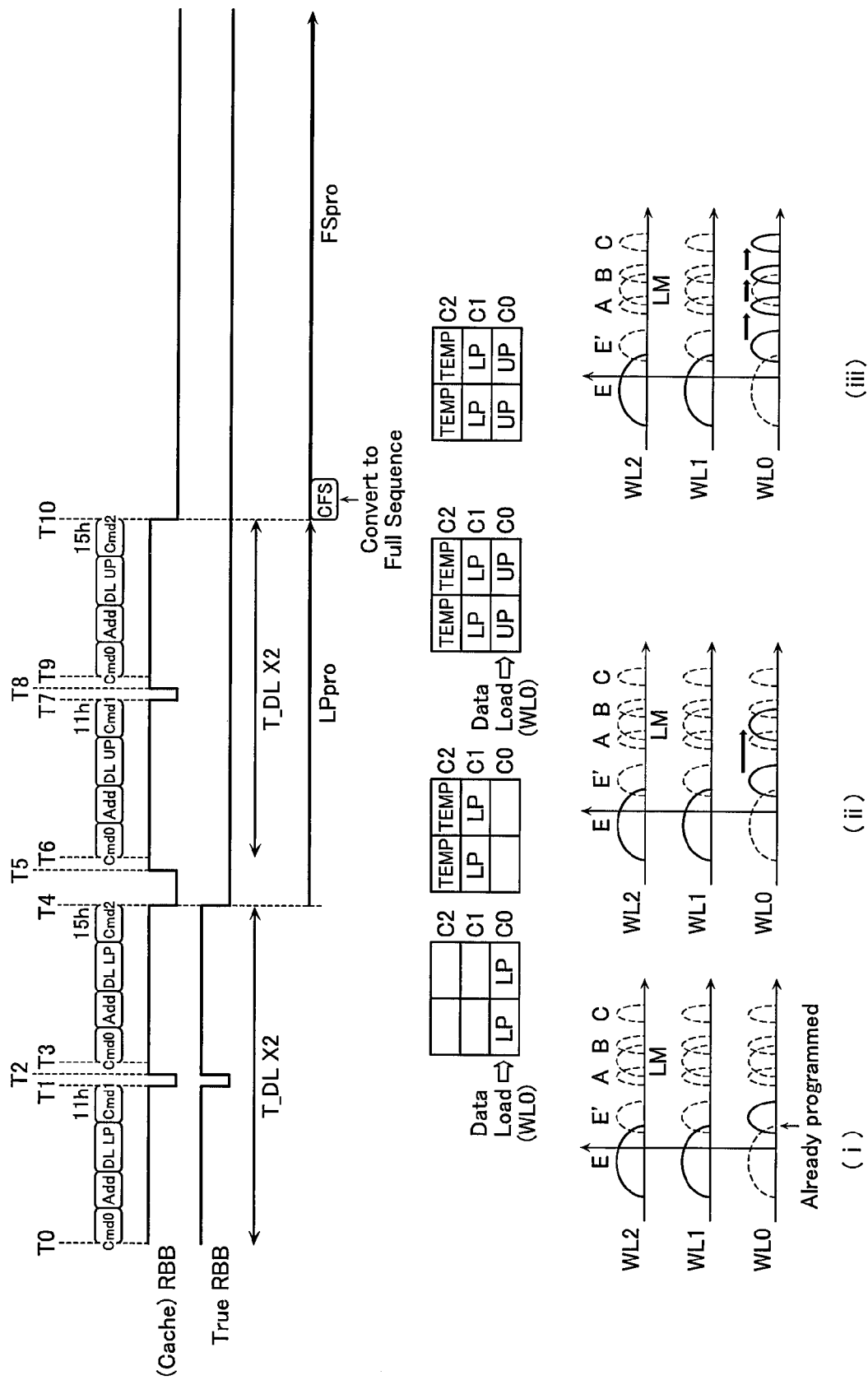
FIG. 19A is a timing chart showing a procedure of a program operation in a sixth embodiment.

FIG. 19A shows the case where, similarly to in the second embodiment, loading of lower page data (LP) and upper page data (UP) to be programmed to the memory cell MC0 formed along the word line WL0 is performed continuously between times T0 and T10 using cache program commands.

At time T4, the cache program command Cmd2 of lower page data (LP) is issued. Hence, lower page data program (LPpro) to the memory cell MC0 is started without waiting for following upper page data (LP) to be stored in the cache memory C0 (arrow in (ii) of FIG. 19A).

Then, at time T10, when upper page data (UP) is stored in the cache memory C0 and the cache program command Cmd2 is issued, the control circuit 15 suspends lower page data program and shifts to the full sequence program operation (FSpro) using both of lower page data and upper page data (arrow in (iii) of FIG. 19A). In such a way, in this embodiment, lower page data program (LPpro) is started first at the point of time when preparation of lower page data only has been completed in the cache memory C0. Then, at the point of time when both lower page data and upper page data have been prepared, the lower page data program operation is suspended, and full sequence program is started.

When this full sequence program to the word line WL0 progresses and program to the threshold voltage distribution A is completed at time T11, for example, lower page data (LP) is no longer necessary. Hence lower page data (LP) is abandoned from the cache memory C1, and in place of this abandoned lower page data (LP), upper page data (UP) is transferred to the cache memory C1, whereby the cache memory C0 becomes able to receive the next data load.

Figure 19B:
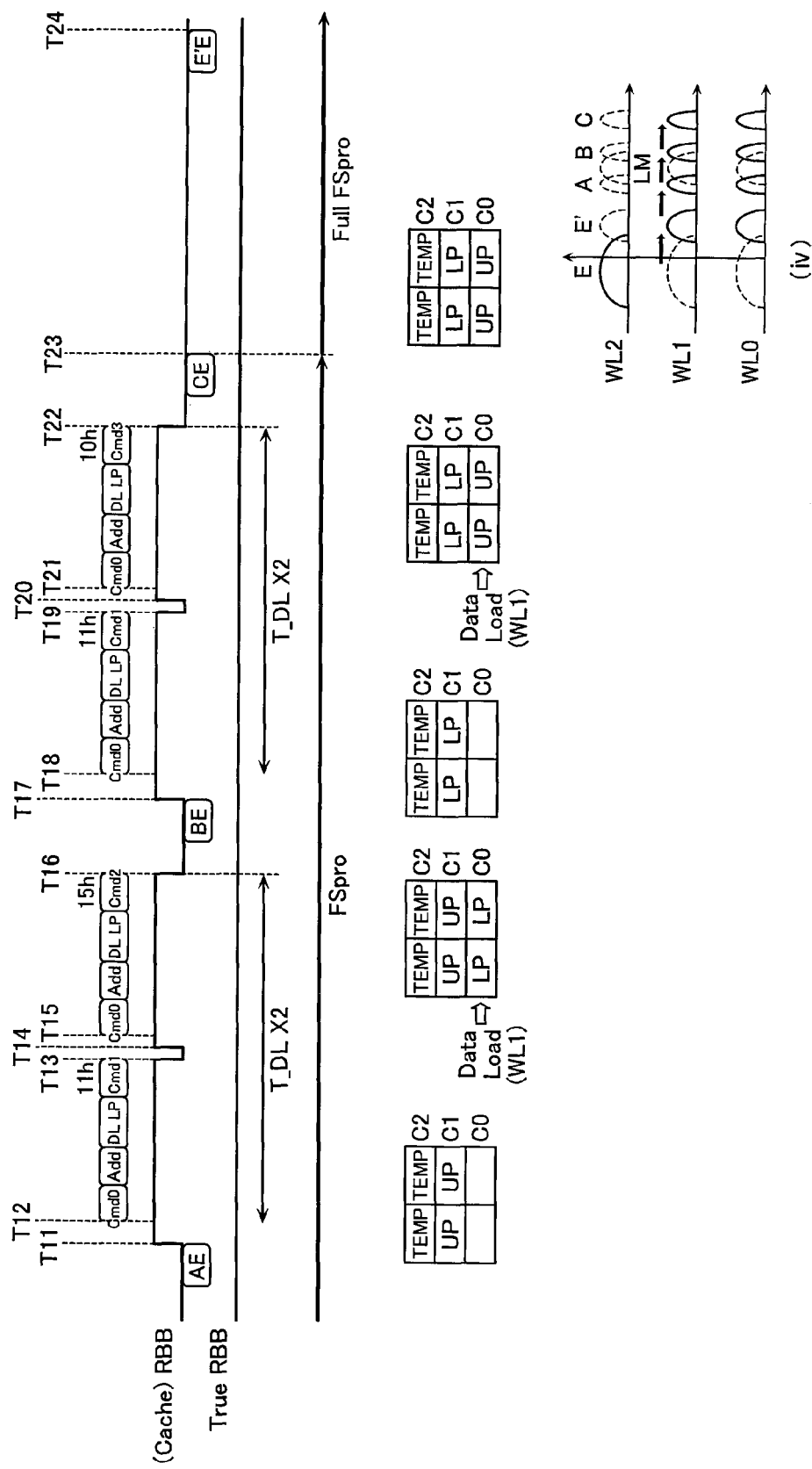
FIG. 19B is a timing chart showing the procedure of the program operation in the sixth embodiment.

As shown in FIG. 19B, when the cache memory C0 attains a state where data load is possible at time T11, lower page data (LP) to be programmed to the adjacent word line WL1 is loaded into the cache memory C0 via the input/output circuit 16. When the cache program command Cmd2 (15h) is issued at time T16, the cache RBB becomes "L" until time T17 when program to the threshold voltage distribution B is completed, since the cache memories C0 and C1 are in an occupied state.

At time T17, when the upper page data program operation on the word line WL0 is completed to the threshold voltage distribution C, upper page data (UP) of the word line WL0 is abandoned from the cache memory C1. Then, in place of this abandoned upper page data (UP), lower page data (LP) for the word line WL1 stored in the cache memory C0 is transferred from the cache memory C0 to the cache memory C1. As a result, data load to the cache memory C0 becomes possible. Hence, from time T18 after the cache RBB has become "H", upper page data (UP) for the word line WL1 is loaded via the input/output circuit 16, and at time T22 the cache program command Cmd2 (15h) is issued.

In this way, lower page data (LP) and upper page data (UP) for writing to the memory cell MC1 formed along the word line WL1 is stored in the cache memories C0 and C1, respectively. As shown in FIG. 19B, when the program operation on the memory cell MC0 formed along the word line WL0 is all completed to the threshold voltage distribution C at for example time T23, the control circuit 15 starts the program operation on the memory cell MC1 formed along the word line WL1. In the case of the present embodiment, at time T23, the E' distribution program operation on the memory cell MC1 formed along the word line WL1 has not yet been executed. Hence, in the present embodiment, from time T23, the E' distribution program operation to program the threshold voltage distribution E' is not independently executed but omitted. In place of this, a full sequence program is performed (Full FSpro in FIG. 19B). The full sequence program performs a program continuously with respect to all threshold voltage distributions including the threshold voltage distribution E'. In other words, in this full sequence program, control is executed to omit the independent E' distribution program operation and program from the threshold voltage distribution E to the threshold voltage distributions E' to C at one time in accordance with acquired lower page data and upper page data.

Figure 19C:
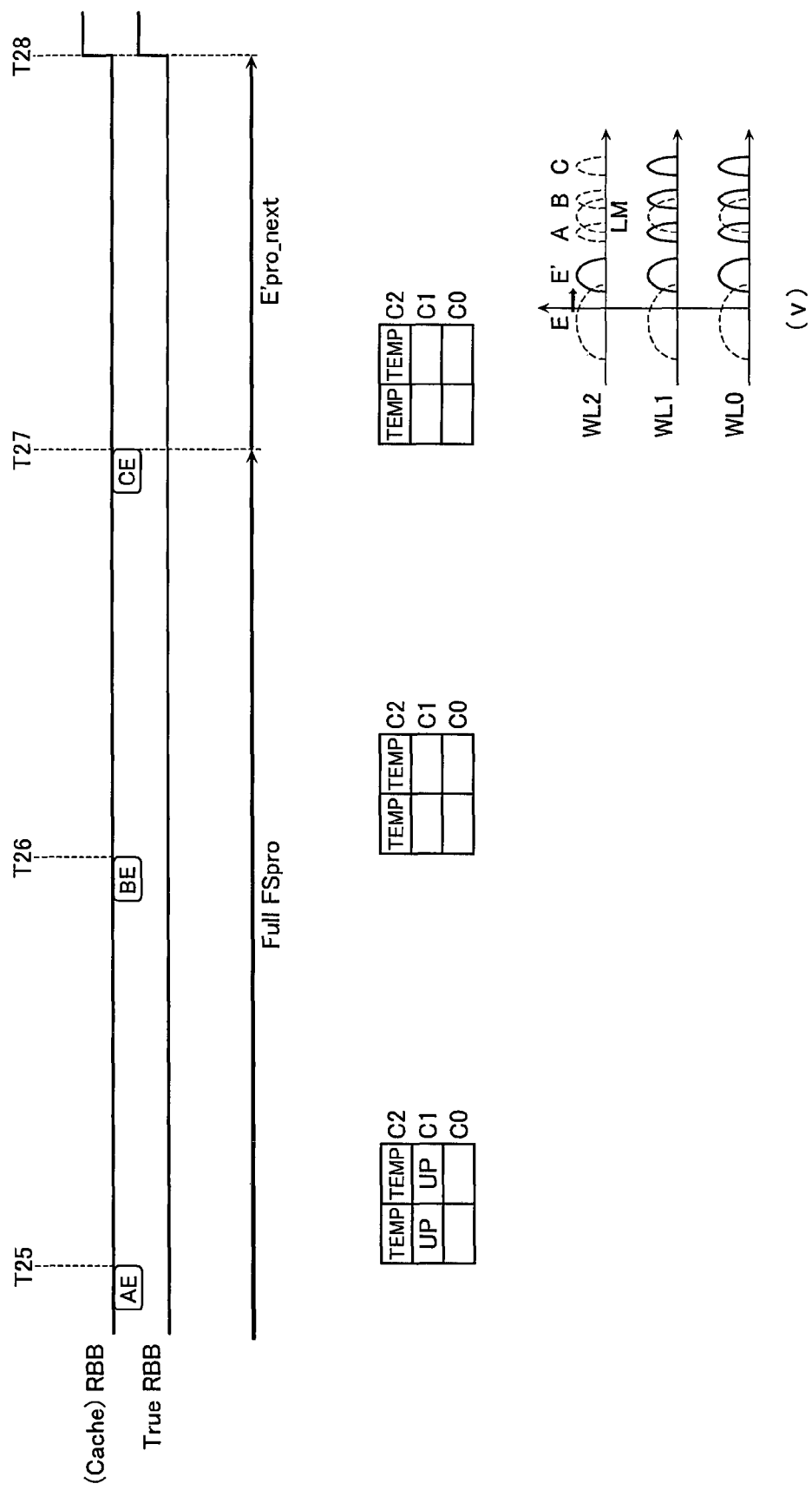
FIG. 19C is a timing chart showing the procedure of the program operation in the sixth embodiment.

As shown in FIG. 19C, the full sequence program including the E' distribution program (the full sequence program operation omitting an independent E' distribution program operation) on the memory cell MC1 is completed at time T27. Then, following this at time T27, the E' distribution program operation is executed to the memory cell MC2 formed along the word line WL2 ((v) in FIG. 19C). This makes it possible to avoid a change in retained data in the memory cell MC1.

Note that at time T22 in FIG. 19B, when the program execute command is Cmd2 (15h) rather than Cmd3 (10h), control is exercised such that the cache RBB becomes "H" as soon as data load to the cache memory becomes possible. Thereby, following data load and program commands can be received.

The present embodiment differs from the fifth embodiment shown in FIGS. 18A-18B, in terms of operation control as viewed from outside of the chip, in a timing at which program of upper page data to the memory cell MC0 formed along the word line WL0 is started. However, in the present embodiment (FIGS. 19A-19C), the cache program execute command Cmd2 (15h) of upper page data is issued during (time T10) the lower page program operation (LPpro). Hence, while the E' distribution program operation (E'pro_next) on the memory cell MC1 is performed after the lower page data program operation (LPpro) on the memory cell MC0 in FIG. 18A, the E' distribution on the memory cell MC1 is postponed to after the upper page program (UPpro) on the memory cell MC0, in FIGS. 19A-19C. As a result, the lower page program operation on the memory cell MC0 is substituted by the high-efficiency full sequence program that programs the lower page and upper page simultaneously (time T10). In addition, the postponed E' distribution program operation to the memory cell MC1 is performed continuously along with program of lower page data and upper page data to the same memory cell MC1 for which data load has been performed without wasting time by effectively utilizing the cache program mechanism.

The present embodiment allows similar advantages to those of the above-described embodiments to be obtained. In addition, the present embodiment makes it possible to perform a continuous program incorporating (including) the E' distribution program within the full sequence program of data program, thereby allowing program time to be further reduced.

Seventh Embodiment

Figure 20A:
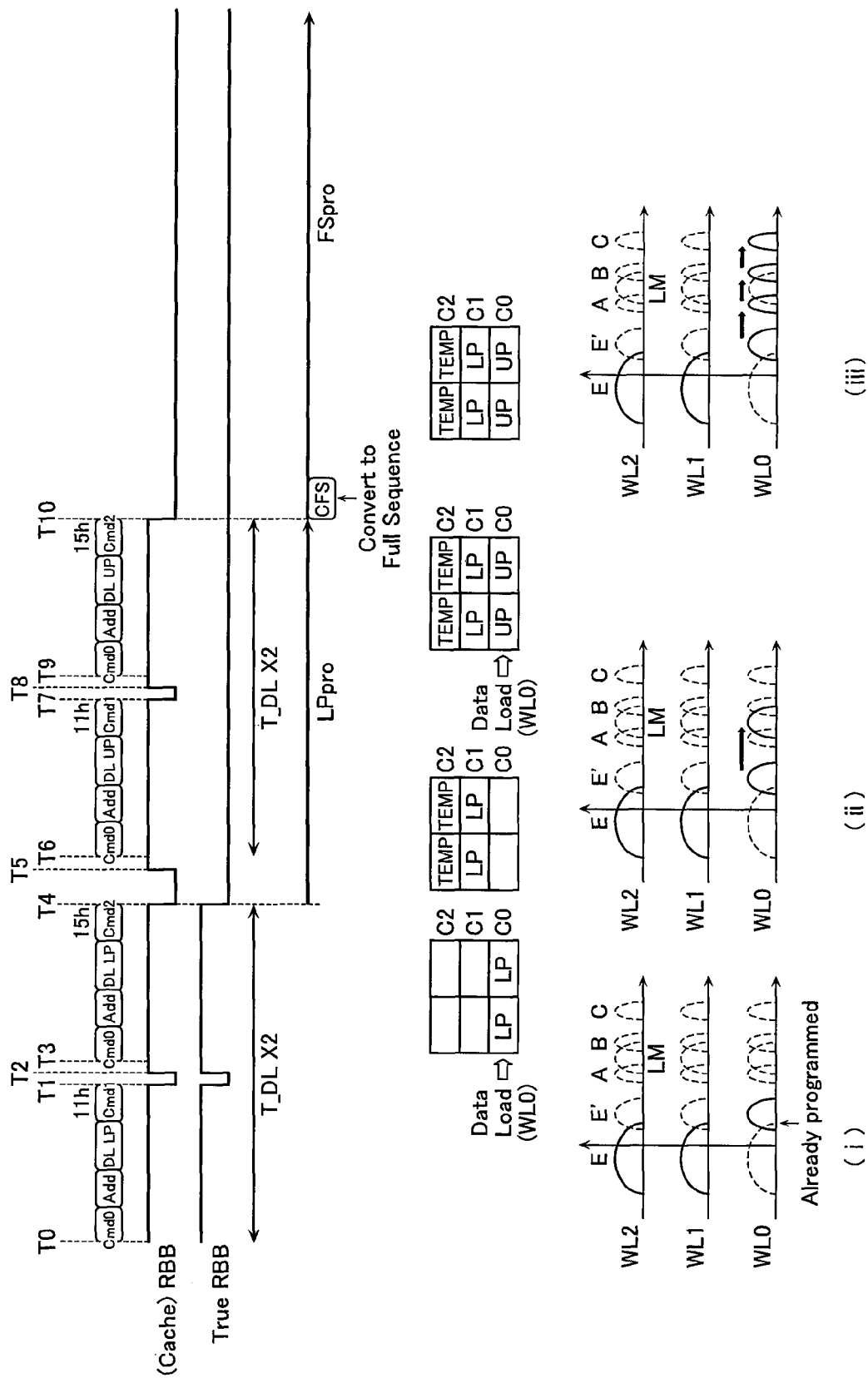
FIG. 20A is a timing chart showing a procedure of a program operation in a seventh embodiment.
Figure 20B:
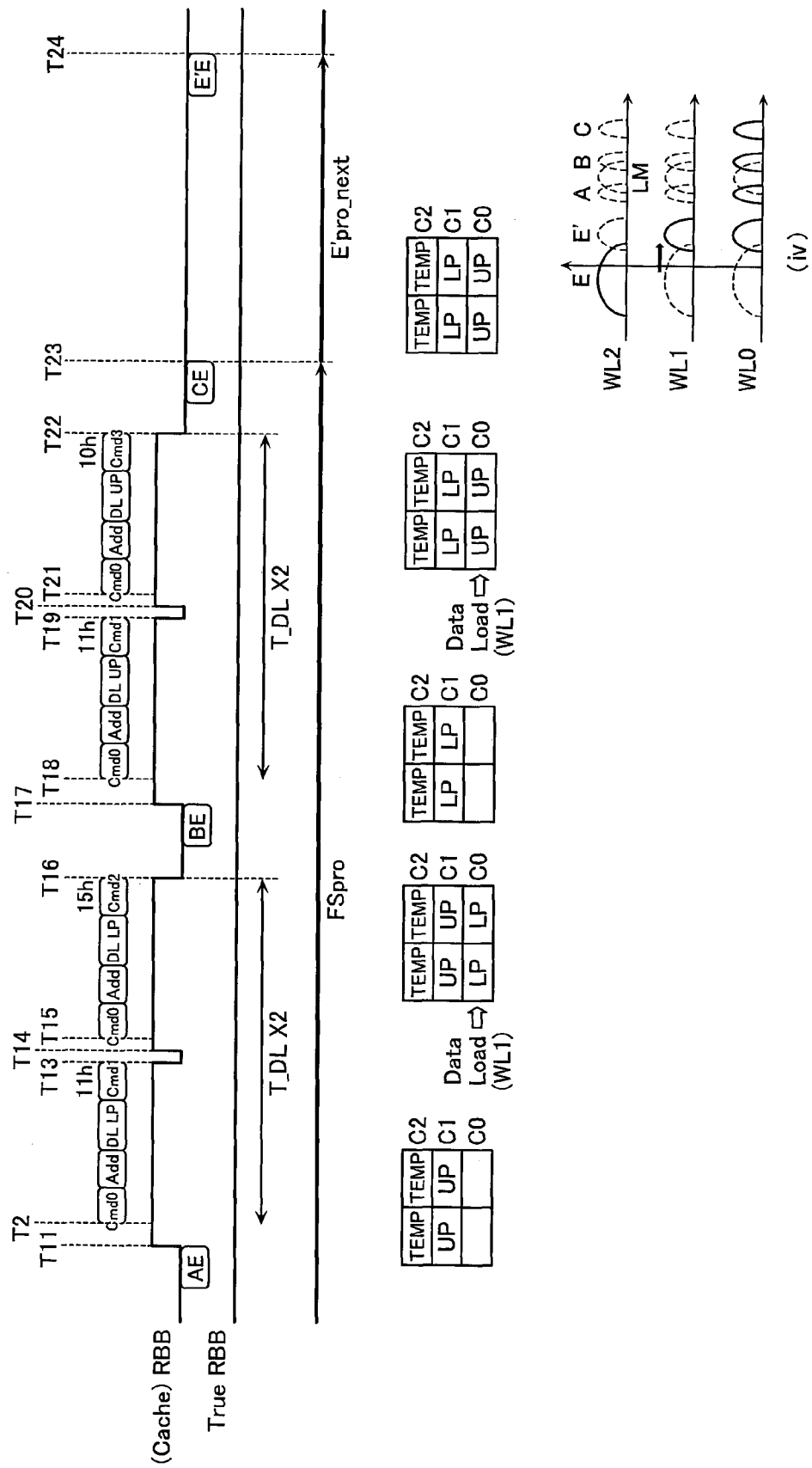
FIG. 20B is a timing chart showing the procedure of the program operation in the seventh embodiment.
Figure 20C:
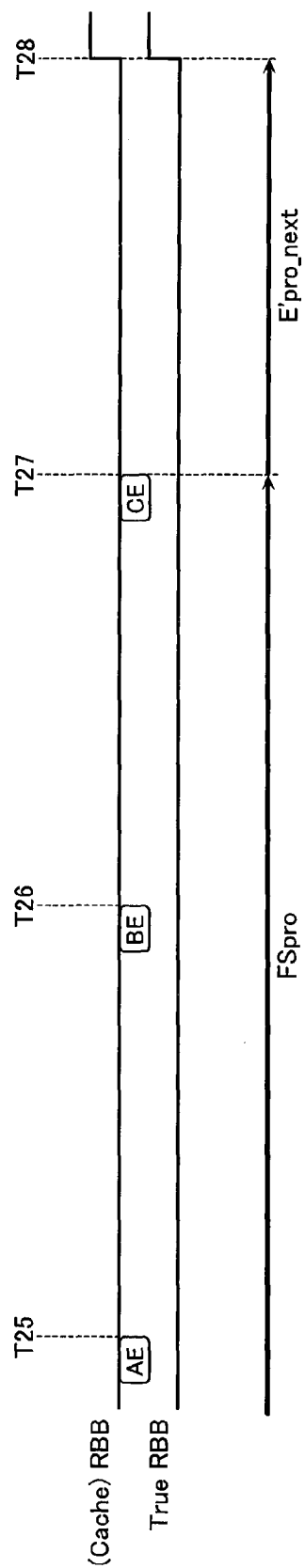
FIG. 20C is a timing chart showing the procedure of the program operation in the seventh embodiment.
Figure 20C:

Next, a nonvolatile semiconductor memory device according to a seventh embodiment is described with reference to FIGS. 20A, 20B, and 20C. The overall configuration is similar to that shown in FIGS. 1-5. Similarly to the sixth embodiment, this embodiment also adopts the "post-program" scheme. In the "post-program" scheme, subsequent to at least apart of the data program operation on the memory cell MCn subject to program being executed, an E' distribution program operation is executed to the memory cell MCn+1 adjacent to this memory cell MCn.

The program operation in the seventh embodiment is described below with reference to FIGS. 20A-20C. Operation to time T23 is substantially similar to that in the sixth embodiment. The seventh embodiment differs from the sixth embodiment in that, in the seventh embodiment, after time T23, the E' distribution program operation (E'Pro_next) is executed to the memory cell MC1 formed along the word line WL1, and after completion of this E' distribution program operation, the full sequence program based on lower page data and upper page data is executed. In the case of this embodiment, the threshold voltage distribution E' is programmed in a separate process to that of the threshold voltage distributions A, B, and C Hence, compared to the sixth embodiment, distribution width of the threshold voltage distribution E' can be controlled independently to those of the threshold voltage distributions A, B, and C. The threshold voltage distribution E' can have its distribution width broadened compared to those of the threshold voltage distributions A, B, and C. Hence, a voltage control method capable of fast program completion can be uniquely adopted. As a result, time required for the program operation can be reduced overall.

Eighth Embodiment

Next, a nonvolatile semiconductor memory device according to an eighth embodiment is described. The overall configuration is similar to that shown in FIGS. 1-5. Moreover, in the eighth embodiment, an E'distribution program operation is executed, similarly to in FIGS. 10A and 10B in the first embodiment.

Figure 21:
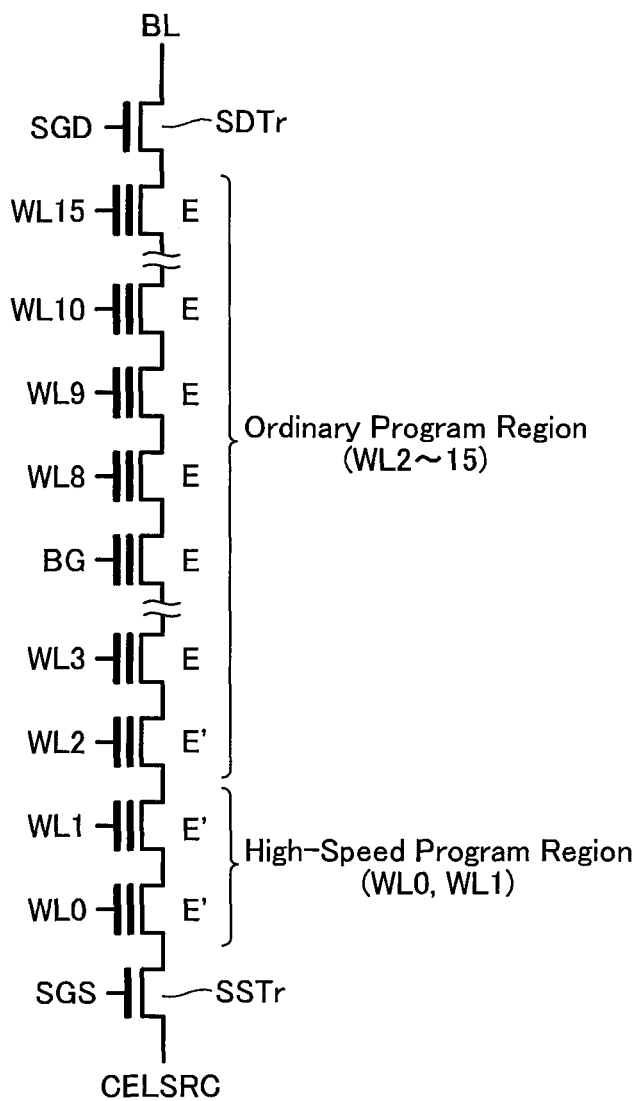
FIG. 21 is a schematic view explaining an ordinary program region and a high-speed program region defined in a memory string MS of an eighth embodiment.

In the nonvolatile semiconductor memory device according to the eighth embodiment, an ordinary program region and a high-speed program region are defined in the memory cell array 11. For example, as shown in FIG. 21, in one memory string MS, the memory cells MC0 and MC1 along the word lines WL0 and WL1 are defined as a high-speed program region (first region), and the memory cells MC2-MC15 along the word lines WL2-WL15 are defined as an ordinary program region (second region). The erase operations performed in the respective regions differ from one another. This will be explained in detail later.

Figure 22:
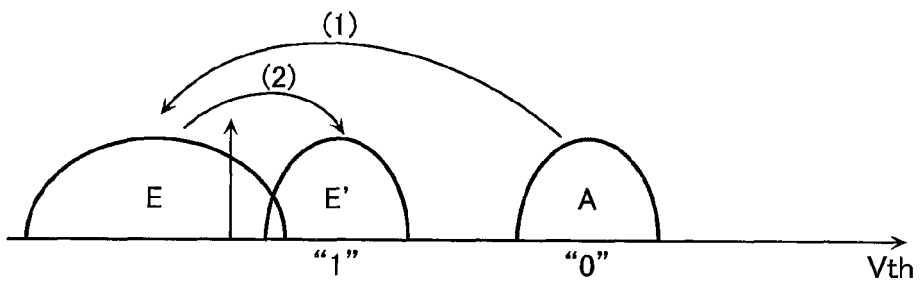
FIG. 22 shows an erase operation executed in, respectively, the ordinary program region and the high-speed program region, in the case where one bit of data is stored in one memory cell MTr.
Figure 23:
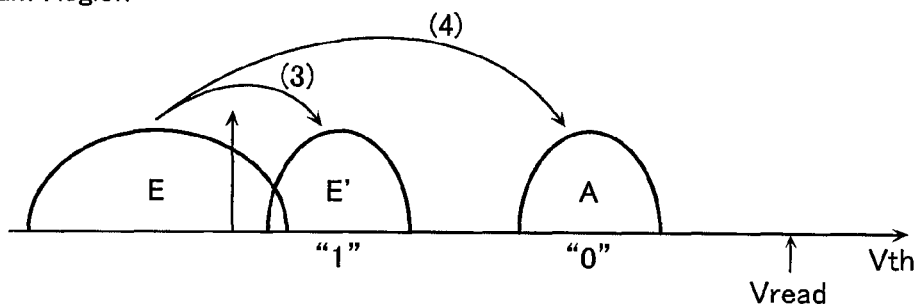
FIG. 23 shows a program operation executed in the ordinary program region, in the case where one bit of data is stored in one memory cell MTr.
Figure 24:
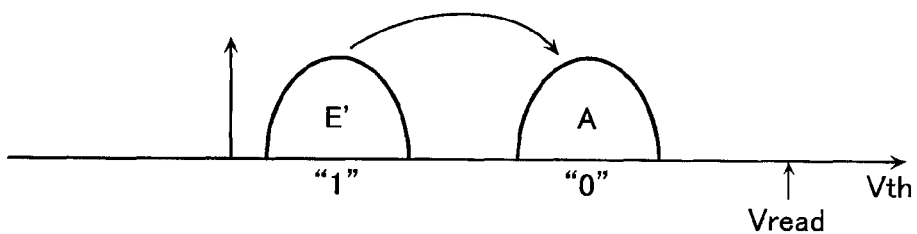
FIG. 24 shows a program operation executed in the high-speed program region, in the case where one bit of data is stored in one memory cell MTr.

FIGS. 22-24 are schematic views explaining differences of the erase operation and program operation in the two program regions. FIGS. 22-24 show an example where one bit of data is stored in one memory cell MTr. Note that two bits of data can also be stored in one memory cell MTr, similarly to in the above-described embodiments.

It is assumed that, after completion of the program operation in the eighth embodiment, either of threshold voltage distribution E' indicating data "1" (erase state) or threshold voltage distribution A indicating data "0" is provided to one memory cell MC. The threshold voltage distribution E' is a distribution obtained by performing an E' program operation on a memory cell having the threshold voltage distribution E obtained by the erase operation. That is, the threshold voltage distribution E is a lower distribution than the threshold voltage distribution E'.

Methods of controlling the program operation and the erase operation in each of the ordinary program region and the high-speed program region are described below. Memory cells in the ordinary program region and memory cells in the high-speed program region are controlled to have equivalent data retention characteristics. That is, programming procedure to set threshold level higher or equal to threshold distribution E' to a memory cell MTri+1 adjacent to a programmed memory cell MTri in the longer direction of the memory string MS is executed subsequent or prior to the data programming to the memory cell MTri.

In this case, in the erase operation in the ordinary program region, the threshold voltage of memory cells having the threshold voltage distribution A and E' is shifted to the threshold voltage distribution E which is the threshold voltage distribution E' or less (operation (1) in FIG. 22). In this erase operation of a stacked type nonvolatile memory, an erase voltage Vera is applied to the cell source CELSRC, and the level of the source side select gate line SGS is controlled to a certain level to cause a GIDL (Gate Induced Drain Current) at a source end of the source side select transistor SSTr. Thereby, the columnar semiconductor layers 58 and 57 are charged by the holes thus generated to raise the voltage of the channel of the memory cell to the erase voltage Vera. On the other hand, a voltage lower than the voltage Vera (for example, ground voltage Vss) is applied to the control gate of the memory cell. By the above control, the erase operation is performed. Now, the unit of the erase operation is the block MB comprising the aforementioned plurality of memory cell units MU. The memory cell units MU in the block MB are erased simultaneously by basically being provided with substantially the same erase voltage Vera and select word line voltage. Since minute control of individual memory cells through bit-by-bit control as performed in the program operation to be described later is not possible, the distribution width of the threshold voltage distribution E subsequent to erase is a broad distribution width reflecting variation in individual memory cells. Hence, it is difficult to set the threshold voltage distribution E to a narrow distribution. This threshold voltage distribution E subsequent to the erase operation corresponds to data "1", but may be regarded as data "1" distribution in an incomplete state.

On the other hand, in the erase operation in the high-speed program region, an E' distribution program operation (operation (2) in FIG. 22) is performed in addition to operation (1). The operation (2) is an operation causing the threshold voltage distribution of the memory cell to change from the threshold voltage distribution E subsequent to the erase operation to the threshold voltage distribution E' having a certain positive value. This positive threshold voltage distribution E' is a distribution obtained by performing the aforementioned E' distribution program operation from the threshold voltage distribution E subsequent to the erase operation to shift the threshold voltage distribution E in a positive direction. This threshold voltage distribution E' is allocated with the erase state (data "1") of the memory cell, and this is the completed form of the threshold voltage distribution of the erase state. Time taken for program of the threshold voltage distribution E' depends on the program method therefor, allocation of threshold voltage distributions, and so on. The time is about 300 μs per page, when binary data program operation is employed as shown in FIG. 22. Therefore, if the erase operation itself of (1) is assumed to take 1.5 ms, then the total of erase time, in the case of two pages of the high-speed program region, reaches 2.4 ms (=1.5 ms+(2+1)*300 μs), and, in the case of ten pages of the high-speed program region, reaches 4.8 ms (=1.5 ms+(10+1)*300 μs). Thus, the erase operation has a longer erase time in the high-speed program region than in the ordinary program region.

The program operation in the ordinary program region is performed by a procedure such as that shown in FIG. 23. Before start of the program operation, almost all of the memory cells in the ordinary program region (WL2-WL15) have the threshold voltage distribution E. A memory cell for which it is desired to program data "1" from this state undergoes execution of a program operation to shift it from the threshold voltage distribution E to E' (operation (3) in FIG. 23) On the other hand, a memory cell for which it is desired to program data "0" from this state undergoes execution of a program operation to shift it from the threshold voltage distribution E to the threshold voltage distribution A (operation (4) in FIG. 23).

Now, FIG. 23 is a view focusing on program of a plurality of memory cells on one selected word line WL. There is no problem when such data program is performed continuously on the plurality of memory cells adjacent in the longer direction of a memory string MS. However, when program is performed for one word line only or when program is performed for the final page of a continuous page program, the threshold voltage of cells adjacent to the programmed memory cell is the threshold voltage distribution E. As previously mentioned, when a memory cell programmed with the threshold voltage distribution E and a memory cell programmed with the threshold voltage distribution A, B, or C are adjacent to each other, data retention characteristics deteriorate leading to a problem of reliability. Hence, in the above-described case, in addition to program of the selected memory cell itself, programming the threshold voltage distribution E' to an adjacent memory cell to the programmed memory cell is required by means of some kind of method. The first to seventh embodiments are examples for programming the threshold voltage distribution E' to the adjacent memory cell.

On the other hand, the program operation in the high-speed program region is performed by a procedure such as that shown in FIG. 24. Before start of the program operation, all of the memory cells in the high-speed program region have the threshold voltage distribution E' which is higher than the threshold voltage distribution E. A memory cell for which it is desired to program data "1" from this state undergoes a program prohibit operation so that threshold voltage distribution E' is maintained. In contrast, a memory cell for which it is desired to program data "0" from this state undergoes execution of a program operation to shift it from the threshold voltage distribution E' to the threshold voltage distribution A. Since program operation procedure including programming the threshold voltage from E to E' and verifying threshold voltage for E' is not required for the memory cell for which it is desired to program data "1", speed of the program operation is faster in the case of FIG. 24 than in the case of FIG. 23. That is, the program operation in the high-speed program region has a small number of threshold voltage distributions to be obtained compared to the program operation in the ordinary program region (one in the former, two in the latter). Hence, program speed in the high-speed program region is improved by approximately a factor two.

Figure 25:
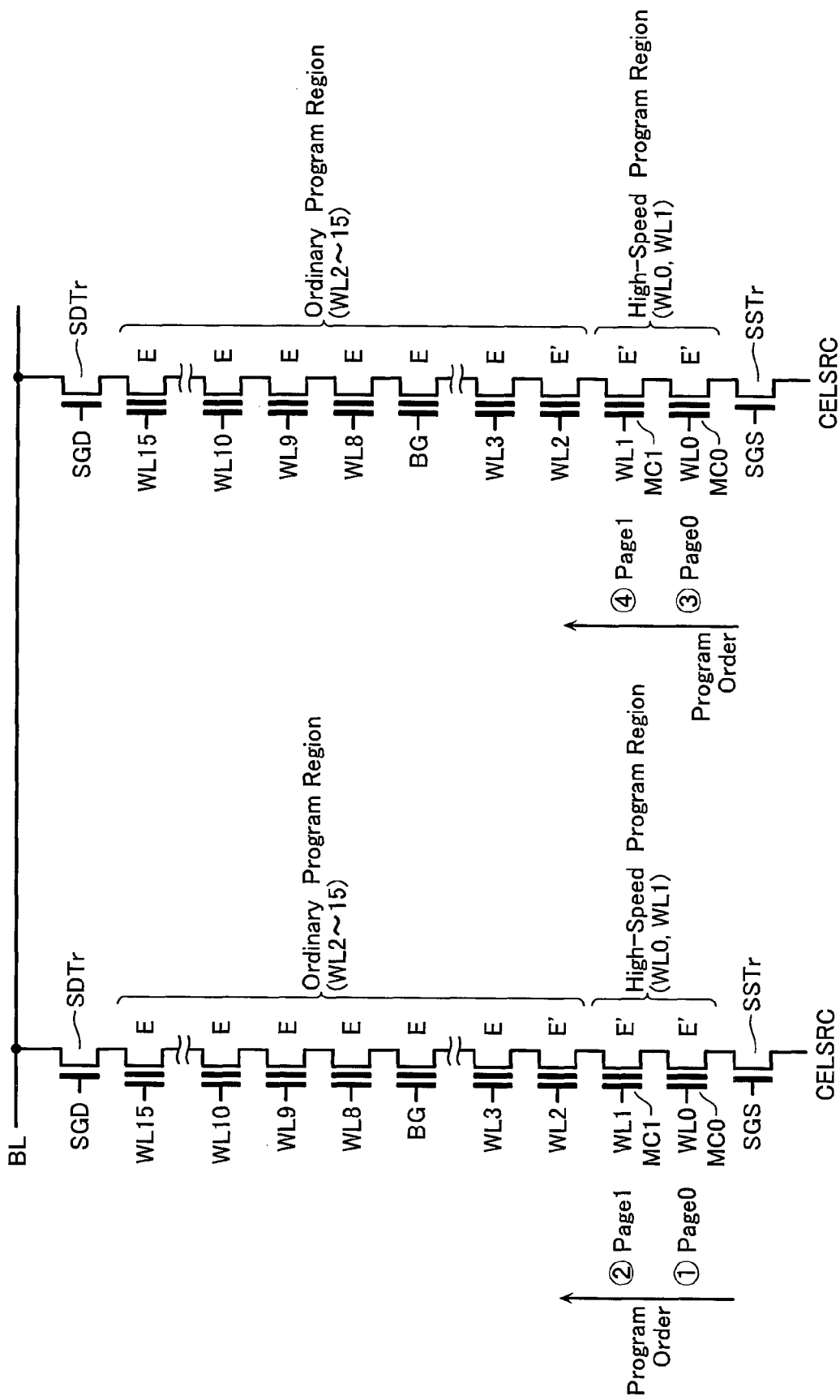
FIG. 25 shows the program operation executed in the high-speed program region, in the case where one bit of data is stored in one memory cell MTr.

Note that the program operation to the memory string MS selects the memory cell MC0 on the source line CELSRC side as the first program cell and is thereafter executed in an order that executes program sequentially in an order approaching the bit line BL, similarly to in a conventional NAND type flash memory. As described above, in the case where one bit of data is stored in one memory cell, the data stored in the plurality of memory cells MC along one word line WLi (i=0-15) configures one page. one page is allocated with one page data. In the present embodiment, as shown in FIG. 25, the plurality of memory cells MC0 along the word line WL0 corresponding to the high-speed program region in one memory string MS configure one page PAGE0. Similarly, the plurality of memory cells MC1 along the word line WL1 configure one page PAGE1. As shown in FIG. 25, when program is performed selecting only the high-speed program region, page selection is made according to the program order in each of the memory strings MS, subsequently, an appropriate address input is performed to select another memory string and similarly perform page selection of the high-speed program region.

Note that the plurality of memory cells MC2 along the word line WL2 are present in the ordinary program region (WL2-WL15) and are adjacent to the high-speed program region (WL0-WL1). These memory cells MC2 differ from the other memory cells MC3-MC15 in the ordinary program region (are similar to the memory cells MC0 and MC1 in the high-speed program region) in being subject to the E' distribution program operation from the threshold voltage distribution E subsequent to the erase operation to the threshold voltage distribution E'. The reason why the memory cells MC2 must be programmed with the threshold voltage distribution E' during the erase operation, even though they are in the ordinary program region is as follows. In the high-speed program region, it is required that whichever word line is selected during program, the E' distribution program from the threshold voltage distribution E to E' in the memory cells along the neighboring word line is rendered unnecessary. This is because, if such a program becomes necessary, program speed in the high-speed program region falls. As previously mentioned, the memory cell neighboring the memory cell that has undergone data program must have the threshold voltage distribution E' not E to improve data retention characteristics. However, when making a program to the memory cell MChe at the end of the high-speed program region, if the adjacent memory cell MCne in the ordinary program region has the threshold voltage distribution E, then, as a result, it also becomes necessary to perform the E' distribution program operation from the threshold voltage distribution E to E' in the memory cell MCne, along with data program to the memory cell MChe in the high-speed program region. This will result in program speed in the high-speed program region falling. Hence, in the erase operation in the memory cell MCne, the E' distribution program operation to change the threshold voltage distribution E to E' is executed.

A position and range on the address space of this high-speed program region is set to give the greatest improvement in performance of the memory system including the memory controller using this nonvolatile memory device. Accordingly, the high-speed program region may be a certain one page only (leading page, final page, or a certain page) within a block, or may be a region of certain successive pages (certain number of pages from leading page, certain number of pages from final page, or certain number of pages from certain page). There is, for example, a memory control method in which, when erasing a block, a flag indicating the block as an erasable block is programmed without actually performing an erase operation. In this way, when there is no need for data size to be large, but it is desired to quickly and reliably program certain memory access information, a small region of high-speed program region setting the above-described leading page or final page can be effectively utilized. In the high-speed program region, the threshold voltage distribution E' is programmed beforehand including also to an adjacent cell of an boundary cell of the high-speed program region. Hence, there are merits that reliability, particularly of data retention characteristics, is satisfied and that program is faster than in the ordinary region.

In addition, by setting the high-speed program region to a desired size, the high-speed program region may for example be utilized as a data buffer region for writing temporarily in the memory cell array with high throughput.

Figure 26:
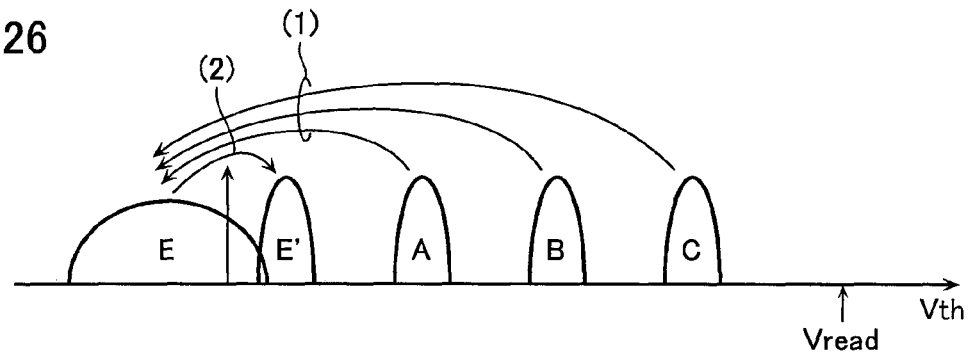
FIG. 26 shows an erase operation executed in, respectively, the ordinary program region and the high-speed program region, in the case where two bits of data are stored in one memory cell MTr.
Figure 27:
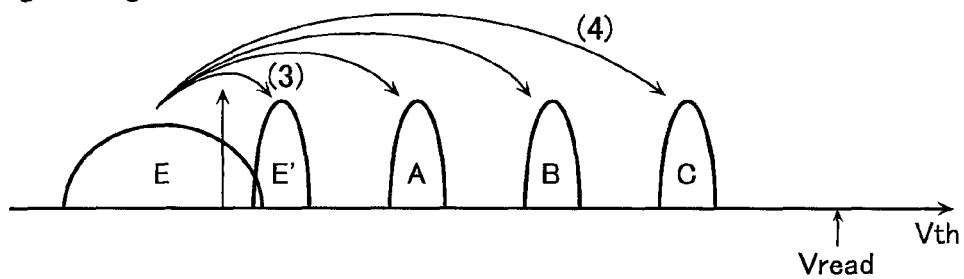
FIG. 27 shows a program operation executed in the ordinary program region, in the case where two bits of data are stored in one memory cell MTr.
Figure 28:
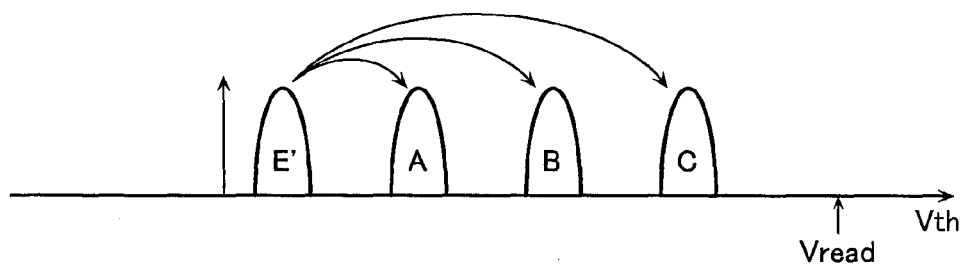
FIG. 28 shows a program operation executed in the high-speed program region, in the case where two bits of data are stored in one memory cell MTr.

FIGS. 22-24 describe an example where one bit (two-level) data is stored in one memory cell, but a similar operation is executable also in the case where two bits or more of data are stored in one memory cell. FIGS. 26-28 show conceptually an erase operation and a program operation in the ordinary program region and the high-speed program region in the case where two bit (four level) data is stored in one memory cell.

After completion of the program operation, any one of the threshold voltage distributions E', A, B, and C is provided to one memory cell. The threshold voltage distribution E' corresponds to the two-bit data "11" (erase state), and the threshold voltage distributions A, B, and C correspond to for example data "10", "01", and "00", respectively.

In this case, in the erase operation in the ordinary program region, as shown in FIG. 26, an erase operation is executed until the threshold voltage of a memory cell having the threshold voltage distributions E', A, B, or C becomes the threshold voltage E which is the threshold voltage distribution E' or less (operation (1) in FIG. 26). On the other hand, in the erase operation in the high-speed program region, an E' distribution program operation (operation (2) in FIG. 26) is performed in addition to operation (1) This operation (2) is an operation that shifts the threshold voltage distribution E to the threshold voltage distribution E' having a certain positive value.

The program operation in the ordinary program region is performed by a procedure such as that shown in FIG. 27. Before start of the program operation, all of the memory cells in the ordinary program region have the threshold voltage distribution E which is the threshold voltage distribution E' or less. A memory cell for which it is desired to program data "11" from this state undergoes execution of a program operation to shift it from the threshold voltage distribution E to E' (operation (3) in FIG. 27). On the other hand, a memory cell for which it is desired to program data "10", "01", or "00" from this state undergoes execution of a program operation to shift it from the threshold voltage distribution E to the threshold voltage distribution A, B, or C (operation (4) in FIG. 27).

In addition, as aforementioned, programming the threshold distribution E' is necessary for an adjacent cell to the programmed cell in the ordinary region.

On the other hand, the program operation in the high-speed program region is performed by a procedure such as that shown in FIG. 28. Before start of the program operation, all of the memory cells in the high-speed program region already have the threshold voltage distribution E'. A memory cell for which it is desired to program data "11" from this state undergoes a program prohibit operation so that threshold voltage distribution E' is maintained. In contrast, a memory cell for which it is desired to program data "10", "01", or "00" from this state undergoes execution of a program operation to shift it from the threshold voltage distribution E' to the threshold voltage distribution A, B, or C. Since program operation procedure including programming the threshold voltage from E to E' and verifying threshold voltage for E' is not required for the memory cell for which it is desired to program data "11", speed of the program operation is faster in the case of FIG. 28 than in the case of FIG. 27. That is, the program operation in the high-speed program region has a small number of threshold voltage distributions to be obtained compared to the program operation in the ordinary program region (three in the former, four in the latter). Hence, program speed in the high-speed program region is improved by approximately a factor 4/3.

Figure 29:
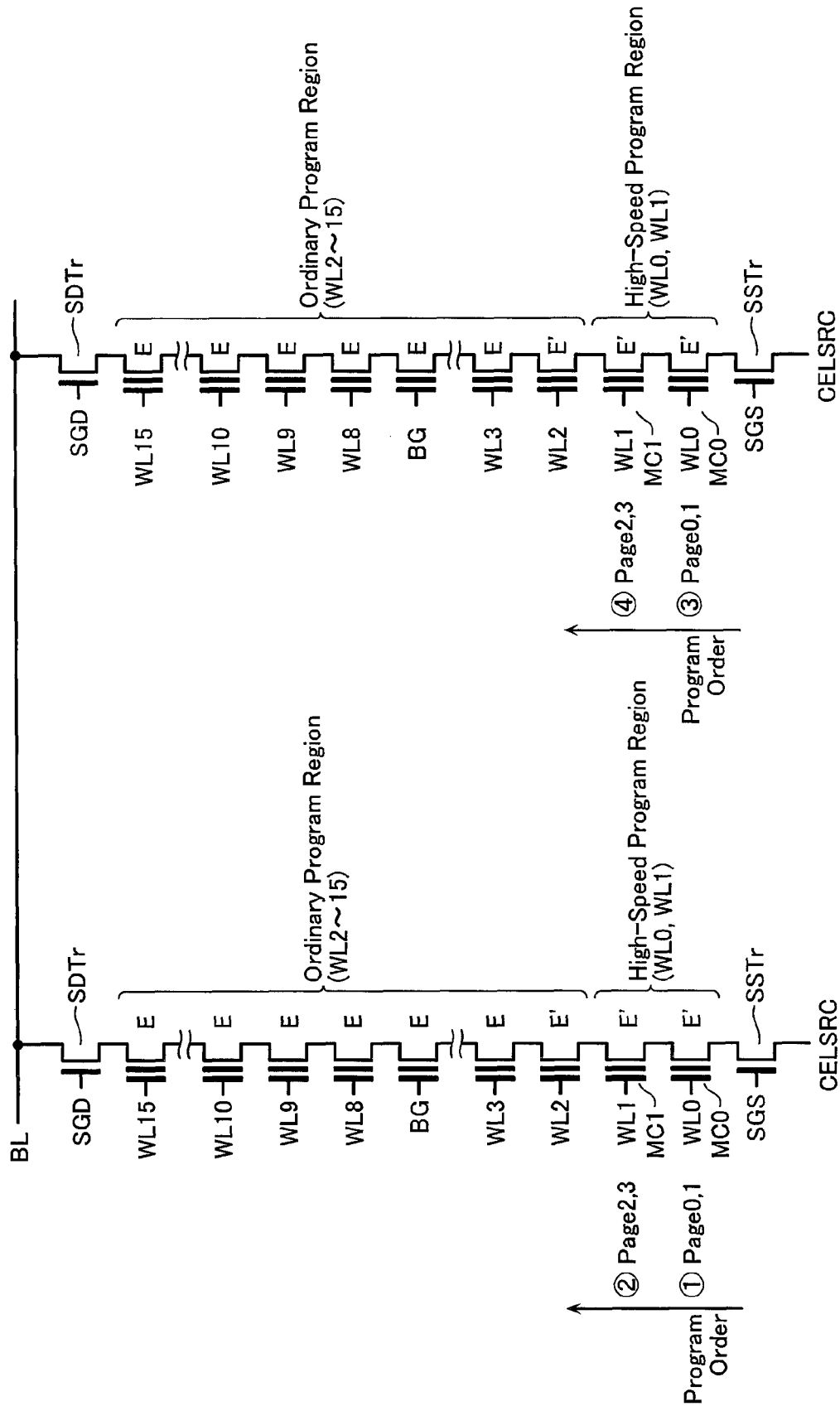
FIG. 29 shows the program operation executed in the high-speed program region, in the case where two bits of data are stored in one memory cell MTr.

Note that in the two bits per cell program operation of the kind shown in FIGS. 27 and 28, data stored in the plurality of memory cells MC1 along one word line WLi (i=0-15) configures two pages. Therefore, as shown in FIG. 29, in the two bits per cell program operation of the kind shown in FIGS. 27 and 28, the plurality of memory cells MC0 along the word line WL0 corresponding to the high-speed program region in one memory string MS configure two pages PAGE0,1. In other word, PAGE0 and PAGE1 correspond to the lower page and the upper page on WL0.

Similarly, the plurality of memory cells MC1 along the word line WL1 configure two pages PAGE2,3, in other words, PAGE2 and PAGE3 correspond to the lower page and the upper page on WL1. These indicate that an address bit to select either of a lower page or a upper page is allocated lower than an address bit to select a word line. In addition, the address bit to select either of a lower page or a upper page can be allocated lower than an address to select a memory string MU.

As shown in FIG. 29, when a program operation is executed continuously on the high-speed program region only, a page address corresponding to a desired block address and certain high-speed program region is specified and accessed.

As described above, the present embodiment is a stacked type nonvolatile semiconductor memory device for performing a one bit per cell storage operation, two bits per cell storage operation or multilevel storage operation of two bits or more. Also, the present embodiment includes a high-speed program region having threshold voltage control that differs from that of an ordinary program region. Thereby, the present embodiment allows high-speed data program to be performed without degrading reliability of data.

Ninth Embodiment

Figure 30A:
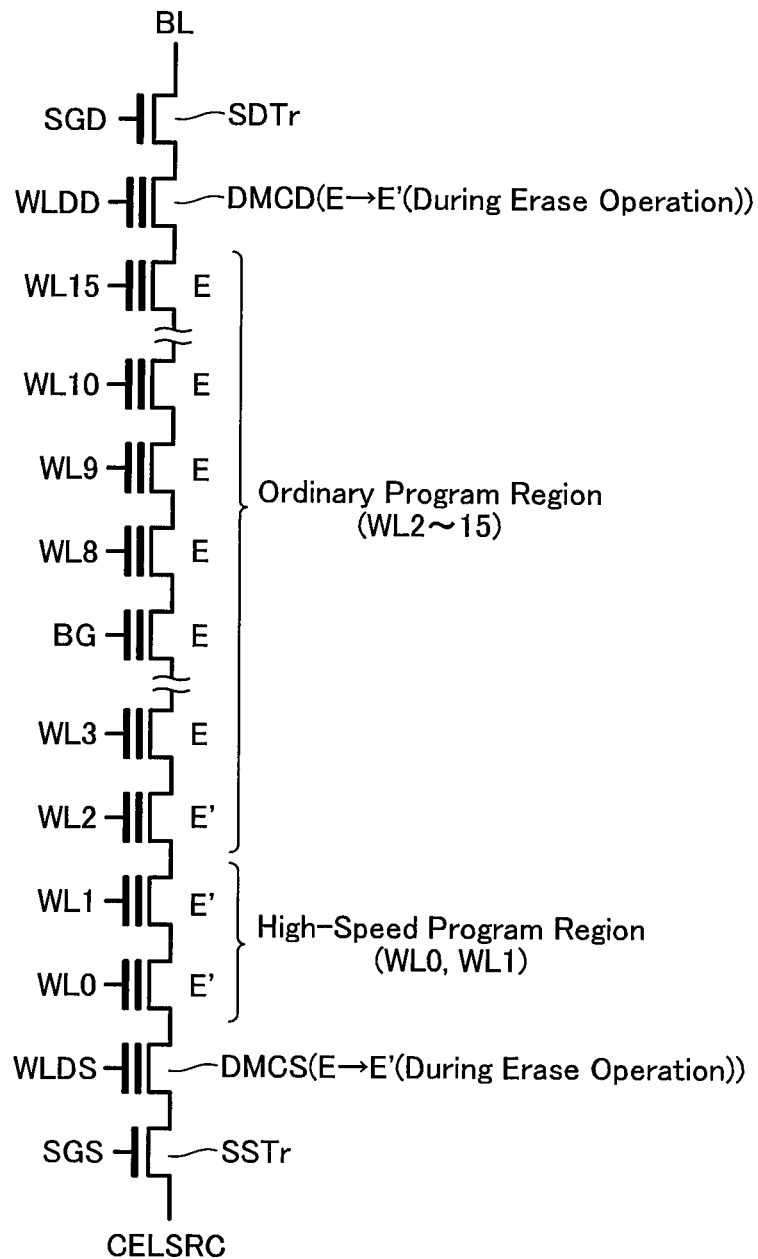
FIG. 30A explains a configuration of a nonvolatile semiconductor memory device according to a ninth embodiment.

Next, a nonvolatile semiconductor memory device according to a ninth embodiment is described with reference to FIGS. 30A and 30B. The overall configuration is similar to that shown in FIG. 1. However, as shown in FIG. 30A, this embodiment further comprises dummy memory cells DMCD and DMCS between one end of the memory string MS and the drain side select transistor SDTr or the source side select transistor SSTr. The dummy memory cells DMCD and DMCS both have an identical structure to the memory cell MC but are not employed in storage of data. Dummy word lines WLDD and WLDS are connected to gates of the dummy memory cells DMCD and DMCS. In other respects, the ninth embodiment is similar to the first embodiment.

Figure 30B:
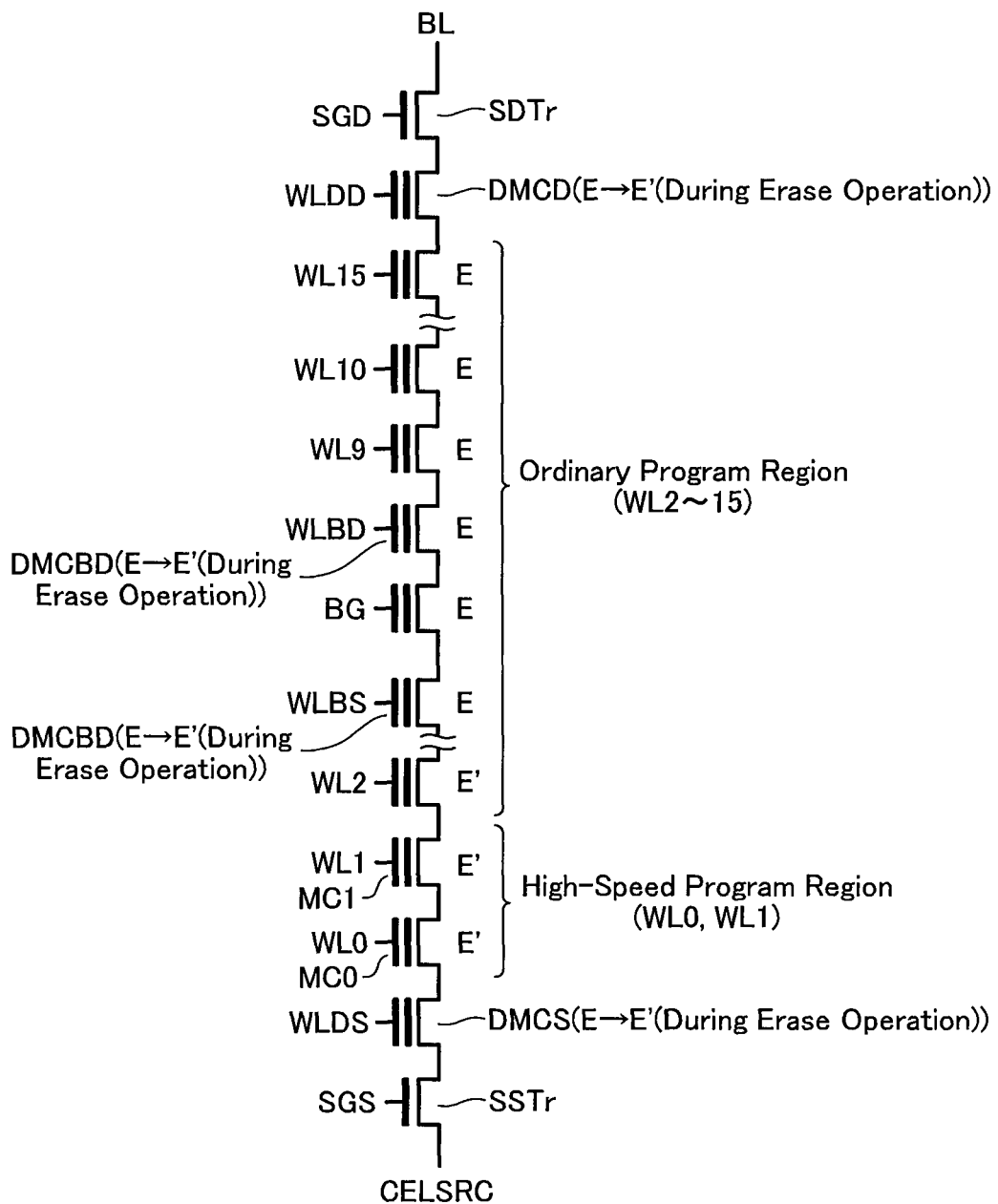
FIG. 30B explains a configuration of the nonvolatile semiconductor memory device according to the ninth embodiment.

In addition, as shown in FIG. 30B, a configuration may be adopted in which cells adjacent to the back gate transistor BTr on its drain side and source side comprise dummy memory cells DMCBD and DMCBS, respectively, and dummy word lines WLBD and WLBS are respectively connected to gates of the dummy memory cells DMCBD and DMCBS. It is assumed that these dummy memory cells also have an identical structure to the memory cell MC but are not employed in storage of data.

There is a chance that during an erase pulse application operation, the dummy memory cells DMCD, DMCS, DMCBD, and DMCBS receive an erase bias similar to that to a memory cell storing data or a certain bias optimized for an erase operation of a memory cell storing data. Therefore, the threshold voltage of the dummy memory cells DMCD, DMCS, DMCBD, and DMCBS may fall to the same level as the threshold voltage distribution E subsequent to the erase operation. However, the dummy memory cells DMCD, DMCS, DMCBD, and DMCBS undergo an E' distribution program operation during the erase operation similarly to in the high-speed program region, and are thereby controlled such that their threshold voltage attains the same level as the distribution E'. This results in the charge storage film in the dummy cell transistors DMCD, DMCS, DMCBD, and DMCBS being controlled to have almost no holes present. Doing this prevents holes retained in the charge storage film of the dummy cell transistors flowing out to cancel out with electrons retained in the charge storage film of an adjacent memory cell MC. Therefore, data retention characteristics of data storing memory cells is improved even when dummy cells are inserted in the memory unit.

Tenth Embodiment

Next, a nonvolatile semiconductor memory device according to a tenth embodiment is described with reference to FIG. 31. The overall configuration is similar to that shown in FIG. 1. Moreover, this embodiment comprises dummy memory cells DMCD and DMCS, and DMCBD and DMCBS similar to in the ninth embodiment.

The feature of the tenth embodiment is that a sub-block which is smaller than the memory block comprises a minimum unit during the erase operation. Moreover, in order to handle an erase operation in sub-block units, disposition of the high-speed program region differs from that in the aforementioned embodiments.

In the eighth and ninth embodiments, one memory block was assumed to be the erase unit. However, in the tenth embodiment shown in FIG. 31, it is assumed that any of four sub-blocks SB0-SB3 is selectable as a minimum erase unit. In addition, in FIG. 31, word lines assigned with the same symbol WLi are assumed to be in a state where they are directly physically connected by sharing of wiring or to be electrically connected even though wiring is not shared.

Figure 31:
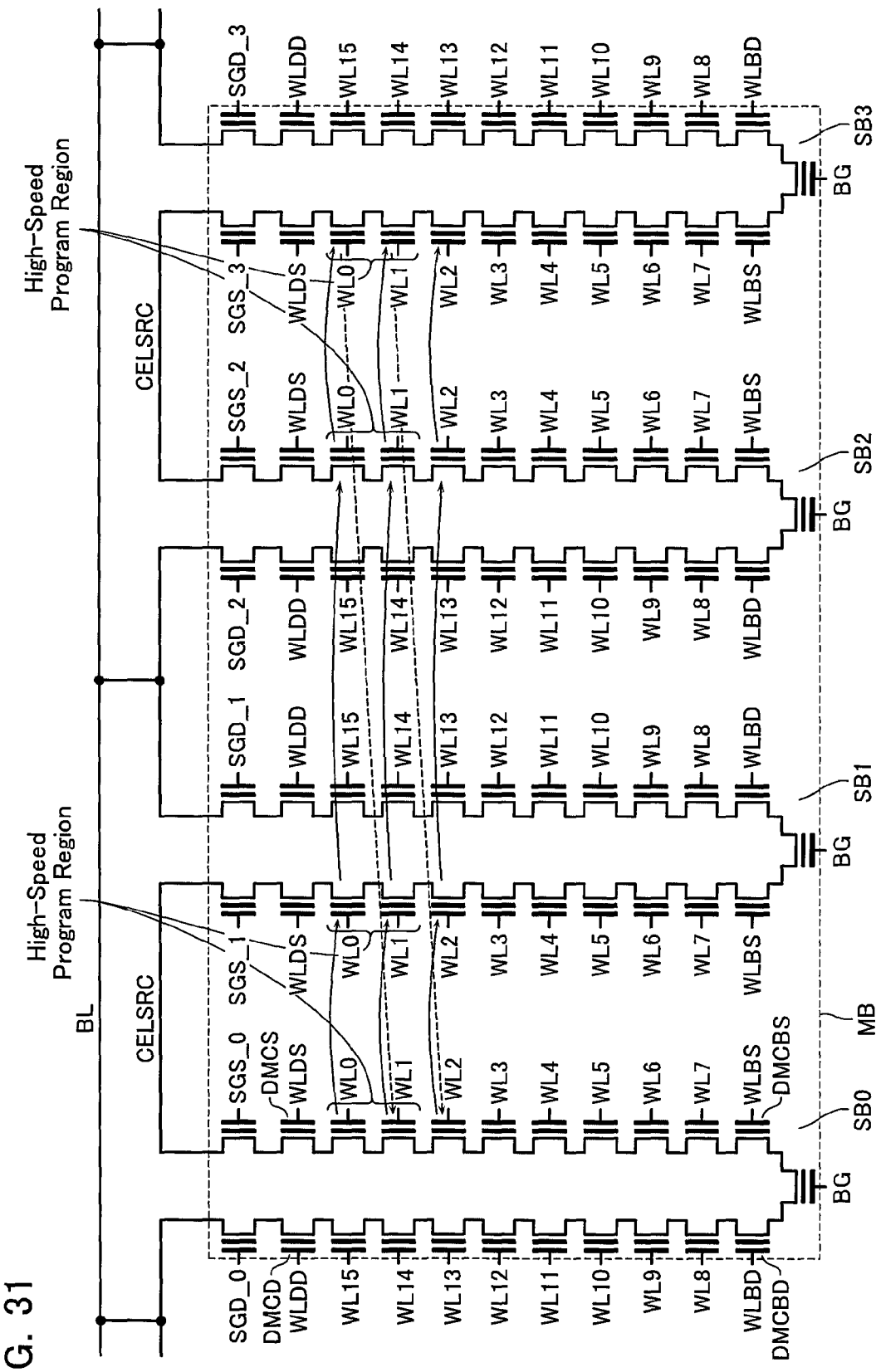
FIG. 31 shows a program operation executed in a high-speed program region in the nonvolatile semiconductor memory device according to the ninth embodiment.

Regarding the select gate lines in FIG. 31, each of the sub-blocks SB0-SB3 includes a unique drain side select gate line SGD_0-SGD_3 and source side select gate line SGS (SGS_0-SGS_3) and is thereby configured to be independently controllable. However, the sub-blocks SB0-SB3 are not limited to such a configuration, and may be configured to share identical select gate lines SGD and SGS, thereby enabling adoption of both individual control of each sub-block and common control, by means of a circuit control method.

In the present embodiment, in order to erase the four sub-blocks SB0-SB3 simultaneously, it becomes necessary that a certain potential for causing a GIDL current for erase is applied simultaneously to the source side select gate lines SGS_0-SGS_3, for example. When a common erase bias is applied to the plurality of sub-blocks SB0-SB3 by such a configuration or control method during the erase operation, the four sub-blocks can be simultaneously erased.

When the sub-block SB is adopted as the minimum erase unit, there is an optimum page address allocation for the erase operation of a sub-block unit, and the high-speed program region is also preferably matched to that page address allocation.

At this time, if program characteristics of memory cells having a NAND string type structure are considered, there are mainly two types of program disturb. One (first program disturb) is stress due to a program pass voltage VPASS in an unselected memory cell in a selected NAND string, and the other (second program disturb) is stress when a selected memory cell attains the program prohibit state ("1" program) during a program operation.

A first program disturb occurs in the following way. First, a voltage (for example, 0 V) is applied to the bit line BL for data program. Then, in order to transfer this 0 V to the channel of a selected memory cell, the control gates of unselected memory cells in the NAND string are applied with the program pass voltage VPASS (for example, 10 V). The first program disturb occurs due to the program pass voltage VPASS and the voltage 0 V applied to the channel.

Moreover, a second program disturb occurs in the following way. When the selected memory cell is in the program prohibit state from the start or switches from a program state to the program prohibit state during the course of the program operation, the control gate of the selected memory cell is applied with a program voltage VPGM (for example, 20 V). The channel of the selected NAND string, after being charged to for example a power supply voltage Vdd, is set to a floating state by the drain side select gate transistor SDTr being cut off. When the program pass voltage VPASS is applied to unselected word lines in the selected NAND string, this voltage VPASS causes the potential of the channel which is in the floating state to rise. When the rise in potential of the channel is insufficient, a potential difference between the control gate and the channel becomes large. Consequently, the program disturb occurs by the potential difference.

Optimization of the program pass voltage VPASS is required in both the first program disturb and second program disturb, an upper limit of the program pass voltage VPASS being determined by the first program disturb, and a lower limit of the program pass voltage VPASS being determined by the second program disturb.

Furthermore, characteristics of program disturb also vary greatly according to the program state of data in the NAND string. In view of second program disturb in the NAND string in the program prohibit state, channel potential in the NAND string is preferably raised efficiently as high as possible. To do so, it is preferable for as many as possible of the memory cells to be in an erase state when the program voltage Vpgm is applied to the word line. This is because the lower the threshold voltage of a cell, the larger is the coupling applied due to the potential of an unselected word line acting on the channel potential from a low state when the unselected word line is raised to the program pass voltage VPASS. Therefore, it is not desirable from the viewpoint of program disturb that, after data has been programmed in the NAND string, program stress continues to be applied repeatedly.

In the present embodiment, it is assumed to be the case that one word line WL is shared between a plurality of sub-blocks SB, or that word lines WL are not shared between a plurality of sub-blocks SB but that each of the word lines undergoes control to attain the same potential electrically. In this case, a third program disturb which is similar to the second program disturb might occur in unselected sub-blocks during program pulse application to the selected WL belong to a memory block MB. In the situation, the channel potential is coupled up by the shared word lines in order to weaken the voltage difference between the selected word line and the channel of the unselected memory string. If the channel potential is not boosted enough for some reason, the third disturb occurs.

In consideration of desirable page allocation from the above-described viewpoint of program disturb, it is preferable for program of a plurality of sub-blocks (NAND strings) to progress to the same degree.

That is, as shown in FIG. 31, in the program operation in the present embodiment, the memory cells MC0 along each of the word lines WL0 in the plurality of sub-blocks SB0-SB3 in the memory block MB are programmed in order of lowest sub-block number (SB0→SB1→SB2→SB3). When program to the word line WL0 in all the sub-blocks SB is completed, next, the memory cells MC1 along the word lines WL1 in each of the sub-blocks SB0-SB3 are programmed to in order of lowest sub-block number. Thereafter, program is progressed in a similar manner. So, this means that an address bit to select sub-block SB is assigned lower than an address bit to select a word line in the page address allocation map. In other words, the sub-block address bit comes before the word line address bit while other embodiment shown in FIG. 29 indicates that word line address bit comes before sub-block address bit.

The above describes a basic way of thinking with regard to allocation of page addresses and program order in the case where the minimum erase unit is configured by the sub-block SB and a word line WL is shared among a plurality of sub-blocks SB or where word lines WL are not shared but are simultaneously driven. Therefore, the allocation of page addresses according to the embodiments may suppress the program disturb without relation to an existence of the high-speed program region, and the erase operation performing to each of sub-blocks. The high-speed program region may be set to provide the greatest improvement in performance of the memory system in view of the allocated page addresses. When certain successive pages from the leading page of the erase block are set in the high-speed program region, then, for example, as shown in FIG. 31, from WL0 in sub-block SB0 to WL1 in sub-block SB3 can be defined as the high-speed program region.

Page addresses can be allocated in a similar manner also in the case where multiple bits of data are stored in one memory cell, consideration being given to an increased portion of logical pages due to multilevel storage.

For example, in the case where two bits are stored in one memory cell, an address bit to select either of the lower page or upper page is allocated lower than the sub-block address bit. In that case, 'Full sequence program' can be executed during the successive programming as shown in FIG. 31.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

For example, the aforementioned embodiments described operation examples where a two bits per cell program system is executed. However, similar operation examples are clearly applicable also in the case where multiple bits of three bits or more are retained in one memory cell.

For example, in the aforementioned embodiments, a stacked type memory cell array having a U-shaped type semiconductor layer was described as an example of how, in one memory string, a charge storage film is formed continuously without being divided between memory cells. However, the present invention is not limited to this. For example, an I-shaped type stacked type memory cell in which a plurality of memory cells are arranged in a straight line in a stacking direction perpendicular to a semiconductor substrate may also be included within the scope of the present invention and its equivalents. Moreover, the present invention may be applied even to a planar type memory cell array in which all the memory cells are formed on a semiconductor substrate, provided that, similarly, the charge storage film is formed continuously without being divided between memory cells.

The allocation of page addresses according to the embodiments may suppress the program disturb in the nonvolatile semiconductor memory device including the sub-blocks sharing word lines, without relation to an existence of the high-speed program region, and the erase operation performing to each of sub-blocks.

In addition, the nonvolatile semiconductor memory device described above comprises:
a semiconductor substrate;
a memory cell array including a plurality of memory blocks;
a plurality of sub-blocks provided in the memory block, and arranged along a first direction parallel to the substrate; and
a control circuit configured to control a voltage supplied to the sub-blocks,
each of the sub-blocks comprising:
a plurality of memory strings arranged in a row along a second direction parallel to the substrate, and each including a plurality of memory cells connected in series along a perpendicular direction with respect to the substrate;
a plurality of drain side select transistors each connected to each of first ends of the memory strings; and
a plurality of source side select transistors each connected to each of second ends of the memory strings,
the memory cells arranged in the first direction and the second direction having gates commonly connected to each other,
the drain side select transistors arranged in the second direction having gates commonly connected to each other,
the source side select transistors arranged in the second direction having gates commonly connected to each other,
each of the memory cells comprising a charge storage film for storing a charge, and being configured capable of retaining multiple levels of threshold voltage distributions according to an amount of charge stored,
wherein, an address bit related to storing multi bit information on a memory cell is allocated lower than either of an address bit to select a sub-block or an address bit to select a word line connecting to the gates commonly connected among the memory cells.

The invention claimed is:

1. A nonvolatile semiconductor memory device, comprising:
a memory cell array including a first memory cell and a second memory cell; and
a control circuit configured to execute a write operation for the first memory cell when receiving a write command and an address corresponding to the first memory cell, the write operation including a first operation and a second operation, the control circuit being configured to execute the first operation in the condition that a program voltage is applied to a gate of the first memory cell and execute the second operation so that a threshold voltage of the second memory cell is changed from a negative value to a positive value without receiving data from outside of the nonvolatile semiconductor memory, wherein
the control circuit is configured to execute the second operation after the first operation,
one of the memory cells is capable of retaining 2-or-more-bits data, and
the control circuit is configured to, when the control circuit receives a certain part of the 2-or-more-bits data as first data, start the first operation for programming part of the first data and then start the second operation, and
when the control circuit receives complete 2-or-more-bits data after the first operation for programming the part of the first data and before the second operation, execute the first operation for programming complete 2-or-more-bits data as the first data prior to the second operation.

2. The nonvolatile semiconductor memory device according to claim 1, wherein
the memory cell array includes a plurality of memory strings, one of the memory strings further including a plurality of the memory cells connected in series,
one of the memory strings comprising:
a semiconductor layer;
a memory gate insulating film including a charge storage layer, the memory gate insulating film surrounding the semiconductor layer; and
a conductive layer surrounding the memory gate insulating film.

3. The nonvolatile semiconductor memory device according to claim 1, wherein
the control circuit is configured to execute the second operation before the first operation.

4. The nonvolatile semiconductor memory device according to claim 2, wherein
the control circuit is configured to execute the second operation before the first operation.

5. The nonvolatile semiconductor memory device according to claim 1, further comprising a data retaining circuit configured to retain page data to be programmed to the memory cells,
wherein the control circuit is configured to abandon the page data retained in the data retaining circuit every time programming a certain amount of data is finished, and retain page data to be programmed next.

6. The nonvolatile semiconductor memory device according to claim 2, further comprising a data retaining circuit configured to retain page data to be programmed to the memory cells,
wherein the control circuit is configured to abandon the page data retained in the data retaining circuit every time programming a certain amount of data is finished, and retain page data to be programmed next.

7. The nonvolatile semiconductor memory device according to claim 3, wherein
one of the memory cells is capable of retaining 2-or-more-bits data, and
the control circuit is configured capable of executing first operations, when the control circuit receives the 2-or-more-bits data to be programmed to the first memory cell before the first operations are executed to the first memory cell.

8. The nonvolatile semiconductor memory device according to claim 4, wherein
one of the memory cells is capable of retaining 2-or-more-bits data, and
the control circuit is configured capable of executing first operations sequentially, when the control circuit receives the 2-or-more-bits data to be programmed to the first memory cell before the first operations are executed to the first memory cell.

9. The nonvolatile semiconductor memory device according to claim 1, wherein
the memory cell array includes a first region and a second region, and
when the control circuit executes an erase operation to the memory cells,
the control circuit controls so as to set memory cells in the second region and the memory cells in the first region that are adjacent to the memory cells in the second region, to the positive threshold voltage, and to set memory cells in the first region excluding the memory cells in the first region that are adjacent to the memory cells in the second region, to a threshold voltage lower than the positive threshold voltage.

10. The nonvolatile semiconductor memory device according to claim 9, wherein
when the control circuit executes an erase operation on the memory cells,
the control circuit, performs the erase operation for providing a first threshold voltage distribution to the memory cells in the second region, and then executes the second operation, and
the control circuit performs the erase operation for providing the first threshold voltage distribution to the memory cells in the first region, and then maintains the memory cells in a state of having been applied with the first threshold voltage distribution.

11. A nonvolatile semiconductor memory device, comprising:
a memory cell array including a first memory cell and a second memory cell; and
a control circuit configured to execute a write operation for the first memory cell when receiving a write command and an address corresponding to the first memory cell, the write operation including a first operation and a second operation, the control circuit being configured to execute the first operation in the condition that a program voltage is applied to a gate of the first memory cell and execute the second operation so that a threshold voltage of the second memory cell is changed from a negative value to a positive value without receiving data from outside of the nonvolatile semiconductor memory, wherein
the memory cell array includes a plurality of memory strings, one of the memory strings further including a plurality of the memory cells connected in series,
one of the memory strings comprising:
a semiconductor layer;
a memory gate insulating film including a charge storage layer, the memory gate insulating film surrounding the semiconductor layer; and
a conductive layer surrounding the memory gate insulating film,
the control circuit is configured to execute the second operation after the first operation,
one of the memory cells is capable of retaining 2-or-more-bits data, and
the control circuit is configured to, when the control circuit receives a certain part of the 2-or-more-bits data as first data, start the first operation for programming part of the first data and then start the second operation, and,
when the control circuit receives complete 2-or-more-bits data after the first operation for programming the part of the first data and before the second operation, execute the first operation for programming complete 2-or-more-bits data as the first data prior to the second operation.

12. A nonvolatile semiconductor memory device, comprising:
a semiconductor substrate;
a memory cell array including a plurality of memory blocks, one of the memory Meek blocks including groups; and
a control circuit configured to execute a write operation for a first memory cell when receiving a write command and an address corresponding to the first memory cell, the write operation including a first operation and a second operation, the control circuit being configured to execute the first operation in the condition that a program voltage is applied to a gate of the first memory cell and execute the second operation so that a threshold voltage of the second memory cell is changed from a negative value to a positive value without receiving data from outside of the nonvolatile semiconductor memory, one of the groups comprising:

memory strings including a plurality of memory cells connected in series;

first select transistors connected to a first terminal of the memory strings; and a second select transistor connected to a second terminal of the memory strings, one of the memory cells comprising a charge storage film for storing a charge, and being configured capable of retaining multiple levels, wherein the control circuit is configured to execute the second operation after the first operation, one of the memory cells is capable of retaining 2-or-more-bits data, and the control circuit is configured to, when the control circuit receives a certain part of the 2-or-more-bits data as first data, start the first operation for programming part of the first data and then start the second operation, and when the control circuit receives complete 2-or-more-bits data after the first operation for programming the part of the first data and before the second operation, execute the first operation for programming complete 2-or-more-bits data as the first data prior to the second operation.

13. A nonvolatile semiconductor memory device, comprising:

a semiconductor substrate;

a memory cell array including a plurality of memory blocks;

a plurality of groups provided in a memory block, and arranged along a first direction parallel to the substrate; and a control circuit configured to execute a write operation for a first memory cell when receiving a write command and an address corresponding to the first memory cell, the write operation including a first operation and a second operation, the control circuit being configured to execute the first operation in the condition that a program voltage is applied to a gate of the first memory cell and execute the second operation so that a threshold voltage of a second memory cell is changed from a negative value to a positive value without receiving data from outside of the nonvolatile semiconductor memory, one of the groups comprising:

a plurality of memory strings arranged in a row along a second direction parallel to the substrate, and each including a plurality of memory cells connected in series along a perpendicular direction with respect to the substrate;

a plurality of first select transistors each connected to each of first terminals of the memory strings; and a plurality of second select transistors each connected to each of second terminals of the memory strings, the memory cells arranged in the first direction and the second direction having gates commonly connected to each other, the first select transistors arranged in the second direction having gates commonly connected to each other, the second select transistors arranged in the second direction having gates commonly connected to each other, and one of the memory cells comprising a charge storage film for storing a charge, and being configured capable of retaining multiple levels, wherein the control circuit is configured to execute the second operation after the first operation, one of the memory cells is capable of retaining 2-or-more-bits data, and the control circuit is configured to, when the control circuit receives a certain part of the 2-or-more-bits data as first data, start the first operation for programming part of the first data and then start the second operation, and when the control circuit receives complete 2-or-more-bits data after the first operation for programming the part of the first data and before the second operation, execute the first operation for programming complete 2-or-more-bits data as the first data prior to the second operation.

* * * * *